(12) United States Patent
Fujita et al.

(10) Patent No.: US 7,863,347 B2
(45) Date of Patent: Jan. 4, 2011

(54) RESIN COMPOSITION, VARNISH, RESIN FILM AND SEMICONDUCTOR DEVICE USING THE SAME

(75) Inventors: Kazuyoshi Fujita, Tokyo (JP); Atsushi Izumi, Tokyo (JP); Yumiko Yamanoi, Tokyo (JP); Takahiro Harada, Tokyo (JP); Hiromi Oki, Tokyo (JP); Yukiharu Ono, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 131 days.

(21) Appl. No.: 12/294,592

(22) PCT Filed: Mar. 16, 2007

(86) PCT No.: PCT/JP2007/055431
§ 371 (c)(1),
(2), (4) Date: Sep. 25, 2008

(87) PCT Pub. No.: WO2007/111168
PCT Pub. Date: Oct. 4, 2007

(65) Prior Publication Data
US 2009/0118431 A1    May 7, 2009

(30) Foreign Application Priority Data
Mar. 29, 2006  (JP) ................ 2006-091336

(51) Int. Cl.
| | |
|---|---|
| *C08G 63/44* | (2006.01) |
| *C08G 63/52* | (2006.01) |
| *C08G 65/50* | (2006.01) |
| *C08G 69/26* | (2006.01) |
| *C08G 73/10* | (2006.01) |
| *C08G 73/22* | (2006.01) |
| *C08L 101/02* | (2006.01) |

(52) U.S. Cl. .............. 522/137; 522/142; 528/176; 528/205; 528/307; 528/289; 528/291
(58) Field of Classification Search .......... 522/137, 522/142; 528/176, 205, 289, 288, 291, 307
See application file for complete search history.

(56) References Cited

U.S. PATENT DOCUMENTS

| | | | | |
|---|---|---|---|---|
| 6,342,333 | B1* | 1/2002 | Sasaki et al. | 430/270.1 |
| 6,509,415 | B1* | 1/2003 | Liu et al. | 525/132 |
| 7,291,919 | B2* | 11/2007 | Aoi | 257/760 |
| 7,652,125 | B2* | 1/2010 | Enoki et al. | 528/211 |
| 2002/0103270 | A1* | 8/2002 | Takeuchi et al. | 522/142 |

FOREIGN PATENT DOCUMENTS

| | | |
|---|---|---|
| EP | 1462470 | 9/2004 |
| EP | 1593704 | 11/2005 |
| EP | 1953181 | 8/2008 |
| JP | 2000-195853 | 7/2000 |
| JP | 2005-139271 | 6/2005 |
| JP | 2005-139424 | 6/2005 |
| JP | 2006-008642 | 1/2006 |

* cited by examiner

*Primary Examiner*—Susan W Berman
(74) *Attorney, Agent, or Firm*—Ditthavong Mori & Steiner, P.C.

(57) ABSTRACT

A resin composition is provided comprising a compound having a structure represented by formula (1) and a crosslinking agent:

(1)

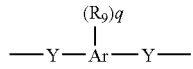

$$-Y-Ar-Y- \quad (2)$$

with $(R_9)_q$ on Ar wherein in formula (1), $R_0$ is a single bond or has a structure represented by formula (2); $R_1$ to $R_8$ are respectively any of hydrogen, a group having an alicyclic structure, an organic group having 1 to 10 carbon atoms other than the group having an alicyclic structure, a hydroxyl group and a carboxyl group; and "X" is any of —O—, —NHCO—, —CONH—, —COO— and —OCO—; further, wherein in formula (2), "Ar" is an aromatic group; "Y" is any of a single bond, —O—, —S—, —OCO— and —COO—; "q" is an integer of 1 or more; $R_9$ is hydrogen or an organic group having 1 or more carbon atoms and may be identical with or different from each other when "q" is an integer of 2 or more; at least one of $R_1$ to $R_8$ is the group having an alicyclic structure when $R_0$ is a single bond; at least one of $R_1$ to $R_9$ is the group having an alicyclic structure when $R_0$ has the structure represented by formula (2); and "*" and "**" represent a position to be bonded to a different chemical structure.

23 Claims, 1 Drawing Sheet

RESIN COMPOSITION, VARNISH, RESIN FILM AND SEMICONDUCTOR DEVICE USING THE SAME

TECHNICAL FIELD

The present invention relates to a resin composition, a varnish, a resin film and a semiconductor device using the same.

BACKGROUND ART

Oxide films (SiOx films) prepared by the chemical vapor deposition method (CVD method) and so on are currently used as interlayer insulation films for semiconductor devices. Due to a high dielectric constant thereof, however, inorganic insulation films such as oxide films can hardly achieve speeding up and upgrading of semiconductor devices. Accordingly, organic materials are being studied for use as interlayer insulation films having a low dielectric constant. Such organic materials are required to have excellent heat resistance, excellent electrical properties and also a low dielectric constant.

As such organic materials, polyimide resins, polyquinoline resins, polyquinoxaline resins and so on have been studied. (For example, see Patent Document 1).

In general, however, resin films composed of polyimide resins have problems such as low heat resistance, high dielectric constant and high moisture absorptivity. Consequently, due to reliability thereof, use of polyimide resins is limited to some semiconductor elements such as a bipolar semiconductor element.

On the other hand, polyquinoline resins and polyquinoxaline resins have higher heat resistance, a lower dielectric constant and a lower moisture absorptivity than those of polyimide resins. However, since polyquinoline resins and polyquinoxaline resins are thermoplastic resins, they have a problem that they may change shapes thereof by exposure to temperatures higher than glass-transition points thereof, and thus circuit patterns of semiconductor elements cannot be retained during semiconductor production.

[Patent Document 1] Japanese Patent Application Laid-Open No. 2000-195853

DISCLOSURE OF THE INVENTION

Problems to be Solved by the Invention

An object of the present invention is to provide a resin composition having high heat resistance and a low dielectric constant, and a varnish thereof. Another object of the present invention is to provide a resin film having a low dielectric constant and excellent heat resistance, and a semiconductor device using the same.

Means for Solving the Problems

These objects are achieved by the present invention described in the following items [1] to [22].

[1] A resin composition comprising a compound having a structure represented by formula (1) and a crosslinking agent having in a molecule two or more groups capable of causing a crosslinking reaction with the crosslinking agent and/or the compound:

[Chemical Formula 1]

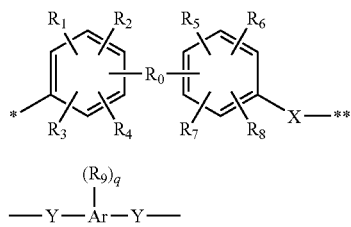

wherein in formula (1), $R_0$ is a single bond or has a structure represented by formula (2); $R_1$ to $R_8$ are respectively any of hydrogen, a group having an alicyclic structure, an organic group having 1 to 10 carbon atoms other than the group having an alicyclic structure, a hydroxyl group and a carboxyl group; and "X" is any of —O—, —NHCO—, —CONH—, —COO— and —OCO—; further, wherein in formula (2), "Ar" is an aromatic group; "Y" is any of a single bond, —O—, —S—, —OCO— and —COO—; "q" is an integer of 1 or more; $R_9$ is hydrogen or an organic group having 1 or more carbon atoms and may be identical with or different from each other when "q" is an integer of 2 or more; at least one of $R_1$ to $R_8$ is the group having an alicyclic structure when $R_0$ is a single bond; at least one of $R_1$ to $R_9$ is the group having an alicyclic structure when $R_0$ has the structure represented by formula (2); and "*" and "**" represent a position to be bonded to a different chemical structure.

[2] The resin composition according to item [1], wherein $R_0$ has the structure represented by formula (2) in the compound having the structure represented by formula (1).

[3] The resin composition according to item [2], wherein at least one $R_9$ is the group having an alicyclic structure in the compound having the structure represented by formula (1).

[4] The resin composition according to item [2] or [3], wherein the compound having the structure represented by formula (1) comprises, as "Ar" in formula (2), a group selected from structures represented by formula (3):

[Chemical Formula 2]

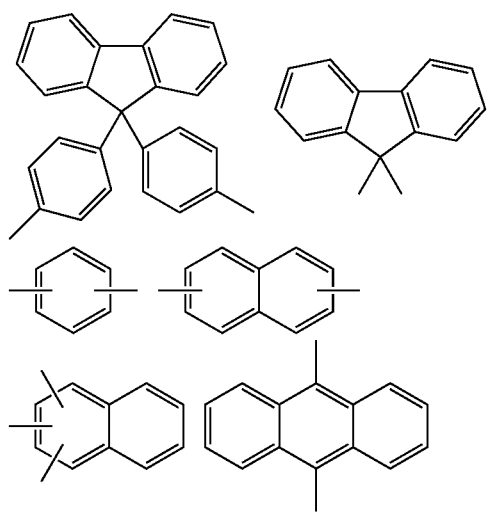

-continued

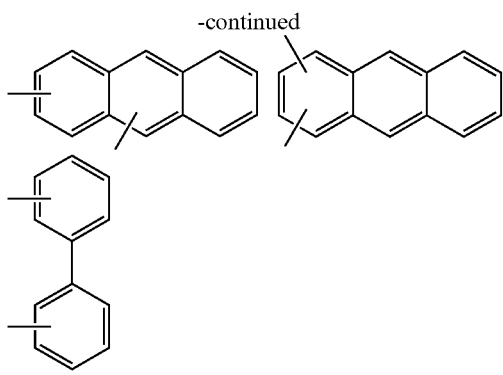

[5] The resin composition according to item [1], wherein $R_0$ is a single bond in the compound having the structure represented by formula (1).

[6] The resin composition according to any of items [1] to [5], wherein the group having an alicyclic structure is a group having an adamantane structure.

[7] The resin composition according to item [6], wherein the group having an adamantane structure has an alkyl group having 1 to 20 carbon atoms.

[8] The resin composition according to any of items [1] to [7], wherein the compound having the structure represented by formula (1) has in a molecule two or more groups capable of causing a crosslinking reaction with at least the compound.

[9] The resin composition according to item [8], wherein the group capable of causing a crosslinking reaction of the compound having the structure represented by formula (1) is capable of causing a crosslinking reaction with the crosslinking agent.

[10] The resin composition according to any of items [1] to [9], wherein the crosslinking agent and/or the compound having the structure represented by formula (1) comprises a functional group having a polymerizable unsaturated bond as the group capable of causing a crosslinking reaction.

[11] The resin composition according to any of items [1] to [10], wherein the crosslinking agent and/or the compound having the structure represented by formula (1) comprises a functional group having an acetylene bond as the group capable of causing a crosslinking reaction.

[12] The resin composition according to any of items [1] to [11], wherein the crosslinking agent has an alicyclic structure.

[13] The resin composition according to any of items [1] to [12], wherein the crosslinking agent is capable of forming a benzoxazole ring by dehydration and ring closure reaction.

[14] The resin composition according to any of items [1] to [13], comprising a polymer of the crosslinking agent as the crosslinking agent.

[15] The resin composition according to any of items [1] to [14], wherein the compound having the structure represented by formula (1) has —CONH— as "X" of formula (1) and a carboxyl group as any of $R_1$ to $R_4$ that is in the ortho-position to a bond represented by "*" and a carboxyl group as any of $R_5$ to $R_8$ that is in the ortho-position of "X".

[16] The resin composition according to any of items [1] to [14], wherein the compound having the structure represented by formula (1) has —NHCO— as "X" of formula (1) and a hydroxyl group as any of $R_1$ to $R_4$ that is in the ortho-position to the bond represented by "*" and a hydroxyl group as any of $R_5$ to $R_8$ that is in the ortho-position of "X".

[17] The resin composition according to any of items [1] to [16], which is obtained by dehydration and ring closure reaction of the compound having the structure represented by formula (1) of the resin composition.

[18] A resin composition comprising a polyimide resin obtained by dehydration and ring closure reaction of the compound having the structure represented by formula (1) of the resin composition defined by item [15].

[19] A resin composition comprising a polybenzoxazole resin obtained by dehydration and ring closure reaction of the compound having the structure represented by formula (1) of the resin composition defined by item [16].

[20] A varnish comprising the resin composition defined by any of items [1] to [19] and an organic solvent.

[21] A resin film obtained by heating and/or irradiating with active radiation the resin composition defined by any of items [1] to [19] or the varnish defined by item [20].

[22] A semiconductor device comprising the resin film defined by item [21].

EFFECTS OF THE INVENTION

The present invention provides a resin composition capable of forming a resin film having high heat resistance and a low dielectric constant and further having a high elastic modulus and a low linear expansion coefficient, and a varnish thereof; a resin film formed from the resin composition or the varnish thereof; and a semiconductor device comprising the resin film.

The present invention provides a resin composition comprising a polyimide resin precursor with excellent heat resistance, and also it provides a resin composition comprising a benzoxazole resin precursor with excellent heat resistance.

The present invention further provides a composition comprising a polyimide resin and a composition comprising a polybenzoxazole resin, each resin having high heat resistance and a low dielectric constant and further having a high elastic modulus and a low linear expansion coefficient; varnishes thereof; resin films formed from the resin compositions or the varnishes thereof; and semiconductor devices comprising the resin films.

DESCRIPTION OF SYMBOLS

Figure 1:
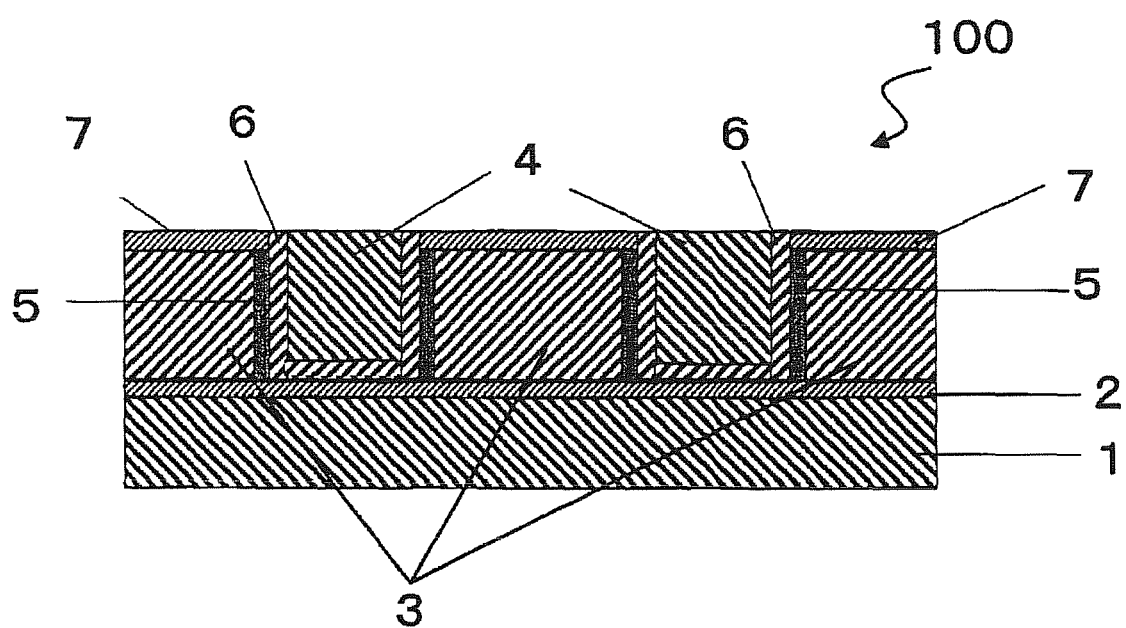
FIG. 1 is a sectional view showing an example of a semiconductor device of the present invention.

1: a semiconductor substrate
2: a silicon nitride layer
3: an interlayer insulation film
4: a copper wiring layer
5: a treated and modified layer
6: a barrier layer
7: a hard mask layer
100: a semiconductor device

BEST MODE FOR CARRYING OUT THE INVENTION

Hereinafter, best modes for carrying out a resin composition, a varnish, a resin film and a semiconductor device of the present invention will be described.

A resin composition of the present invention comprises a compound having a structure represented by formula (1) and a crosslinking agent having in a molecule at least two or more groups capable of causing a crosslinking reaction with the crosslinking agent.

[Chemical Formulae 3]

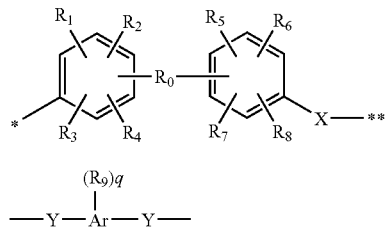

(1)

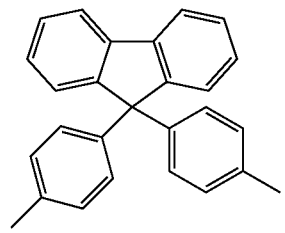

(2)

In formula (1), $R_0$ is a single bond or has a structure represented by formula (2); $R_1$ to $R_8$ are respectively any of hydrogen, a group having an alicyclic structure, an organic group having 1 to 10 carbon atoms other than the group having an alicyclic structure, a hydroxyl group and a carboxyl group; and "X" is any of —O—, —NHCO—, —CONH—, —COO— and —OCO—. In formula (2), "Ar" is an aromatic group; "Y" is any of a single bond, —O—, —S—, —OCO— and —COO—; "q" is an integer of 1 or more; $R_9$ is hydrogen or an organic group having 1 or more carbon atoms and may be identical with or different from each other when "q" is an integer of 2 or more; at least one of $R_1$ to $R_8$ is the group having an alicyclic structure when $R_0$ is a single bond; at least one of $R_1$ to $R_9$ is the group having an alicyclic structure when $R_0$ has the structure represented by formula (2); and "*" and "**" represent a position to be bonded to a different chemical structure.

By comprising the compound having the structure represented by formula (1) and the crosslinking agent, the resin composition of the present invention can have high heat resistance and a low dielectric constant; moreover, it can provide a resin film having a high elastic modulus and a low linear expansion coefficient. The compound having the structure represented by formula (1) includes a polyimide resin precursor, a polybenzoxazole resin precursor or the like.

Since the resin composition of the present invention comprises the crosslinking agent as an essential component in addition to the compound having the structure represented by formula (1), it can achieve higher heat resistance as well as a low dielectric constant. Furthermore, the resin composition of the present invention can achieve enhanced properties of high elastic modulus and low linear expansion coefficient.

The compound having the structure represented by formula (1) of the present invention comprises an aromatic group as "Ar" of formula (2) when $R_0$ has the structure represented by formula (2). As an aromatic ring composing the aromatic group, for example, there may be listed benzene, naphthalene, anthracene, phenanthrene, a polycyclic aromatic ring having 4 or more aromatic rings, fluorene, pyridine, a nitrogen-containing polycyclic aromatic ring, an aromatic ring comprising these aromatic rings bonded to each other, and the like. Particularly, an aromatic group having any of structures represented by formula (3) is preferable. Excellent solubility can be thus provided to a solvent used for producing a resin film or a semiconductor device comprising the resin film.

As "Y" of formula (2), there may be listed a single bond, —O—, —S—, —OCO— and —COO—. Among them, —O— is particularly preferable in terms of solubility in a solvent and heat resistance.

[Chemical Formula 4]

(3)

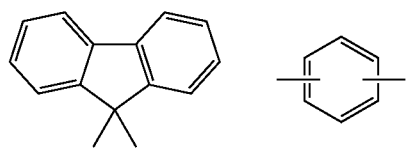

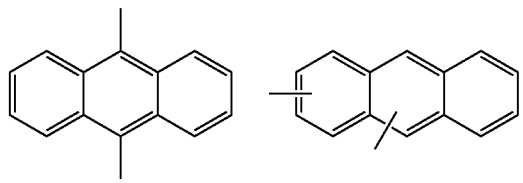

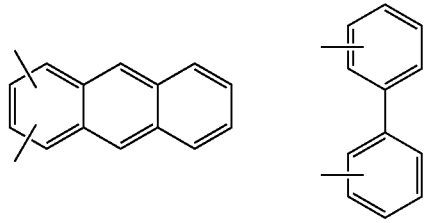

The compound having the structure represented by formula (1) also comprises, as $R_1$ to $R_8$, any of hydrogen, a group having an alicyclic structure, an organic group having 1 to 10 carbon atoms other than the group having an alicyclic structure, a hydroxyl group and a carboxyl group. As the group having an alicyclic structure, there may be listed the same as the group as $R_9$, which will be hereinafter described. As the organic group having 1 to 10 carbon atoms other than the group having an alicyclic structure, there may be listed a methyl group, an ethyl group, a n-propyl group, an isopropyl group, a butyl group, an isobutyl group, a tert-butyl group, a heptyl group, a hexyl group, a pentyl group, an octyl group, a nonyl group, a decyl group and the like, and these organic groups substituted with fluorine such as a fluoromethyl group.

The compound having the structure represented by formula (1) may comprise hydrogen or an organic group having 1 or more carbon atoms as $R_9$. As the organic group having 1 or more carbon atoms, there may be listed the group having an alicyclic structure, an organic group having 1 to 10 carbon atoms other than the group having an alicyclic structure, and the like. When comprising such organic groups as $R_9$, it is preferable that at least one $R_9$ comprises a group having an alicyclic structure. As the group having an alicyclic structure, for example, there may be listed a group having a cyclopropane structure, a cyclobutane structure, a cyclopentane structure, a cyclohexane structure, a cycloheptane structure, a norbornene structure, an adamantane structure or the like. Among them, a group having an adamantane structure is particularly preferable. The group having an adamantane structure is a group having an adamantane structure as a minimum unit, and there may be listed for example a group having an (aliphatic) polycyclic framework structure such as an adamantyl group, a diamantyl group, a triamantyl group, a tetramantyl group, a pentamantyl group, a hexamantyl group, a heptamantyl group, an octamantyl group, a nonamantyl group, a decamantyl group and an undecamantyl group. Further, there may be listed a group comprising a plurality of the groups having a polycyclic framework structure and the like. As the group comprising a plurality of the groups having a polycyclic framework structure, there may be listed a group having an oligo structure, a group having a poly structure and the like. When the group having a polycyclic framework structure is an adamantyl group, for example, there may be listed a group having an oligoadamantane structure including a biadamantyl group such as a di(1,3-adamantane) group and di(2,2-adamantane) group; a triadamantyl group such as a tri(1,3-adamantane) group and tri(2,2-adamantane) group; a tetraadamantyl group such as a tetra(1,3-adamantane) group and a tetra(2,2-adamantane) group; a pentaadamantyl group such as a penta(1,3-adamantane) group and penta(2,2-adamantane) group; a heptaadamantyl group such as a hepta(1,3-adamantane) group and hepta(2,2-adamantane) group; a hexaadamantyl group; an octaadamantyl group; a nonaadamantyl group; a decaadamantyl group; and an undecaadamantyl group. Further, there may be listed a group having a polyadamantane structure comprising many adamantyl groups, and the like. When the group having a polycyclic framework structure is a group other than an adamantyl group, there may be listed the group having an oligoadamantane structure and the group having a polyadamantane structure, of which adamantyl group is substituted each. For example, there may be listed a group having a plurality of diamantane groups such as a di-(diamantane) group, a tri-(diamantane) group, a tetra-(diamantane) group, a penta-(diamantane) group, a hexa-(diamantane) group, a hepta-(diamantane) group, an octa-(diamantane) group, a nona-(diamantane) group, a deca-(diamantane) group and an undeca-(diamantane) group; a group having a plurality of triamantane groups such as a di-(triamantane) group, a tri-(triamantane) group, a tetra-(triamantane) group, a penta-(triamantane) group, a hexa-(triamantane) group, a hepta-(triamantane) group, an octa-(triamantane) group, a nona-(triamantane) group, a deca-(triamantane) group and an undeca-(triamantane) group; a group having a plurality of tetraamantane groups such as a di-(tetraamantane) group, a tri-(tetraamantane) group, a tetra-(tetraamantane) group, a penta-(tetraamantane) group, a hexa-(tetraamantane) group, a hepta-(tetraamantane) group, an octa-(tetraamantane) group, a nona-(tetraamantane) group, a deca-(tetraamantane) group and an undeca-(tetraamantane) group; and the like. Among them, preferred groups are an adamantyl group, a diamantyl group, a triamantyl group, a tetramantyl group, a pentamantyl group, a hexamantyl group, a heptamantyl group, an octamantyl group, a nonamantyl group, a decamantyl group, an undecamantyl group, a biadamantyl group, a triadamantyl group, a tetraadamantyl group, a pentaadamantyl group, a hexaadamantyl group, a heptaadamantyl group, an octaadamantyl group, a nonaadamantyl group, a decaadamantyl group and an undecaadamantyl group. More preferred groups are an adamantyl group, a diamantyl group, a triamantyl group, a tetramantyl group, a pentamantyl group, a di(1,3-adamantane) group, a tri(1,3-adamantane) group, a tetra(1,3-adamantane) group, a penta(1,3-adamantane) group, a di(2,2-adamantane) group, a tri(2,2-adamantane) group, a tetra(2,2-adamantane) group and a penta(2,2-adamantane) group. By introducing an adamantane structure as $R_9$, a low dielectric constant can be provided and moisture resistance can be improved without reducing heat resistance and solubility in a solvent. An alkyl group such as a methyl group, an ethyl group, a propyl group and a butyl group, a fluoroalkyl group such as a fluoromethyl group, a fluoroethyl group, a fluoropropyl group and a fluorobutyl group, and the like may be bonded to the group having an adamantane structure. Solubility in a solvent and heat resistance can be improved by introducing an alkyl group to an adamantane structure. Further, substitution with fluorine contributes to reduction in dielectric constant.

When $R_9$ is an organic group having one or more carbon atoms other than a group having an alicyclic structure, $R_9$ is preferably the same as an organic group having 1 to 10 carbon atoms as $R_1$ to $R_8$.

When $R_0$ is a single bond and there is no "Ar" and no $R_9$ in the compound having the structure represented by formula (1), at least one of $R_1$ to $R_8$ is the group having an alicyclic structure. In this case, a ratio of the alicyclic structure in the compound can be readily increased, so that a dielectric constant of the compound can be reduced more easily.

Also, when $R_0$ has the structure represented by formula (2) in the compound having the structure represented by formula (1), at least one of $R_1$ to $R_8$ is the group having an alicyclic structure. One or more groups having an alicyclic structure may be present only as $R_9$. One or more groups having an alicyclic structure may be present only as $R_1$ to $R_8$. Or, two or more groups having an alicyclic structure may be present as both of $R_9$ and $R_1$ to $R_8$.

From the viewpoint of reducing the dielectric constant further, the compound having the structure represented by formula (1) preferably has a high alicyclic structure-containing ratio.

A total amount of the alicyclic structure contained in the compound having the structure represented by formula (1) is preferably from 20 to 85 wt %, more preferably 40 wt % or more, and still more preferably 60 wt % or more.

In the calculation of a content ratio of the alicyclic structure, even if the alicyclic structure has a substituent in formula (1), hydrogen is used for the substituent. For example, in the case of containing an adamantane structure, a molecular weight of adamantane of 136, diadamantane of 188, triadamantane of 240 or so on and a number thereof are used for calculation. In the case of containing a group having a plurality of the polycyclic framework structures, such as the case of containing a biadamantane, two adamantanes are used for calculation (136×2). Similarly, three adamantanes are used for calculation in the case of containing a triadamantane (136×3).

In the case that the compound having the structure represented by formula (1) is a polymer having a repeating unit, a content ratio of the alicyclic structure is obtained from a content ratio of the alicyclic structure contained in a structure of the repeating unit. For example, when the compound having the structure represented by formula (1) is a polymer and a repeating unit of the polymer is represented by the following formula, the content ratio is obtained as follows, based on a total molecular weight of the repeating unit of 1,027, a molecular weight of an adamantane with alicyclic structure of 136 and a number of adamantanes of 4:

136×4/1,027×100=53(wt %).

When the compound having the structure represented by formula (1) has a polyimide resin precursor structure, it can become a polyimide resin by dehydrating and closing rings thereof.

When the compound having the structure represented by formula (1) has a polybenzoxazole resin precursor structure, it can become a polybenzoxazole resin by dehydrating and closing rings thereof.

In a method for preparing the polyimide resin precursor, for example, the polyimide resin precursor can be obtained by the reaction of tetracarboxylic acid dianhydride with a diamine compound. As a method for causing the reaction, acid dian-

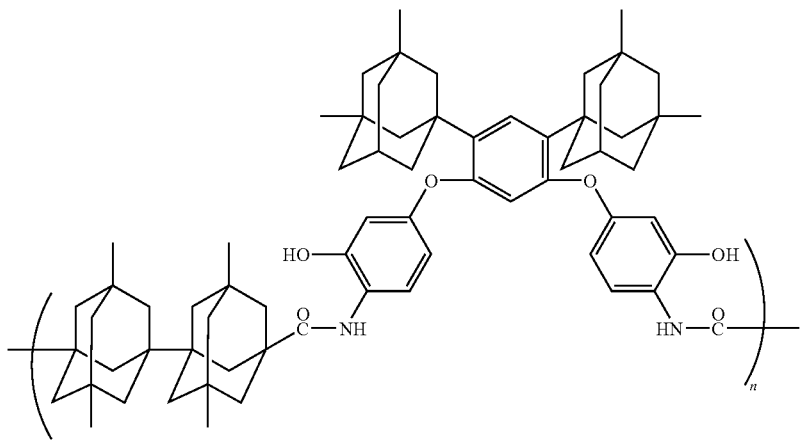

Also, the compound having the structure represented by formula (1) has any of —O—, —NHCO—, —CONH—, —COO— and —OCO— as "X".

The compound having the structure represented by formula (1) of the present invention can be used as polyphenylene ether when "X" is —O— in the formula. It can be used as polyamide when "X" is —NHCO— or —CONH— and as polyester when "X" is —COO— or —OCO—.

In the case that, especially in the case of polyamide, in the above-mentioned structure any of $R_1$ to $R_4$ that is in the ortho-position to a bond represented by "*" and any of $R_5$ to $R_8$ that is in the ortho-position of "X" are each a carboxyl group, the compound having the structure represented by formula (1) has a polyimide resin precursor structure. In the case that any of $R_1$ to $R_4$ that is in the ortho-position to the bond represented by "*" and any of $R_5$ to $R_8$ that is in the ortho-position of "X" are each a hydroxyl group, the compound having the structure represented by formula (1) has a polybenzoxazole resin precursor structure. Heat resistance can be further improved by selecting such structures. There may be mentioned the following structure for example: when in the formula "X" is —NHCO—, any of $R_5$ to $R_8$ that is in the ortho-position of "X" is a hydroxyl group; any of $R_1$ to $R_4$ that is in the ortho-position to the bond represented by "*" is a hydroxyl group; any of $R_5$ to $R_8$ that is in the meta-position of "X" and any of $R_1$ to $R_4$ that is in the para-position to the bond represented by "*" have an alicyclic structure respectively; and $R_0$ bonds to any of $R_1$ to $R_4$ that is in the meta-position to the bond represented by "*" and to any of $R_5$ to $R_8$ that is in the para-position of "X".

hydride may be half-esterified with alcohols and then be reacted with a diamine compound.

As the tetracarboxylic acid dianhydride having an alicyclic structure, there may be mentioned a compound having a structure represented by the following formula (4):

[Chemical Formulae 6]

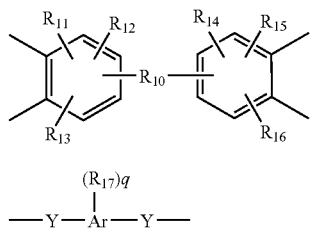

(4)

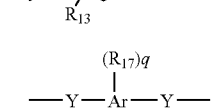

(5)

In formula (4), $R_{10}$ is a single bond or has a structure represented by formula (5), and $R_{11}$ to $R_{16}$ are respectively any of hydrogen, a group having an alicyclic structure, an organic group having 1 to 10 carbon atoms other than the group having an alicyclic structure, a hydroxyl group and a carboxyl group. In formula (5), "Ar" is an aromatic group; "Y" is any of a single bond, —O—, —S—, —OCO— and —COO—; "q" is an integer of 1 or more; $R_{17}$ is hydrogen or an organic group having 1 or more carbon atoms and may be identical with or different from each other when "q" is an integer of 2 or more; at least one of $R_{11}$ to $R_{16}$ is the group having an alicyclic structure when $R_{10}$ is a single bond; and at least one of $R_{11}$ to $R_{17}$ is the group having an alicyclic structure when $R_{10}$ has the structure represented by formula (5).

In formula (4), the aromatic group, the organic group having one or more carbon atoms, the group having an alicyclic structure, and the organic group having 1 to 10 carbon atoms other than the group having an alicyclic structure are the same as those in formula (1).

As specific examples of the tetracarboxylic acid dianhydride having an alicyclic structure, there may be listed tetracarboxylic acid dianhydride having an adamantane structure and a fluorene structure such as 9,9-bis(3,4-dicarboxyphenyl)-2,7-diadamantyl-fluorene-dianhydride, 9,9-bis[4-(3,4-dicarboxyphenoxy)-phenyl]-2,7-diadamantyl-fluorene-dianhydride and 9,9-bis[4-(3,4-dicarboxy-5-adamantylphenoxy)-phenyl]-fluorene-dianhydride; tetracarboxylic acid dianhydride having an adamantane structure and a benzene structure such as 1,3-bis(3,4-dicarboxyphenoxy)-4,6-diadamantyl-benzene-dianhydride and 1,3-bis(3,4-dicarboxy-5-adamantylphenoxy)-benzene-dianhydride; tetracarboxylic acid dianhydride having an adamantane structure and a naphthalene structure; tetracarboxylic acid dianhydride having an adamantane structure and an anthracene structure; tetracarboxylic acid dianhydride having an adamantane structure and a biphenyl structure such as 2,2'-bis(3,4-dicarboxyphenoxy)-5,5'-diadamantyl-biphenyl-dianhydride and 2,2'-bis(3,4-dicarboxy-5-adamantylphenoxy)-biphenyl-dianhydride; and the like. An adamantane structure of the group having an alicyclic structure may be selected from the above-mentioned structures having an adamantane structure as a minimum unit. A binding position of the adamantane structure may be optionally selected from the range specified by formula (1).

The tetracarboxylic acid dianhydride having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction, followed by a fluorenation reaction and a fluorenonation reaction to synthesize corresponding 2,7-diadamantyl fluorenone. The corresponding 2,7-diadamantyl fluorenone and o-xylene undergo a dehydration reaction, followed by an oxidation reaction of a methyl group to make a phthalic acid structure. Next, a dehydration reaction using acetic anhydride or the like is performed thereon, thus synthesizing 9,9-bis(3,4-dicarboxyphenyl)-2,7-diadamantyl-fluorene dianhydride. Also, 9,9-bis[(3,4-dicarboxy-phenoxy)-phenyl]-2,7-diadamantyl-fluorene dianhydride can be synthesized as follows: firstly, fluorene bisphenol having an adamantyl group is obtained by a dehydration reaction of 2,7-diadamantyl fluorenone with phenol; the fluorene bisphenol is reacted with 4-fluoro-dimethyl phthalate so as to be etherified; further, it undergoes alkaline hydrolysis and acid treatment to have a phthalate structure; and a dehydration reaction using acetic anhydride or the like is performed thereon.

The tetracarboxylic acid dianhydride having an adamantane structure and a benzene structure may be synthesized by the following method, for example. Firstly, dihydroxybenzene having an adamantane structure is synthesized by the reaction of resorcinol with 1-bromoadamantane. The dihydroxybenzene is etherified with 4-fluoro-dimethyl phthalate. Further, it undergoes alkaline hydrolysis and acid treatment to make a phthalate structure. Next, a dehydration reaction using acetic anhydride or the like is performed thereon, thus synthesizing 1,3-bis(3,4-dicarboxy-phenoxy)-4,6-diadamantyl-benzene dianhydride.

The tetracarboxylic acid dianhydride having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane. The dihydroxy-biphenyl is etherified with 4-fluoro-dimethyl phthalate. Further, it undergoes alkaline hydrolysis and acid treatment to make a phthalate structure. Next, a dehydration reaction using acetic anhydride or the like is performed thereon, thus synthesizing 2,2'-bis(3,4-dicarboxy-phenoxy)-5,5'-diadamantyl-biphenyl dianhydride.

As the diamine compound having an alicyclic structure, there may be mentioned a compound having a structure represented by the following formula (6):

[Chemical Formula 7]

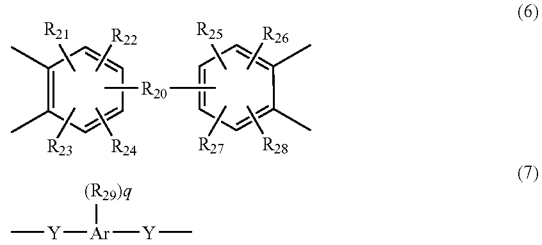

In formula (6), $R_{20}$ is a single bond or has a structure represented by formula (7); $R_{21}$ to $R_{24}$ and $R_{25}$ to $R_{28}$ are respectively any of hydrogen, a group having an alicyclic structure, an organic group having 1 to 10 carbon atoms other than the group having an alicyclic structure, a hydroxyl group and a carboxyl group; and "X" is any of —O—, —NHCO—, —CONH—, —COO— and —OCO—. In formula (7), "Ar" is an aromatic group; "Y" is any of a single bond, —O—, —S—, —OCO— and —COO—; "q" is an integer of 1 or more; $R_{29}$ is hydrogen or an organic group having 1 or more carbon atoms and may be identical with or different from each other when "q" is an integer of 2 or more; at least one of $R_{21}$ to $R_{28}$ is the group having an alicyclic structure when $R_{20}$ is a single bond; and at least one of $R_{21}$ to $R_{29}$ is the group having an alicyclic structure when $R_{20}$ has the structure represented by formula (7).

In formula (6), the aromatic group, the organic group having one or more carbon atoms, the group having an alicyclic structure, and the organic group having 1 to 10 carbon atoms other than the group having an alicyclic structure are the same as those in formula (1).

As specific examples of the diamine compound having an alicyclic structure, there may be listed a diamine compound having an adamantane structure and a fluorene structure such as 2,7-di(1-adamantyl)-fluorene-9,9-bis(4-aniline), 9,9-bis(4-amino-5-adamantylphenyl)-fluorene and 9,9-bis[(4-aminophenoxy)-phenyl]-2,7-diadamantyl-fluorene; a diamine compound having an adamantane structure and a benzene structure such as 4,6-di(1-adamantyl)-1,3-bis(4-aminophenoxy)-benzene and 1,3-bis(4-amino-5-adamantylphenoxy)-benzene; a diamine compound having an adamantane structure and a naphthalene structure; a diamine compound having an adamantane structure and an anthracene structure; a diamine compound having an adamantane structure and a biphenyl structure such as 2,2'-bis(4-aminophenoxy)-5,5'-di(1-adamantyl)-biphenyl and 2,2'-bis(4-amino-5-adamantylphenoxy)-biphenyl; and the like. An adamantane structure of the group having an alicyclic structure may be selected from the above-mentioned structures having an adamantane structure as a minimum unit. A binding position of the adamantane structure may be optionally selected from the range specified by formula (1).

The diamine compound having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction, followed by a fluorenation reaction and a fluorenonation reaction to synthesize corresponding 2,7-diadamantyl fluorenone. The corresponding 2,7-diadamantyl fluorenone is subject to a dehydration reaction with aniline, thus synthesizing 9,9-bis(4-amino-phenyl)-2,7-di(1-adamantyl)-fluorene. Also, 9,9-bis[(4-aminophenoxy)-phenyl]-2,7-di(1-adamantyl)-fluorene can be synthesized as follows: firstly, fluorene bisphenol having an adamantyl group is obtained by a dehydration reaction of 2,7-diadamantyl fluorenone and phenol; the fluorene bisphenol is etherified with 4-fluoro-nitrobenzene; and further it undergoes a reduction reaction.

The diamine compound having an adamantane structure and a benzene structure may be synthesized by the following method, for example. Firstly, dihydroxy benzene having an adamantane structure is synthesized by the reaction of resorcinol with 1-bromoadamantane. The dihydroxy benzene thus obtained is etherified with 4-fluoro-nitrobenzene. Further, it undergoes a reduction reaction, thus synthesizing 4,6-di(1-adamantyl)-1,3-bis(4-aminophenoxy)-benzene.

The diamine compound having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane. The dihydroxy-biphenyl thus obtained is etherified with 4-fluoro-nitrobenzene. Further, it undergoes a reduction reaction, thus synthesizing 2,2'-bis(4-aminophenoxy)-5,5'-di(1-adamantyl)-biphenyl.

For synthesizing a polyimide resin precursor having the structure represented by formula (1), a tetracarboxylic acid dianhydride having the structure represented by formula (4) and/or a diamine compound having the structure represented by formula (6) is used.

In the case of using the diamine compound comprising the group having the alicyclic structure represented by formula (6), it is not necessary to use the tetracarboxylic acid dianhydride having the structure represented by formula (4) as the tetracarboxylic acid dianhydride. For example, it is allowed to use a tetracarboxylic acid dianhydride having an alicyclic structure in place of "Ar" of formula (5), which is the formula of $R_{10}$ in formula (4). That is, a tetracarboxylic acid dianhydride having an alicyclic structure in a main chain thereof may be used. Or, as the tetracarboxylic acid dianhydride, a tetracarboxylic acid dianhydride comprising no group having an alicyclic structure may be used. As the tetracarboxylic acid dianhydride having an alicyclic structure in a main chain thereof, for example, there may be listed a tetracarboxylic acid dianhydride having an adamantane structure in a main chain thereof such as 1,3-bis(3,4-dicarboxyphenyl) adamantane and 2,2-bis(3,4-dicarboxyphenyl) adamantane; a tetracarboxylic acid dianhydride having in a main chain thereof a group having an adamantane structure such as bis(3,4-dicarboxyphenyl)diamantane, bis(3,4-dicarboxyphenyl)triamantane, bis(3,4-dicarboxyphenyl)tetraamantane and bis(3,4-dicarboxyphenyl)hexaamantane; a tetracarboxylic acid dianhydride having a plurality of adamantane structures in a main chain thereof such as bis(3,4-dicarboxyphenyl) biadamantane, bis(3,4-dicarboxyphenyl)triadamantane, bis(3,4-dicarboxyphenyl)tetraadamantane and bis(3,4-dicarboxyphenyl)hexaadamantane; a tetracarboxylic acid dianhydride having in a main chain thereof an ether bond and an adamantane structure, a group having an adamantane structure or a plurality of adamantane structures such as 1,3-bis(3,4-dicarboxyphenoxy)adamantane, 2,2-bis(3,4-dicarboxyphenoxy)adamantane, bis(3,4-dicarboxyphenoxy)diamantane, bis(3,4-dicarboxyphenoxy)triamantane, bis(3,4-dicarboxyphenoxy)tetraamantane, bis(3,4-dicarboxyphenoxy)hexaamantane, bis(3,4-dicarboxyphenoxy)biadamantane, bis(3,4-dicarboxyphenoxy)triadamantane, bis(3,4-dicarboxyphenoxy)tetraadamantane, bis(3,4-dicarboxyphenoxy)hexaadamantane, 1,3-bis(3,4-dicarboxyphenoxyphenyl)adamantane, 2,2-bis(3,4-dicarboxyphenoxyphenyl)adamantane, bis(3,4-dicarboxyphenoxyphenyl)diamantane, bis(3,4-dicarboxyphenoxyphenyl)triamantane, bis(3,4-dicarboxyphenoxyphenyl)tetraamantane, bis(3,4-dicarboxyphenoxyphenyl)hexaamantane, bis(3,4-dicarboxyphenoxyphenyl)biadamantane, bis(3,4-dicarboxyphenoxyphenyl)triadamantane, bis(3,4-dicarboxyphenoxyphenyl)tetraadamantane and bis(3,4-dicarboxyphenoxyphenyl)hexaadamantane; and the like. An alkyl group such as a methyl group, an ethyl group, a propyl group and a butyl group; a fluoroalkyl group such as a fluoromethyl group, a fluoroethyl group, a fluoropropyl group and a fluorobutyl group; and the like may be bonded to the adamantane structure or the group having an adamantane structure. Solubility in a solvent and heat resistance can be further improved by introducing an alkyl group. Further, substitution with fluorine contributes to reduction in dielectric constant.

As the tetracarboxylic acid dianhydride comprising no group having an alicyclic structure, there may be listed 9,9-bis(3,4-dicarboxyphenyl)fluorene-dianhydride, 9,9-bis[4-(3,4-dicarboxyphenoxy)-phenyl]fluorene-dianhydride, 1,3-bis(3,4-dicarboxyphenoxy)benzene-dianhydride, 2,2'-bis((3,4-dicarboxyphenoxy)biphenyl-dianhydride and the like.

In the case of using the tetracarboxylic acid dianhydride comprising the group having the alicyclic structure represented by formula (4), it is not necessary to use the diamine compound having the structure represented by formula (6) as the diamine compound. For example, it is allowed to use a diamine compound having an alicyclic structure in place of "Ar" of formula (7), which is the formula of $R_{20}$ in formula (6). That is, a diamine compound having an alicyclic structure in a main chain thereof may be used. Or, as the diamine compound, a diamine compound comprising no group having an alicyclic structure may be used. As the diamine compound having an alicyclic structure in a main chain thereof, for example, there may be listed a diamine compound having an adamantane structure in a main chain thereof such as 1,3-bis(4-aminophenyl)adamantane and 2,2-bis(4-aminophenyl)adamantane; a diamine compound having in a main chain thereof a group having an adamantane structure such as bis(4-aminophenyl)diamantane, bis(4-aminophenyl)triamantane, bis(4-aminophenyl)tetraamantane and bis(4-aminophenyl)hexaamantane; a diamine compound having in a main chain thereof a plurality of groups having an adamantane structure such as bis(4-aminophenyl)biadamantane, bis(4-aminophenyl)triadamantane, bis(4-aminophenyl)tetraadamantane and bis(4-aminophenyl)hexaadamantane; a diamine compound having in a main chain thereof an ether bond and an adamantane structure, a group having an adamantane structure or a plurality of groups having an adamantane structure such as 1,3-bis(4-aminophenoxy)adamantane, 2,2-bis(4-aminophenoxy)adamantane, bis(4-aminophenoxy)diamantane, bis(4-aminophenoxy)triamantane, bis(4-aminophenoxy)tetraamantane, bis(4-aminophenoxy)hexaamantane, bis(4-aminophenoxy)biadamantane, bis(4-aminophenoxy)triadamantane, bis(4-aminophenoxy)

tetraadamantane, bis(4-aminophenoxy)hexaadamantane, 1,3-bis(4-amino-phenoxyphenyl)adamantane, 2,2-bis(4-amino-phenoxyphenyl)adamantane, bis(4-amino-phenoxyphenyl)diamantane, bis(4-amino-phenoxyphenyl)triamantane, bis(4-amino-phenoxyphenyl)tetraamantane, bis(4-amino-phenoxyphenyl)hexaamantane, bis(4-amino-phenoxyphenyl)biadamantane, bis(4-amino-phenoxyphenyl)triadamantane, bis(4-amino-phenoxyphenyl)tetraadamantane and bis(4-amino-phenoxyphenyl)hexaadamantane; and the like. An alkyl group such as a methyl group, an ethyl group, a propyl group and a butyl group, a fluoroalkyl group such as a fluoromethyl group, a fluoroethyl group, a fluoropropyl group and a fluorobutyl group, and the like may be bonded to the adamantane structure or the group having an adamantane structure. Solubility in a solvent and heat resistance can be further improved by introducing an alkyl group. Further, substitution with fluorine contributes to reduction in dielectric constant.

As the diamine compound comprising no group having an alicyclic structure, there may be listed 9,9-bis(4-aniline)fluorene, 9,9-bis[(4-aminophenoxy)-phenyl]fluorene, 1,3-bis(4-aminophenoxy)-benzene, 2,2'-bis(4-aminophenoxy)biphenyl and the like.

In a combination of the tetracarboxylic acid dianhydride and the diamine compound, both of the compounds are preferred to have a group having an alicyclic structure in order to obtain a polyimide resin with a lower dielectric constant and excellent heat resistance. More specifically, it is preferable to use the tetracarboxylic acid dianhydride having the structure represented by formula (4) and the diamine compound having the structure represented by formula (6), the tetracarboxylic acid dianhydride having the structure represented by formula (4) and the diamine compound having an alicyclic structure in a main chain thereof; and the diamine compound having the structure represented by formula (6) and the tetracarboxylic acid dianhydride having an alicyclic structure in a main chain thereof.

In their syntheses, a tetracarboxylic acid dianhydride and diamine compound other than the above-mentioned tetracarboxylic acid dianhydrides and diamine compounds may be mixed for copolymerization.

In a method for preparing the polybenzoxazole resin precursor, for example, the polybenzoxazole resin precursor can be obtained by the reaction of a bis o-aminophenol compound with a dicarboxylic acid compound using the acid chloride method, active ester method or the like.

As the bis-o-aminophenol compound having an alicyclic structure, there may be mentioned a bis-o-aminophenol compound having the structure represented by formula (4).

As specific examples of the bis o-aminophenol compound having an alicyclic structure, there may be listed a bisaminophenol compound having an adamantane structure and a fluorene structure such as 9,9-bis(3-amino-4-hydroxy-phenyl)-2,7-di(1-adamantyl)-fluorene, 9,9-bis(3-amino-4-hydroxy-5-adamantylphenyl)-fluorene, 9,9-bis(3-amino-4-hydroxy-phenyl)-2,7-di(3,5-dimethyl-1-adamantyl)-fluorene, 9,9-bis[(3-hydroxy-4-aminophenoxy)-phenyl]-2,7-di(1-adamantyl)-fluorene, 9,9-bis[(3-hydroxy-4-amino-5-adamantylphenoxy)-phenyl]-fluorene, 9,9-bis[(3-hydroxy-4-aminophenoxy)-phenyl]-2,7-di(3,5-dimethyl-1-adamantyl)adamantyl-fluorene and 9,9-bis[4-(4-amino-3-hydroxy-6-adamantyl-phenoxy)-phenyl]-2,7-fluorene; a bisaminophenol compound having an adamantane structure and a benzene structure such as 1,3-bis(3-hydroxy-4-aminophenoxy)-4,6-diadamantyl benzene, 1,3-bis(3-hydroxy-4-amino-5-adamantylphenoxy)-benzene, 4,6-di(1-adamantyl)-1,3-bis(4-amino-3-hydroxyphenoxy)benzene, 4,6-di(3,5-dimethyl-1-adamantyl)-1,3-bis(4-amino-3-hydroxyphenoxy)benzene, 4,6-di(3-(3,5-dimethyl-1-adamantyl)-(3,5-dimethyl-1-adamantyl))-1,3-bis(4-amino-3-hydroxyphenoxy)benzene, 1,3-bis(4-amino-3-hydroxy-6-adamantyl-phenoxy)benzene and 4,6-di(1-adamantyl)-1,3-bis(4-amino-3-hydroxy-6-adamantyl-phenoxy)benzene; a bisaminophenol compound having an adamantane structure and a naphthalene structure; a bisaminophenol compound having an adamantane structure and an anthracene structure; a bisaminophenol compound having an adamantane structure and a biphenyl structure such as 2,2'-dihydroxy-3,3'-diamino-5,5'-diadamantyl-biphenyl, 2,2'-dihydroxy-3,3'-diamino-5,5'-bis(3,5-dimethyl-1-adamantyl)-biphenyl, 2,2'-dihydroxy-3,3'-diamino-5,5'-bis(3-(5,7-dimethyl-1-adamantyl)-(3,5-dimethyl-1-adamantyl))biphenyl, 2,2'-bis(3-hydroxy-4-aminophenoxy)-5,5'-diadamantyl-biphenyl, 2,2'-bis(3-hydroxy-4-amino-5-adamantylphenoxy)-biphenyl, 2,2'-bis[4-(3-hydroxy-4-amino)phenoxy]-5,5'-bis(3-(3,5-dimethyl-1-adamantyl)biphenyl), 2,2'-bis[4-(3-hydroxy-4-amino)phenoxy-phenyl]-5,5'-bis(3-(3,5-dimethyl-1-adamantyl)biphenyl, 2,2'-bis[4-(4-amino-3-hydroxy-6-adamantyl)phenoxy]-biphenyl and 2,2'-bis[4-(4-amino-3-hydroxy-6-adamantyl)phenoxy]-5,5'-bis(1-adamantyl) biphenyl; and the like. An adamantane structure of the group having an alicyclic structure may be selected from the above-mentioned structures having an adamantane structure as a minimum unit. A binding position of the adamantane structure may be optionally selected from the range specified by formula (1).

The bisaminophenol compound having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction, followed by a fluorenation reaction and a fluorenonation reaction to synthesize corresponding 2,7-diadamantyl fluorenone. The corresponding 2,7-diadamantyl fluorenone is subject to a dehydration reaction with phenol to obtain fluorene bisphenol having an adamantyl group. Nitration of the ortho-position of a hydroxyl group is performed on the above-obtained fluorene bisphenol. Next, it is reduced to an amino group, thus synthesizing 9,9-bis(3-amino-4-hydroxy-phenyl)-2,7-diadamantyl-fluorene. Also, the above-obtained fluorene bisphenol having an adamantyl group is etherified with 2-benzyloxy-4-fluoro-nitrobenzene. Further, it undergoes deprotection and a reduction reaction, thus synthesizing 9,9-bis[(3-hydroxy-4-aminophenoxy)-phenyl]-2,7-diadamantyl-fluorene.

The bisaminophenol compound having an adamantane structure and a benzene structure may be synthesized by the following method, for example. Firstly, dihydroxybenzene having an adamantane structure is synthesized by the reaction of resorcinol with 1-bromoadamantane or 1-bromo-3,5-dimethyladamantane. The dihydroxybenzene thus obtained is etherified with 2-benzyloxy-4-fluoro-nitrobenzene. Further, it undergoes deprotection and a reduction reaction, thus synthesizing 1,3-bis(3-hydroxy-4-aminophenoxy)-4,6-diadamantyl-benzene or 4,6-di(3,5-dimethyl-1-adamantyl)-1,3-bis(4-amino-3-hydroxyphenoxy)benzene.

The bisaminophenol compound having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromoadamantane or 1-bromo-3,5-dimethyladamantane. Nitration of the ortho-position of a hydroxyl group is performed on the above-obtained dihydroxy-biphenyl. Next, it is reduced to an amino group, thus synthesizing 2,2'-dihydroxy-3,3'-diamino-5,5'-diadamantyl-biphenyl or 2,2'-dihydroxy-3,3'-diamino-5,5'-di(3,5-dimethyl-1-adamantyl)-biphenyl.

Also, 2,2'-bis(3-hydroxy-4-aminophenoxy)-5,5'-diadamantyl-biphenyl or 4,6-di(3,5-dimethyl-1-adamantyl)-1,3-bis(4-amino-3-hydroxyphenoxy)benzene can be synthesized by etherifying the above-obtained dihydroxy-biphenyl having an adamantyl group with 2-benzyloxy-4-fluoro-nitrobenzene and performing deprotection and a reduction reaction thereon.

As the dicarboxylic acid compound having an alicyclic structure, there may be mentioned a dicarboxylic acid compound having the structure represented by formula (6).

As specific examples of the dicarboxylic acid compound having an alicyclic structure, there may be listed dicarboxylic acid having an adamantane structure and a fluorene structure such as 2,7-diadamantylfluorene-9,9-bis benzoic acid, 9,9-bis(4-carboxy-3-adamantylphenyl)fluorene, 2,7-di(3,5-dimethyl-1-adamantyl)fluorene-9,9-bis benzoic acid, 9,9-bis(4-carboxy-phenyl)-2,7-diadamantyl-fluorene, 9,9-bis(4-carboxy-phenyl)-2,7-di(3,5-dimethyl-1-adamantyl)-fluorene, 9,9-bis[(4-carboxy-phenoxy)-phenyl]-2,7-diadamantyl-fluorene, 9,9-bis[(4-carboxy-3-adamantylphenoxy)-phenyl]-fluorene and 9,9-bis[(4-carboxy-phenoxy)-phenyl]-2,7-di(3,5-dimethyl-1-adamantyl)-fluorene; dicarboxylic acid having an adamantane structure and a benzene structure such as 4,6-di[(3-(5,7-dimethyl-1-adamantyl)-(3,5-dimethyl-1-adamantyl))-1,3-bis(4-carboxy-phenoxy)benzene, 1,3-bis(4-carboxy-3-adamantylphenoxy)benzene, 1,3-bis(4-carboxyl-phenoxy)-4,6-diadamantyl-benzene and 1,3-bis(4-carboxyl-phenoxy)-4,6-di(3,5-dimethyl-1-adamantyl)-benzene; dicarboxylic acid having an adamantane structure and a naphthalene structure; dicarboxylic acid having an adamantane structure and an anthracene structure; dicarboxylic acid having an adamantane structure and a biphenyl structure such as 2,2'-bis[(4-carboxy-phenoxy)-phenyl]-5,5'-bis[3-(1-adamantyl)-(1-adamantyl)]-biphenyl, 2,2'-bis[(4-carboxy-3-adamantylphenoxy)-phenyl]-biphenyl, 2,2'-bis(4-carboxy-phenoxy)-5,5'-diadamantyl-biphenyl and 2,2'-bis(4-carboxy-phenoxy)-5,5'-di(3,5-dimethyl-1-adamantyl)-biphenyl; phthalic acid having an adamantane structure and an ethynyl structure such as 3-(2-(1-adamantyl)ethynyl)phthalic acid, 3-(2-(2-adamantyl)ethynyl)phthalic acid, 4-(2-(1-adamantyl)ethynyl)phthalic acid, 4-(2-(2-adamantyl)ethynyl)phthalic acid, 3-(2-(1-(3,5-dimethyladamantyl))ethynyl)phthalic acid, 3-(2-(1,3-dimethyladamantyl))ethynyl)phthalic acid, 4-(2-(1-(3,5-dimethyladamantyl))ethynyl)phthalic acid and 4-(2-(2-(1,3-dimethyladamantyl))ethynyl)phthalic acid; isophthalic acid having an adamantane structure and an ethynyl structure such as 4-(2-(1-adamantyl)ethynyl)isophthalic acid, 4-(2-(2-adamantyl)ethynyl)isophthalic acid, 5-(2-(1-adamantyl)ethynyl)isophthalic acid, 5-(2-(2-adamantyl)ethynyl)isophthalic acid, 4-(2-(1-(3,5-dimethyladamantyl))ethynyl)isophthalic acid, 4-(2-(2-(1,3-dimethyladamantyl))ethynyl)isophthalic acid, 5-(2-(1-(3,5-dimethyladamantyl))ethynyl)isophthalic acid and 5-(2-(2-(1,3-dimethyladamantyl))ethynyl)isophthalic acid; terephthalic acid having an adamantane structure and an ethynyl structure such as 5-(2-(1-adamantyl)ethynyl)terephthalic acid, 5-(2-(2-adamantyl)ethynyl)terephthalic acid, 5-(2-(1-(3,5-dimethyladamantyl))ethynyl)terephthalic acid and 5-(2-(2-(1,3-dimethyladamantyl))ethynyl)terephthalic acid; phthalic acid having an diamantyl structure and an ethynyl structure such as 3-(2-(1-diamantyl)ethynyl)phthalic acid, 3-(2-(2-diamantyl)ethynyl)phthalic acid, 4-(2-(1-diamantyl)ethynyl)phthalic acid and 4-(2-(2-diamantyl)ethynyl)phthalic acid; isophthalic acid having a diamantyl structure and an ethynyl structure such as 4-(2-(1-diamantyl)ethynyl)isophthalic acid, 4-(2-(2-diamantyl)ethynyl)isophthalic acid, 5-(2-(1-diamantyl)ethynyl)isophthalic acid and 5-(2-(2-diamantyl)ethynyl)isophthalic acid; terephthalic acid having a diamantyl structure and an ethynyl structure such as 5-(2-(1-diamantyl)ethynyl)terephthalic acid and 5-(2-(2-diamantyl)ethynyl)terephthalic acid; phthalic acid having a tetramantyl structure and an ethynyl structure such as 3-(2-(1-tetramantyl)ethynyl)phthalic acid, 3-(2-(2-tetramantyl)ethynyl)phthalic acid, 4-(2-(1-tetramantyl)ethynyl)phthalic acid and 4-(2-(2-tetraamantyl)ethynyl)phthalic acid; isophthalic acid having a tetramantyl structure and an ethynyl structure such as 4-(2-(1-tetramantyl)ethynyl)isophthalic acid, 4-(2-(2-tetramantyl)ethynyl)isophthalic acid, 5-(2-(1-tetramantyl)ethynyl)isophthalic acid and 5-(2-(2-tetramantyl)ethynyl)isophthalic acid; terephthalic acid having a tetramantyl structure and an ethynyl structure such as 5-(2-(1-tetramantyl)ethynyl)terephthalic acid and 5-(2-(2-tetramantyl)ethynyl)terephthalic acid; isophthalic acid having a biadamantyl structure and an ethynyl structure such as 3-(2-(3-(1,1'-biadamantyl))ethynyl)phthalic acid, 3-(2-(2-(1,1'-biadamantyl))ethynyl)phthalic acid, 4-(2-(3-(1,1'-biadamantyl))ethynyl)phthalic acid, 4-(2-(2-(1,1'-biadamantyl))ethynyl)phthalic acid, 3-(2-(7-(1,1'-(3,5,3',5'-tetramethyl biadamantyl)))ethynyl)phthalic acid, 3-(2-(2-(1,1'-(3,5,3',5'-tetramethyl biadamantyl)))ethynyl)phthalic acid, 4-(2-(7-(1,1'-(3,5,3',5'-tetramethyl biadamantyl)))ethynyl)phthalic acid and 4-(2-(2-(1,1'-(3,5,3',5'-tetramethyl biadamantyl)))ethynyl)phthalic acid; isophthalic acid having a biadamantyl structure and an ethynyl structure such as 4-(2-(3-(1,1'-biadamantyl))ethynyl)isophthalic acid, 4-(2-(2-(1,1'-biadamantyl))ethynyl)isophthalic acid, 5-(2-(3-(1,1'-biadamantyl))ethynyl)isophthalic acid, 5-(2-(2-(1,1'-biadamantyl))ethynyl)isophthalic acid, 4-(2-(7-(1,1'-(3,5,3',5'-tetramethyl biadamantyl)))ethynyl)isophthalic acid, 4-(2-(2-(1,1'-(3,5,3',5'-tetramethyl biadamantyl)))ethynyl)isophthalic acid, 5-(2-(7-(1,1'-(3,5,3',5'-tetramethyl biadamantyl)))ethynyl)isophthalic acid and 5-(2-(2-(1,1'-(3,5,3',5'-tetramethyl biadamantyl)))ethynyl)isophthalic acid; terephthalic acid having a biadamantyl structure and an ethynyl structure such as 5-(2-(3-(1,1'-biadamantyl))ethynyl)terephthalic acid, 5-(2-(2-(1,1'-biadamantyl))ethynyl)terephthalic acid, 5-(2-(7-(1,1'-(3,5,3',5'-tetramethyl biadamantyl)))ethynyl)terephthalic acid and 5-(2-(2-(1,1'-(3,5,3',5'-tetramethyl biadamantyl)))ethynyl)terephthalic acid; phthalic acid having an adamantyl structure and a phenyl-ethynyl structure such as 3-(2-(4-(1-adamantyl)phenyl)ethynyl)phthalic acid, 3-(2-(4-(2-adamantyl)phenyl)ethynyl)phthalic acid, 4-(2-(4-(1-adamantyl)phenyl)ethynyl)phthalic acid, 4-(2-(4-(2-adamantyl)phenyl)ethynyl)phthalic acid, 3-(2-(4-(1-(3,5-dimethyladamantyl))phenyl)ethynyl)phthalic acid, 3-(2-(4-(2-(1,3-dimethyladamantyl))phenyl)ethynyl)phthalic acid, 4-(2-(4-(1-(3,5-dimethyladamantyl))phenyl)ethynyl)phthalic acid, 4-(2-(4-(2-(1,3-dimethyladamantyl))phenyl)ethynyl)phthalic acid, 3-(2-(4-(4-(1-adamantyl)phenoxy)phenyl)ethynyl)phthalic acid, 3-(2-(4-(4-(2-adamantyl)phenoxy)phenyl)ethynyl)phthalic acid, 4-(2-(4-(4-(1-adamantyl)phenoxy)phenyl)ethynyl)phthalic acid, 4-(2-(4-(4-(2-adamantyl)phenoxy)phenyl)ethynyl)phthalic acid, 3-(2-(4-(4-(1-(3,5-dimethyladamantyl))phenoxy)phenyl)ethynyl)phthalic acid, 3-(2-(4-(4-(2-(1,3-dimethyladamantyl))phenoxy)phenyl)ethynyl)phthalic acid, 4-(2-(4-(4-(1-(3,5-dimethyladamantyl))phenoxy)phenyl)ethynyl)phthalic acid and 4-(2-(4-(4-(2-(1,3-dimethyladamantyl))phenoxy)phenyl)ethynyl)phthalic acid; isophthalic acid having an adamantyl structure and a phenylethynyl structure such as 4-(2-(4-(1-adamantyl)phenyl)ethynyl)isophthalic acid, 4-(2-(4-(2-adamantyl)phenyl)ethynyl)

isophthalic acid, 5-(2-(4-(1-adamantyl)phenyl)ethynyl) isophthalic acid, 5-(2-(4-(2-adamantyl)phenyl)ethynyl) isophthalic acid, 4-(2-(4-(1-(3,5-dimethyladamantyl)) phenyl)ethynyl)isophthalic acid, 4-(2-(4-(2-(1,3-dimethyladamantyl))phenyl)ethynyl)isophthalic acid, 5-(2-(4-(1-(3,5-dimethyladamantyl))phenyl)ethynyl)isophthalic acid, 5-(2-(4-(2-(1,3-dimethyladamantyl))phenyl)ethynyl) isophthalic acid, 4-(2-(4-(4-(1-adamantyl)phenoxy)phenyl) ethynyl)isophthalic acid, 4-(2-(4-(4-(2-adamantyl)phenoxy) phenyl)ethynyl)isophthalic acid, 5-(2-(4-(4-(1-adamantyl) phenoxy)phenyl)ethynyl)isophthalic acid, 5-(2-(4-(4-(2-adamantyl)phenoxy)phenyl)ethynyl)isophthalic acid, 4-(2-(4-(4-(1-(3,5-dimethyladamantyl))phenoxy)phenyl)ethynyl) isophthalic acid, 4-(2-(4-(4-(2-(1,3-dimethyladamantyl)) phenoxy)phenyl)ethynyl)isophthalic acid, 5-(2-(4-(4-(1-(3, 5-dimethyladamantyl))phenoxy)phenyl)ethynyl)isophthalic acid and 5-(2-(4-(4-(2-(1,3-dimethyladamantyl))phenoxy) phenyl)ethynyl)isophthalic acid; terephthalic acid having an adamantyl structure and a phenylethynyl structure such as 5-(2-(4-(1-adamantyl)phenyl)ethynyl)terephthalic acid, 5-(2-(4-(2-adamantyl)phenyl)ethynyl)terephthalic acid, 5-(2-(4-(1-(3,5-dimethyladamantyl))phenyl)ethynyl)terephthalic acid, 5-(2-(4-(2-(1,3-dimethyladamantyl))phenyl) ethynyl)terephthalic acid, 5-(2-(4-(4-(1-adamantyl)phenoxy)phenyl)ethynyl)terephthalic acid, 5-(2-(4-(4-(2-adamantyl)phenoxy)phenyl)ethynyl)terephthalic acid, 5-(2-(4-(4-(1-(3,5-dimethyladamantyl))phenoxy)phenyl)ethynyl) terephthalic acid and 5-(2-(4-(4-(2-(1,3-dimethyladamantyl))phenoxy)phenyl)ethynyl)terephthalic acid; phthalic acid having a diamantyl structure and a phenylethynyl structure such as 3-(2-(4-(1-diamantyl)phenyl) ethynyl)phthalic acid, 3-(2-(4-(2-diamantyl)phenyl)ethynyl) phthalic acid, 4-(2-(4-(1-diamantyl)phenyl)ethynyl)phthalic acid, 4-(2-(4-(2-diamantyl)phenyl)ethynyl)phthalic acid, 3-(2-(4-(4-(1-diamantyl)phenoxy)phenyl)ethynyl)phthalic acid, 3-(2-(4-(4-(2-diamantyl)phenoxy)phenyl)ethynyl)phthalic acid, 4-(2-(4-(4-(1-diamantyl)phenoxy)phenyl)ethynyl)phthalic acid and 4-(2-(4-(4-(2-diamantyl)phenoxy)phenyl)ethynyl)phthalic acid; isophthalic acid having a diamantyl structure and a phenylethynyl structure such as 4-(2-(4-(1-diamantyl)phenyl)ethynyl)isophthalic acid, 4-(2-(4-(2-diamantyl)phenyl)ethynyl)isophthalic acid, 5-(2-(4-(1-diamantyl)phenyl)ethynyl)isophthalic acid, 5-(2-(4-(2-diamantyl)phenyl)ethynyl)isophthalic acid, 4-(2-(4-(4-(1-diamantyl)phenoxy)phenyl)ethynyl)isophthalic acid, 4-(2-(4-(4-(2-diamantyl)phenoxy)phenyl)ethynyl)isophthalic acid, 5-(2-(4-(4-(1-diamantyl)phenoxy)phenyl)ethynyl) isophthalic acid and 5-(2-(4-(4-(2-diamantyl)phenoxy)phenyl)ethynyl)isophthalic acid; terephthalic acid having a diamantyl structure and a phenylethynyl structure such as 5-(2-(4-(1-diamantyl)phenyl)ethynyl)terephthalic acid, 5-(2-(4-(2-diamantyl)phenyl)ethynyl)terephthalic acid, 5-(2-(4-(4-(1-diamantyl)phenoxy)phenyl)ethynyl)terephthalic acid and 5-(2-(4-(4-(2-diamantyl)phenoxy)phenyl)ethynyl)terephthalic acid; phthalic acid having a tetramantyl structure and a phenylethynyl structure such as 3-(2-(4-(1-tetramantyl)phenyl)ethynyl)phthalic acid, 3-(2-(4-(2-tetramantyl)phenyl) ethynyl)phthalic acid, 4-(2-(4-(1-tetramantyl)phenyl)ethynyl)phthalic acid, 4-(2-(4-(2-tetramantyl)phenyl)ethynyl) phthalic acid, 3-(2-(4-(4-(1-tetramantyl)phenoxy)phenyl) ethynyl)phthalic acid, 3-(2-(4-(4-(2-tetramantyl)phenoxy) phenyl)ethynyl)phthalic acid, 4-(2-(4-(4-(1-tetramantyl) phenoxy)phenyl)ethynyl)phthalic acid and 4-(2-(4-(4-(2-tetramantyl)phenoxy)phenyl)ethynyl)phthalic acid; isophthalic acid having a tetramantyl structure and a phenyl-ethynyl structure such as 4-(2-(4-(1-tetramantyl)phenyl) ethynyl)isophthalic acid, 4-(2-(4-(2-tetramantyl)phenyl) ethynyl)isophthalic acid, 5-(2-(4-(1-tetramantyl)phenyl) ethynyl)isophthalic acid, 5-(2-(4-(2-tetramantyl)phenyl) ethynyl)isophthalic acid, 4-(2-(4-(4-(1-tetramantyl) phenoxy)phenyl)ethynyl)isophthalic acid, 4-(2-(4-(4-(2-tetramantyl)phenoxy)phenyl)ethynyl)isophthalic acid, 5-(2-(4-(4-(1-tetramantyl)phenoxy)phenyl)ethynyl)isophthalic acid and 5-(2-(4-(4-(2-tetramantyl)phenoxy)phenyl)ethynyl) isophthalic acid; terephthalic acid having a tetramantyl structure and a phenylethynyl structure such as 5-(2-(4-(1-tetramantyl)phenyl)ethynyl)terephthalic acid, 5-(2-(4-(2-tetramantyl)phenyl)ethynyl)terephthalic acid, 5-(2-(4-(4-(1-tetramantyl)phenoxy)phenyl)ethynyl)terephthalic acid and 5-(2-(4-(4-(2-tetramantyl)phenoxy)phenyl)ethynyl)terephthalic acid; phthalic acid having a biadamantyl structure and a phenylethynyl structure such as 3-(2-(4-(3-(1,1'-biadamantyl))phenyl)ethynyl)phthalic acid, 3-(2-(4-(2-(1,1'-biadamantyl))phenyl)ethynyl)phthalic acid, 4-(2-(4-(3-(1,1'-biadamantyl))phenyl)ethynyl)phthalic acid, 4-(2-(4-(2-(1,1'-biadamantyl))phenyl)ethynyl)phthalic acid, 3-(2-(4-(7-(1,1'-(3,5,3',5'-tetramethyl biadamantyl)))phenyl)ethynyl)phthalic acid, 3-(2-(4-(2-(1,1'-(3,5,3',5'-tetramethyl biadamantyl))) phenyl)ethynyl)phthalic acid, 4-(2-(4-(7-(1,1'-(3,5,3',5'-tetramethyl biadamantyl)))phenyl)ethynyl)phthalic acid, 4-(2-(4-(2-(1,1'-(3,5,3',5'-tetramethyl biadamantyl)))phenyl) ethynyl)phthalic acid, 3-(2-(4-(4-(3-(1,1'-biadamantyl)) phenoxy)phenyl)ethynyl)phthalic acid, 3-(2-(4-(4-(2-(1,1'-biadamantyl))phenoxy)phenyl)ethynyl)phthalic acid, 4-(2-(4-(4-(3-(1,1'-biadamantyl))phenoxy)phenyl)ethynyl) phthalic acid, 4-(2-(4-(4-(2-(1,1'-biadamantyl))phenoxy) phenyl)ethynyl)phthalic acid, 3-(2-(4-(4-(7-(1,1'-(3,5,3',5'-tetramethyl biadamantyl)))phenoxy)phenyl)ethynyl)phthalic acid, 3-(2-(4-(4-(2-(1,1'-(3,5,3',5'-tetramethyl biadamantyl)))phenoxy)phenyl)ethynyl)phthalic acid, 4-(2-(4-(4-(7-(1,1'-(3,5,3',5'-tetramethyl biadamantyl)))phenoxy)phenyl) ethynyl)phthalic acid and 4-(2-(4-(4-(2-(1,1'-(3,5,3',5'-tetramethyl biadamantyl)))phenoxy)phenyl)ethynyl)phthalic acid; isophthalic acid having a biadamantyl structure and a phenylethynyl structure such as 4-(2-(4-(3-(1,1'-biadamantyl))phenyl)ethynyl)isophthalic acid, 4-(2-(4-(2-(1,1'-biadamantyl))phenyl)ethynyl)isophthalic acid, 5-(2-(4-(3-(1,1'-biadamantyl))phenyl)ethynyl)isophthalic acid, 5-(2-(4-(2-(1, 1'-biadamantyl))phenyl)ethynyl)isophthalic acid, 4-(2-(4-(7-(1,1'-(3,5,3',5'-tetramethyl biadamantyl)))phenyl)ethynyl) isophthalic acid, 4-(2-(4-(2-(1,1'-(3,5,3',5'-tetramethyl biadamantyl)))phenyl)ethynyl)isophthalic acid, 5-(2-(4-(7-(1,1'-(3,5,3',5'-tetramethyl biadamantyl)))phenyl)ethynyl) isophthalic acid, 5-(2-(4-(2-(1,1'-(3,5,3',5'-tetramethyl biadamantyl)))phenyl)ethynyl)isophthalic acid, 4-(2-(4-(4-(3-(1, 1'-biadamantyl))phenoxy)phenyl)ethynyl)isophthalic acid, 4-(2-(4-(4-(2-(1,1'-biadamantyl))phenoxy)phenyl)ethynyl) isophthalic acid, 5-(2-(4-(4-(3-(1,1'-biadamantyl))phenoxy) phenyl)ethynyl)isophthalic acid, 5-(2-(4-(4-(2-(1,1'-biadamantyl))phenoxy)phenyl)ethynyl)isophthalic acid, 4-(2-(4-(4-(7-(1,1'-(3,5,3',5'-tetramethyl biadamantyl)))phenoxy) phenyl)ethynyl)isophthalic acid, 4-(2-(4-(4-(2-(1,1'-(3,5,3', 5'-tetramethyl biadamantyl)))phenoxy)phenyl)ethynyl) isophthalic acid, 5-(2-(4-(4-(7-(1,1'-(3,5,3',5'-tetramethyl biadamantyl)))phenoxy)phenyl)ethynyl)isophthalic acid and 5-(2-(4-(4-(2-(1,1'-(3,5,3',5'-tetramethyl biadamantyl)))phenoxy)phenyl)ethynyl)isophthalic acid; terephthalic acid having a biadamantyl structure and a phenylethynyl structure such as 5-(2-(4-(3-(1,1'-biadamantyl))phenyl)ethynyl) terephthalic acid, 5-(2-(4-(2-(1,1'-biadamantyl))phenyl) ethynyl)terephthalic acid, 5-(2-(4-(7-(1,1'-(3,5,3',5'-tetramethyl biadamantyl)))phenyl)ethynyl)terephthalic acid, 5-(2-(4-(2-(1,1'-(3,5,3',5'-tetramethyl biadamantyl)))phenyl) ethynyl)terephthalic acid, 5-(2-(4-(4-(3-(1,1'-biadamantyl))

phenoxy)phenyl)ethynyl)terephthalic acid, 5-(2-(4-(4-(2-(1, 1'-biadamantyl))phenoxy)phenyl)ethynyl)terephthalic acid, 5-(2-(4-(4-(7-(1,1'-(3,5,3',5'-tetramethyl biadamantyl)))phenoxy)phenyl)ethynyl)terephthalic acid and 5-(2-(4-(4-(2-(1, 1'-(3,5,3',5'-tetramethyl biadamantyl)))phenoxy)phenyl) ethynyl)terephthalic acid; and the like. An adamantane structure of the group having an alicyclic structure may be selected from the above-mentioned structures having an adamantane structure as a minimum unit. A binding position of the adamantane structure may be optionally selected from the range specified by formula (1).

The dicarboxylic acid compound having an adamantane structure and a fluorene structure may be synthesized by the following method, for example. Firstly, 2-bromo-5-(1-adamantyl)-toluene or 1-bromo-3,5-dimethyladamantane, and 4-(1-adamantyl)-benzeneboronic acid undergo a Suzuki coupling reaction, followed by a fluorenation reaction and a fluorenonation reaction to synthesize corresponding 2,7-diadamantyl fluorenone or 2,7-di(3,5-dimethyl-1-adamantyl) fluorenone. The corresponding 2,7-diadamantyl fluorenone or 2,7-di(3,5-dimethyl-1-adamantyl)fluorenone is subject to a dehydration reaction with methyl benzoate to obtain fluorene dimethyl dibenzoate having an adamantyl group. Alkaline hydrolysis and acid treatment are performed thereon, thus synthesizing 9,9-bis(4-carboxy-phenyl)-2,7-diadamantyl-fluorene. Also, fluorene bisphenyl having an adamantyl group, which is an intermediate reactant of bisaminophenol compound synthesis, is etherified with methyl 4-fluorobenzoate and then subject to alkaline hydrolysis and acid treatment, thus synthesizing 9,9-bis[(4-carboxy-phenoxy)-phenyl]-2,7-diadamantyl-fluorene, 9,9-bis[(4-carboxy-phenoxy)-phenyl]-2,7-di(3,5-dimethyl-1-adamantyl)-fluorene.

The dicarboxylic acid compound having an adamantane structure and a benzene structure may be synthesized by the following method, for example. Firstly, dihydroxybenzene having an adamantane structure is synthesized by the reaction of resorcinol with 1-bromoadamantane or 1-bromo-3,5-dimethyladamantane. The dihydroxybenzene is etherified with methyl 4-fluorobenzoate and then subject to alkaline hydrolysis and acid treatment, thus synthesizing 1,3-bis(4-carboxyl-phenoxy)-4,6-diadamantyl-benzene or 1,3-bis(4-carboxyl-phenoxy)-4,6-di(3,5-dimethyl-1-adamantyl)-benzene.

The dicarboxylic acid compound having an adamantane sstructure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane or 1-bromo-3,5-dimethyladamantane. The dihydroxy-biphenyl is etherified with methyl 4-fluorobenzoate and then subject to alkaline hydrolysis and acid treatment, thus synthesized 2,2'-bis(4-carboxy-phenoxy)-5,5'-diadamantyl-biphenyl, 2,2'-bis(4-carboxy-phenoxy)-5,5'-di(3,5-dimethyl-1-adamantyl)-biphenyl.

For synthesizing a polybenzoxazole resin precursor having the structure represented by formula (1), a bis-o-aminophenol compound having the structure represented by formula (4) and/or a dicarboxylic acid compound having the structure represented by formula (6) is used.

In the case of using the dicarboxylic acid compound comprising the group having the alicyclic structure represented by formula (6), it is not necessary to use the bis-o-aminophenol compound having the structure represented by formula (4) as the bis-o-aminophenol compound. For example, it is allowed to use a bis-o-aminophenol compound having an alicyclic structure in place of "Ar" of formula (5), which is the formula of $R_{10}$ in formula (4). That is, a bis-o-aminophenol compound having an alicyclic structure in a main chain thereof may be used. Or, as the bis-o-aminophenol compound, a bis-o-aminophenol compound comprising no group having an alicyclic structure may be used. As the bis-o-aminophenol compound having an alicyclic structure in a main chain thereof, for example, there may be listed a bis-o-aminophenol compound having an adamantane structure in a main chain thereof such as 1,3-bis(3-amino-4-hydroxyphenyl)adamantane, 2,2-bis(3-amino-4-hydroxyphenyl)adamantane, 1,3-bis(4-amino-3-hydroxyphenyl)adamantane and 2,2-bis(4-amino-3-hydroxyphenyl)adamantane; a bis-o-aminophenol compound having in a main chain thereof a group having an adamantane structure such as bis(3-amino-4-hydroxyphenyl)diamantane, bis(4-amino-3-hydroxyphenyl)diamantane, bis(3-amino-4-hydroxyphenyl)triamantane, bis(4-amino-3-hydroxyphenyl) triamantane, bis(3-amino-4-hydroxyphenyl)tetraamantane, bis(4-amino-3-hydroxyphenyl)tetraamantane, bis(3-amino-4-hydroxyphenyl)hexaamantane and bis(4-amino-3-hydroxyphenyl)hexaamantane; a bis-o-aminophenol compound having in a main chain thereof a plurality of groups having an adamantane structure such as bis(3-amino-4-hydroxyphenyl) biadamantane, bis(4-amino-3-hydroxyphenyl)biadamantane, bis(3-amino-4-hydroxyphenyl)triadamantane, bis(4-amino-3-hydroxyphenyl)triadamantane, bis(3-amino-4-hydroxyphenyl)tetraadamantane, bis(4-amino-3-hydroxyphenyl)tetraadamantane, bis(3-amino-4-hydroxyphenyl)hexaadamantane and bis(4-amino-3-hydroxyphenyl)hexaadamantane; a bis-o-aminophenol compound having in a main chain thereof an adamantane structure, a group having an adamantane structure or a plurality of groups having an adamantane structure and an ether bond such as 1,3-bis(3-amino-4-hydroxyphenoxy)adamantane, 2,2-bis(3-amino-4-hydroxyphenoxy)adamantane, 1,3-bis(4-amino-3-hydroxyphenoxy)adamantane, 2,2-bis(4-amino-3-hydroxyphenoxy)adamantane, bis(3-amino-4-hydroxyphenoxy)diamantane, bis(4-amino-3-hydroxyphenoxy)diamantane, bis(3-amino-4-hydroxyphenoxy)triamantane, bis(4-amino-3-hydroxyphenoxy)triamantane, bis(3-amino-4-hydroxyphenoxy)tetraamantane, bis(4-amino-3-hydroxyphenoxy)tetraamantane, bis(3-amino-4-hydroxyphenoxy)hexaamantane, bis(4-amino-3-hydroxyphenoxy)hexaamantane, bis(3-amino-4-hydroxyphenoxy)biadamantane, bis(4-amino-3-hydroxyphenoxy)biadamantane, bis(3-amino-4-hydroxyphenoxy)triadamantane, bis(4-amino-3-hydroxyphenoxy)triadamantane, bis(3-amino-4-hydroxyphenoxy)tetraadamantane, bis(4-amino-3-hydroxyphenoxy)tetraadamantane, bis(3-amino-4-hydroxyphenoxy)hexaadamantane, bis(4-amino-3-hydroxyphenoxy)hexaadamantane, 1,3-bis(3-amino-4-hydroxy-phenoxyphenyl)adamantane, 2,2-bis(3-amino-4-hydroxy-phenoxyphenyl)adamantane, 1,3-bis(4-amino-3-hydroxy-phenoxyphenyl)adamantane, 2,2-bis(4-amino-3-hydroxy-phenoxyphenyl)adamantane, bis(3-amino-4-hydroxy-phenoxyphenyl)diamantane, bis(4-amino-3-hydroxy-phenoxyphenyl)diamantane, bis(3-amino-4-hydroxy-phenoxyphenyl)triamantane, bis(4-amino-3-hydroxy-phenoxyphenyl)triamantane, bis(3-amino-4-hydroxy-phenoxyphenyl)tetraamantane, bis(4-amino-3-hydroxy-phenoxyphenyl)tetraamantane, bis(3-amino-4-hydroxy-phenoxyphenyl)hexaamantane, bis(4-amino-3-hydroxy-phenoxyphenyl)hexaamantane, bis(3-amino-4-hydroxy-phenoxyphenyl)biadamantane, bis(4-amino-3-hydroxy-phenoxyphenyl)biadamantane, bis(3-amino-4-hydroxy-phenoxyphenyl)triadamantane, bis(4-amino-3-hydroxy-phenoxyphenyl)triadamantane, bis(3-amino-4- hydroxy-phenoxyphenyl)tetraadamantane, bis(4-amino-3-hydroxy-phenoxyphenyl)tetraadamantane, bis(3-amino-4-hydroxy-phenoxyphenyl)hexaadamantane and bis(4-amino-3-hydroxy-phenoxyphenyl)hexaadamantane; a bis-o-aminophenol compound having in main and side chains thereof an adamantane structure, a group having an adamantane structure or a plurality of groups having an adamantane structure such as bis(5-adamantyl-3-amino-4-hydroxyphenyl)adamantane, bis(5-adamantyl-3-amino-4-hydroxyphenyl)diamantane, bis(5-adamantyl-3-amino-4-hydroxyphenyl)triamantane, bis(5-adamantyl-3-amino-4-hydroxyphenyl)tetraamantane, bis(5-adamantyl-3-amino-4-hydroxyphenyl)hexaamantane, bis(5-adamantyl-3-amino-4-hydroxyphenyl)biadamantane, bis(5-adamantyl-3-amino-4-hydroxyphenyl)triadamantane, bis(5-adamantyl-3-amino-4-hydroxyphenyl)tetraadamantane and bis(5-adamantyl-3-amino-4-hydroxyphenyl)hexaadamantane; and the like. An alkyl group such as a methyl group, an ethyl group, a propyl group and a butyl group, a fluoroalkyl group such as a fluoromethyl group, a fluoroethyl group, a fluoropropyl group and a fluorobutyl group, and the like may be bonded to the adamantane structure or the group having an adamantane structure. Solubility in a solvent and heat resistance can be further improved by introducing an alkyl group. Further, substitution with fluorine contributes to reduction in dielectric constant.

As the bis-o-aminophenol compound comprising no group having an alicyclic structure, there may be listed 9,9-bis(3-amino-4-hydroxy-phenyl)fluorene, 9,9-bis(3-amino-4-hydroxy-phenyl)fluorene, 1,3-bis(3-hydroxy-4-aminophenoxy)benzene, 1,3-bis(4-amino-3-hydroxyphenoxy)benzene, 2,2'-dihydroxy-3,3'-diaminobiphenyl, 2,2'-bis[4-(3-hydroxy-4-amino)phenoxy]biphenyl and the like.

In the case of using the bis-o-aminophenol compound comprising the group having the alicyclic structure represented by formula (4), it is not necessary to use the dicarboxylic acid compound having the structure represented by formula (6) as the dicarboxylic acid compound. For example, it is allowed to use a dicarboxylic acid compound having an alicyclic structure in place of "Ar" of formula (7), which is the formula of $R_{20}$ in formula (6). That is, a dicarboxylic acid compound having an alicyclic structure in a main chain thereof may be used. Or, as the dicarboxylic acid compound, a dicarboxylic acid compound comprising no group having an alicyclic structure may be used. As the dicarboxylic acid compound having an alicyclic structure in a main chain thereof, for example, there may be listed adamantanedicarboxylic acid, biadamantanedicarboxylic acid and tetraadamantanedicarboxylic acid. Further, an alkyl group such as a methyl group, an ethyl group, a propyl group and a butyl group, a fluoroalkyl group such as a fluoromethyl group, a fluoroethyl group, a fluoropropyl group and a fluorobutyl group, and the like may be bonded to the group having an adamantane structure. Solubility in a solvent and heat resistance can be further improved by introducing an alkyl group. Further, substitution with fluorine contributes to reduction in dielectric constant.

As the dicarboxylic acid compound comprising no group having an alicyclic structure, there may be listed 9,9-biscarboxyphenylfluorene, 9,9-bis[(4-carboxy-phenoxy)-phenyl]fluorene, 1,3-bis(4-carboxy-phenoxy)benzene, 2,2'-bis[(4-carboxy-phenoxy)-phenyl]biphenyl and the like.

In a combination of the bis-o-aminophenol compound and dicarboxylic acid compound, both of the compounds are preferred to have a group having an alicyclic structure in order to obtain a polybenzoxazole resin with lower dielectric constant and excellent heat resistance. More specifically, it is preferable to use the bis-o-aminophenol compound having the structure represented by formula (4) and the dicarboxylic acid compound having the structure represented by formula (6), the bis-o-aminophenol compound having the structure represented by formula (4) and the dicarboxylic acid compound having an alicyclic structure in a main chain thereof, and the dicarboxylic acid compound having the structure represented by formula (6) and the bis-o-aminophenol compound having an alicyclic structure in a main chain thereof.

In their syntheses, a bis o-aminophenol compound and dicarboxylic acid other than the above-mentioned bis o-aminophenol compounds and dicarboxylic acid compounds may be mixed for copolymerization.

A method for producing the polybenzoxazole resin precursor will be described further in detail.

For example, a polybenzoxazole resin precursor having an adamantane structure can be obtained by the reaction of the bisaminophenol compound having an adamantane structure with the dicarboxylic acid compound having an adamantane structure. As an example of this reaction method, for example, there may be mentioned the acid chloride method. Specifically, in the presence of a catalyst such as N,N'-dimethylformamide, the dicarboxylic acid and an excessive amount of thionyl chloride are reacted at room temperature to about 130° C. After evaporating excess thionyl chloride by heating under reduced pressure, a residue is recrystallized with a solvent such as hexane to obtain dicarboxylic acid chloride.

Next, the dicarboxylic acid chloride thus obtained and the bisaminophenol compound are dissolved in a polar solvent such as N-methyl-2-pyrrolidone and N,N'-dimethylacetamide, and reacted at −30° C. to about room temperature, or at room temperature to about 80° C. or less, in the presence of an acid acceptor such as pyridine, thus obtaining a polybenzoxazole resin precursor having an adamantane structure. A number of repeating units of the precursor is not specifically limited but preferably from 2 to 1,000, and more preferably from 5 to 100. If the number of repeating units is in the range, especially solubility and workability are excellent.

Instead of the acid chloride method, the active ester method may be used. In the active ester method, for example, benzotriazyl ester is prepared by reacting the dicarboxylic acid chloride and 1-hydroxybenzotriazole, and the ester compound is reacted with the bisaminophenol compound at room temperature or above as aforementioned.

Also, a terminal end of the resin precursor may be reacted with a monofunctional carboxylic acid compound or an o-aminophenol compound. Solubility in a solvent and heat resistance can be further improved thereby.

As the monofunctional carboxylic acid compound, for example, there may be listed benzoyl chloride, 4-adamantyl benzoic acid chloride and the like. As the o-aminophenol compound, for example, there may be listed 2-aminophenol, 4-adamantyl-2-aminophenol and the like.

In the present invention, as a method for dehydration and ring closure reaction of the compound having the structure represented by formula (1), for example, there may be listed a heating method, an irradiation method using an active energy ray such as a microwave, visible light ray, UV-ray and X-ray, and using active radiation such as an electron beam, and so on. Hereinafter, methods for closing rings of the polyimide resin precursor and polybenzoxazole resin precursor will be described.

In the present invention, a polyimide resin is obtained by dehydration and ring closure reaction of the above-mentioned polyimide resin precursor. For example, there are methods such as carrying out a reaction by heating in a temperature range of 150 to 300° C. for five minutes to 24 hours, irradiating with UV-ray and irradiating with an electron beam.

In the present invention, a polybenzoxazole resin is obtained by dehydration and ring closure reaction of the above-mentioned polybenzoxazole resin precursor. For example, there are methods such as carrying out a reaction by heating in a temperature range of 150 to 425° C. for five minutes to 24 hours, irradiating with UV-ray and irradiating with an electron beam.

In a method for preparing the polyphenylene ether, for example, the polyphenylene ether can be obtained by the reaction of a bisphenol compound with an aromatic compound having a difluoro group under basic conditions.

In a method for preparing the polyester, for example, the polyester can be obtained by the reaction of a bisphenol compound with a dicarboxylic acid compound by the acid chloride method or the active ester method.

As the bisphenol compound, for example, there may be listed a bisphenol compound having an adamantane structure and a fluorene structure such as 9,9-bis(4-hydroxy-phenyl)-2,7-diadamantyl-fluorene and 9,9-bis[(3-hydroxy-phenoxy)-phenyl]-2,7-diadamantyl fluorene; a bisphenol compound having an adamantane structure and a benzene structure such as 1,3-bis(3-hydroxy-phenoxy)-4,6-diadamantyl-benzene; a bisphenol compound having an adamantane structure and a naphthalene structure; a bisphenol compound having an adamantane structure and an anthracene structure; a bisphenol compound having an adamantane structure and a biphenyl structure such as 2,2'-dihydroxy-5,5'-diadamantyl-biphenyl and 2,2'-bis(3-hydroxy-phenoxy)-5,5'-diadamantyl-biphenyl; and the like. The adamantane structure may be selected from the above-mentioned structures having an adamantane structure as a minimum unit. A binding position of the adamantane structure may be optionally selected from the range specified by formula (1).

The dicarboxylic acid compound may be selected from the dicarboxylic acids used for the polybenzoxazole resin precursor.

As the aromatic compound having a difluoro group, for example, there may be listed a difluoro compound having an adamantane structure and a fluorene structure such as 9,9-bis(4-fluoro-phenyl)-2,7-diadamantyl-fluorene and 9,9-bis[(3-fluoro-phenoxy)-phenyl]-2,7-diadamantyl fluorene; a difluoro compound having an adamantane structure and a benzene structure such as 1,3-bis(3-fluoro-phenoxy)-4,6-diadamantyl-benzene; a difluoro compound having an adamantane structure and a naphthalene structure; a difluoro compound having an adamantane structure and an anthracene structure; a difluoro compound having an adamantane structure and biphenyl structure such as 2,2'-difluoro-5,5'-diadamantyl-biphenyl and 2,2'-bis(3-fluoro-phenoxy)-5,5'-diadamantyl-biphenyl; and the like. The adamantane structure may be selected from the above-mentioned structures having an adamantane structure as a minimum unit. A binding position of the adamantane structure may be optionally selected from the range specified by formula (1).

The compound having the structure represented by formula (1) may have a group capable of causing a crosslinking reaction with the compound or a crosslinking agent to be hereinafter described in a side chain, chain end or main chain thereof. Thus, solubility in a solvent and heat resistance can be improved further. Especially, it is preferable that the compound having the structure represented by formula (1) has a group capable of causing a crosslinking reaction with a crosslinking agent to be described below since in this case a crosslinking reaction occurs between the compound and the crosslinking agent, so that a crosslinking density of a resin film can be increased and heat resistance of the same can be improved further.

As the group capable of causing a crosslinking reaction, for example, there may be listed a functional group having an acetylene bond (a carbon-carbon triple bond), a biphenylene group, a cyanate group, a maleimide group, a nadimide group, a functional group having a vinyl bond (a carbon-carbon double bond), a cyclopentadienyl group and the like. The group capable of causing a crosslinking reaction is preferred to have a polymerizable unsaturated bond in terms of high reactivity and increased heat resistance. Also, a group comprising carbon and hydrogen and not comprising a heteroatom such as a nitrogen atom and oxygen atom is preferable since dielectric constant can be kept low. The group capable of causing a crosslinking reaction is especially preferred to have an acetylene bond in terms of high reactivity and increased heat resistance. As an embodiment in which a crosslinkable group is introduced into the compound having the structure represented by formula (1), a crosslinkable group may be contained in a monomer that will introduce the structure represented by formula (1), or a crosslinkable group may be contained in a different monomer to be copolymerized with the monomer that will introduce the structure represented by formula (1).

The different monomer containing a crosslinkable group may be a monomer comprising a functional group having an acetylene bond, for example. As the monomer comprising a functional group having an acetylene bond, there may be listed the following monomers. As a dicarboxylic acid compound having an acetylene bond, there may be listed 5-phenylethynyl isophthalic acid, 5-(4-phenylethynyl-phenoxy)-isophthalic acid, 5-ethynyl isophthalic acid, 5-(4-ethynyl-phenoxy)-isophthalic acid, 5-adamantylethynyl-isophthalic acid, 5-phenylethynyl-adamantane-1,3-dicarboxylic acid and the like. As a bisaminophenol compound having an acetylene bond, there may be listed 2,7-bisphenylethynyl-9,9-bis(4-hydroxy-3-amino-phenyl)-fluorene, 2,7-diethynyl-9,9-bis(4-hydroxy-3-amino-phenyl)-fluorene, 2,7-bisphenylethynyl-9,9-bis[4-(3-hydroxy-4-amino-phenoxy)-phenyl]-fluorene, 2,7-diethynyl-9,9-bis[4-(3-hydroxy-4-amino-phenoxy)-phenyl]-fluorene and the like.

While there is no particular limitation to a molecular weight of the compound having the structure represented by formula (1), a number average molecular weight (Mn) of the compound is preferably from 3,000 to 50,000, more preferably from 5,000 to 30,000. When the number average molecular weight (Mn) is the lower limit of the range or more, a resin film with higher heat resistance (high thermal decomposability) can be stably obtained. When the number average molecular weight (Mn) is the upper limit of the range or less, a material with more excellent solubility in a solvent can be stably obtained. Herein, the number average molecular weight (Mn) of the present invention is a polystyrene equivalent molecular weight measured by the gel permeation chromatography (GPC).

In the resin composition of the present invention, the compound having the structure represented by formula (1) may be used in combination of two or more. Desired high heat resistance, a desired low dielectric constant, a desired high elastic modulus and a desired low linear expansion coefficient can be easily obtained by appropriately mixing two or more compounds with advantageous properties, such as a combination of a compound having the group capable of causing a crosslinking reaction with a compound having more alicyclic structures, as the compounds having the structure represented by formula (1).

Next, a crosslinking agent will be described.

A crosslinking agent of the present invention contains in a molecule two or more groups capable of causing a crosslinking reaction with the crosslinking agent and/or between the compound having the structure represented by formula (1) and the crosslinking agent (hereinafter may be simply referred to as a crosslinkable group or crosslinkable groups). As a method for causing a crosslinking reaction, there may be listed a heating method, an irradiation method using an active energy ray such as a microwave, visible light ray, UV-ray and X-ray, and using active radiation such as an electron beam, a method using a metal catalyst, radical initiator, acid, base or so on; etc. Such methods may be used in combination. Among them, a heating method is preferable since it requires no additives to promote a crosslinking reaction, addition of unwanted components can be inhibited, and side reactions are relatively unlikely to occur.

The crosslinking agent of the present invention contains preferably two to ten crosslinkable groups in a molecule, and more preferably two to four crosslinkable groups. When a number of the crosslinkable groups is the lower limit of the range or more, crosslinking density can be improved and a resin film with high heat resistance can be easily obtained. When the number of the crosslinkable groups is the upper limit of the range or less, an existing ratio of unreacted crosslinkable groups is small. Either of the cases is thus preferable.

As the crosslinkable group, for example, there may be listed a functional group having an acetylene bond (a carbon-carbon triple bond), a functional group having a vinyl bond (a carbon-carbon double bond), a maleimide group, a nadimide group, a biphenylene group, a cyanate group, a cyclopentadienyl group and the like. The crosslinkable group is preferably a functional group having a polymerizable unsaturated bond such as an acetylene bond (a carbon-carbon triple bond) and a vinyl bond (a carbon-carbon double bond) in terms of high reactivity and increased heat resistance. A group comprising carbon and hydrogen and not comprising a heteroatom such as a nitrogen atom and oxygen atom is preferable since dielectric constant can be kept low. A functional group having an acetylene bond is especially preferable in terms of high reactivity and increased heat resistance. Specifically, as the functional group having an acetylene bond, there may be listed an ethynyl group; an aromatic substituted ethynyl group such as a phenylethynyl group, a naphthylethynyl group, an anthrylethynyl group, a 3-phenyl-2-propynyl group, a 4-phenyl-3-butynyl group, a 6-phenyl-5-hexynyl group and a 8-phenyl-7-octynyl group; a chain aliphatic substituted ethynyl group such as a 1-propynyl group, a 1-butynyl group, a 2-butynyl group, a 1-hexynyl group, a 2-hexynyl group, a 3-hexynyl group and a 4-hexynyl group; a cyclic aliphatic substituted ethynyl group such as a cyclohexylethynyl group, a bicyclo[2,2,1]heptylethynyl group, an adamantylethynyl group, a 3-cyclohexyl-2-propynyl group, a 4-cyclohexyl-3-butynyl group, a 6-cyclohexyl-5-hexynyl group and a 8-cyclohexyl-7-octynyl group; an alkynyloxy group such as a 2-propynyloxy group, a 2-butynyloxy group, a 3-butynyloxy group, a 2-hexynyloxy group, a 3-hexynyloxy group, a 4-hexynyloxy group, a 5-hexynyloxy group, a 2-heptynyloxy group, a 3-heptynyloxy group, a 4-heptynyloxy group, a 5-heptynyloxy group and a 6-heptynyloxy group; a substituted diinyl group such as a butadiinyl group, a phenylbutadiinyl group, a 1,3-pentadiinyl group, a 4-cyclohexyl-1,3-butadiinyl group and a 2,4-pentadiinyloxy group; and the like. A hydrogen atom of the group containing an acetylene bond may be substituted with a fluorine atom, a methyl group, a methoxy group, a trifluoromethyl group or the like. Among them, a crosslinkable group selected from an ethynyl group, a phenylethynyl group, a (4-methylphenyl)ethynyl group, a naphthylethynyl group, a phenylbutadiinyl group, a t-butylethynyl group, an adamantylethynyl group and 3,5-dimethyladamantylethynyl group is preferable. Especially, an ethynyl group is preferable. Plural crosslinkable groups in a molecule may be the same or different from each other.

As a specific example of such a crosslinking agent, there may be mentioned a crosslinking agent having a structure represented by the following formula (8) or the like.

[Formula 8]

$$A\text{-}(B)_p \tag{8}$$

In this formula, "A" is an organic group; "B" is a crosslinkable group of the crosslinking agent; and "p" is an integer of 2 or more, preferably an integer from 2 to 10.

As the organic group "A" in formula (8), there may be listed an aromatic group such as a binaphthalene group, a naphthalene group, a fluorene group, a phenyl group, a diphenylether group, a biphenyl group, a diphenylsulfone group, a diphenylpropane group and a diphenylhexafluoropropane group; a group having an (aliphatic) polycyclic framework structure such as an adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group and a 3,3',5,5',7,7'-hexaphenyl-1,1'-biadamantyl group; a structure comprising the aromatic groups and/or the polycyclic framework structures in combination of two or more; and the like. However, the organic group "A" in formula (8) may not be limited thereto. Moreover, as the organic group "A" in formula (8), the structure comprising the aromatic groups and/or the polycyclic framework structures in combination of two or more may further contain a linking group such as —O—, —NHCO—, —CONH—, —COO— and —OCO—. A hydrogen atom of the organic group may be substituted with a fluorine atom, a methyl group, a hydroxyl group, a methoxy group or a trifluoromethyl group.

It is especially preferable from the viewpoint of increased heat resistance that the crosslinking agent has a structure capable of forming a benzoxazole ring by intramolecular dehydration and ring closure reaction, in addition to a crosslinkable group capable of causing an intermolecular reaction.

It is also preferable that the crosslinking agent has a polycyclic framework structure since in this case the crosslinking agent itself contributes to the reduction in dielectric constant and provides a higher elastic modulus and lower linear expansion coefficient. In particular, it is preferable that the crosslinking agent has a biadamantane structure or an adamantane structure since excellent solubility in a solvent can be obtained. Having a biadamantane structure is particularly preferable since a low dielectric constant, a high elastic modulus and a low linear expansion coefficient can be obtained. An alkyl group such as a methyl group, an ethyl group, a propyl group and a butyl group, a fluoroalkyl group such as a fluoromethyl group, a fluoroethyl group, a fluoropropyl group and a fluorobutyl group, and the like may be bonded to a group having the biadamantane or adamantane structure. Solubility in a solvent and heat resistance can be improved by introducing an alkyl group into the biadamantane or adamantane structure.

In the present invention, in order to obtain a lower dielectric constant, a higher elastic modulus and a lower linear expansion coefficient with the use of the crosslinking agent, a high ratio of the polycyclic framework structure in the crosslinking agent is preferable. The polycyclic framework structure in the crosslinking agent is thus preferably from 20 to 95 wt %, more preferably 30 wt % or more, still more preferably 40 wt % or more. In the calculation of a content ratio of the polycyclic framework structure, even if the polycyclic framework structure has a substituent, hydrogen is used for the substituent. For example, in the case of containing an adamantane structure, a molecular weight of adamantane of, for instance, 136, diamantane of 188, triamantane of 240 or so on and a number thereof are used for calculation. In the case of containing a group having a plurality of the polycyclic framework structures, for example in the case of containing a biadamantane, two adamantanes are used for calculation (136×2). Similarly, three adamantanes are used for calculation in the case of containing a triadamantane (136×3). In the case that the crosslinking agent is a polymer having a repeating unit, a content ratio of the polycyclic framework in the crosslinking agent is obtained from a content ratio of the polycyclic framework contained in a structure of the repeating unit. For example, in the case of 7,7'-bis(3,5-bis(phenylethynyl)phenyl)-3,3',5,5'-tetramethyl-1,1'-biadamantane, a content ratio of the polycyclic framework structure in the crosslinking agent is obtained as follows, based on a total molecular weight of 879, a molecular weight of an adamantane with polycyclic framework structure of 136 and a number of adamantanes of 2:

136×2/879×100=31(wt %).

In the resin composition of the present invention, a ratio of the crosslinking agent is preferably from 3 to 900 parts by weight and more preferably from 5 to 400 parts by weight, with respect to the compound having the structure represented by formula (1) of 100 parts by weight.

A polymer obtained by reacting the crosslinking agents, in which the crosslinking agents are used solely or in combination of two or more kinds, may be used in the present invention. In the case of containing the polymer, there is an advantage that a uniform resin film can be easily obtained in the process of forming a film of the resin composition.

Since the resin composition of the present invention uses the compound having the structure represented by formula (1) and the crosslinking agent in combination, it is possible to cause a crosslinking reaction after forming a coating to increase a crosslinking density of a resin film. As described above, the crosslinking density can be further increased when the compound having the structure represented by formula (1) has a crosslinkable group that is reactive with the crosslinking agent.

When forming nanofoam from a resin composition of the present invention to obtain a resin film, if a crosslinking density of the resin film can be increased, the nanofoam can maintain a form thereof without causing aggregation of the nanofoam or the like. The resin composition of the present invention can further decrease a dielectric constant of a resin film by forming nanofoam from the resin composition of the present invention to obtain the resin film.

In addition to the above-mentioned components, the resin composition of the present invention may comprise additives such as a surfactant, a coupling agent as typified by silane series, a radical initiator which generates an oxygen radical or a sulfur radical by heating, and catalysts such as disulfides, if necessary.

Also, the resin composition may be used as a photosensitive resin composition by adding a naphthoquinonediazide compound or the like as a photosensitive agent. More particularly, for example, when introducing a hydroxyl group to the resin composition, or when having —NHCO— as "X" of formula (1) and a hydroxyl group as any of $R_1$ to $R_4$ that is in the ortho-position to the bond represented by "*" and a hydroxyl group as any of $R_5$ to $R_8$ that is in the ortho-position of "X", that is, in the case of a polybenzoxazole resin precursor, the resin composition can be used as a positive-working photosensitive resin composition by using with a naphthoquinonediazide compound as a photosensitive agent. When the resin composition comprises a group containing a photocrosslinkable group like a methacryloyl group, the resin composition can be used as a negative-working photosensitive resin composition by using a photo initiator.

The resin composition of the present invention can be obtained by compounding the components appropriately and mixing them.

In the case of producing a resin film and so on, the resin composition of the present invention is preferably used as a varnish to prepare a resin film and so on, by dissolving or dispersing the resin composition in an organic solvent capable of dissolving or dispersing the resin composition. As the organic solvent, for example, there may be listed N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, methyl ethyl ketone, methyl isobutyl ketone, cyclopentanone, cyclohexanone, tetrahydrofuran, toluene, xylene, mesitylene and the like. Other organic solvents capable of dissolving or dispersing the resin composition of the present invention may be also used. These organic solvents may be used solely or in combination of two or more.

An amount of the organic solvent may be an amount capable of dissolving or dispersing the resin composition completely and is not specifically limited. It may be appropriately varied for purposes. In general, a solvent content in a varnish is preferably from 70 to 99 wt %, or it may be about 70 to 95 wt %. For a dilute solution, it is used in an amount of about 96 to 99 wt %.

Hereinafter, a resin film will be described.

A resin film of the present invention is obtained by using the above-mentioned resin composition or a varnish comprising thereof. The resin film of the present invention is thus excellent in adhesion and dimensional stability.

The resin film, for example, may be used as an interlayer insulation film or a surface protection film for semiconductors, an interlayer insulation film of a multilayered circuit, a cover coat of flexible copper clad laminate, a solder resist film, a liquid crystal alignment layer, an etching protection film, an adhesive and so on. Among them, the resin film is suitably used as an interlayer insulation film, a surface protection film for semiconductors or an etching protection film.

By adding a naphthoquinonediazide compound or the like as a photosensitive agent, the resin composition can be also used as a photosensitive surface protection film.

In the case of using the resin film as an interlayer insulation film, the resin composition is dissolved in an organic solvent such as N-methyl-2-pyrrolidone to prepare a varnish, and the varnish is applied onto an appropriate substrate such as a silicon wafer or a ceramic substrate to form a coating layer. Methods for applying the varnish include spin-coating by means of a spinner, spraying by means of a spray coater, dipping, printing and roll coating. The coating layer is then subject to drying and heat treatment to remove solvent, thus providing an interlayer insulation film. In the case of a polyimide resin precursor or a polybenzoxazole resin precursor, after removal of solvent, the precursors is subject to a condensation reaction and a crosslinking reaction by conventional methods to prepare a polyimide resin or a polybenzoxazole resin, thus providing an interlayer insulation film composed of a resin composition comprising thereof. If a resin changed from the polyimide resin precursor or the polybenzoxazole resin precursor is soluble in an organic solvent, after the polyimide resin precursor or the polybenzoxazole resin precursor is preliminarily changed to a polyimide resin or polybenzoxazole resin, a varnish is prepared therefrom, and then an interlayer insulation film can be prepared by the same method. In this case, there is no need for a process to change the polyimide resin precursor or the polybenzoxazole resin precursor to a resin in a heating treatment of a coating layer, so that it is possible to reduce the time for the heating treatment or active radiation irradiation.

A thickness of the interlayer insulation film is not particularly limited but preferably from 0.01 to 20 μm, more preferably from 0.05 to 10 μm and most preferably from 0.1 to 0.7 μm. The interlayer insulation film is provided with excellent process compatibility when having a thickness in the range.

In the case of using the resin film as a protection film for semiconductors, as in the case of using the resin film as an interlayer insulation film, the resin composition is dissolved in an organic solvent such as propylene oxide, diacetone alcohol and N-methyl-2-pyrrolidone to prepare a varnish, and the varnish is applied onto an appropriate substrate such as a silicon wafer or a ceramic substrate. Methods for applying the varnish include spin-coating by means of a spinner, spraying by means of a spray coater, dipping, printing and roll coating. A coating of the varnish is then subject to drying and heat treatment to remove solvent, thus providing a protection film. In the case of a polyimide resin precursor or a polybenzoxazole resin precursor, after removal of solvent, the precursor is subject to a dehydration reaction to prepare a polyimide resin or a polybenzoxazole resin, thus providing a protection film composed of a resin composition comprising thereof.

A thickness of the protection film is not particularly limited but preferably from 0.05 to 70 μm, more preferably from 0.1 to 50 μm. The protection film is provided with excellent protection properties on semiconductor elements and excellent workability when having a thickness in the range.

Next, a semiconductor device will be described, based on a preferred embodiment.

FIG. 1 is a sectional view schematically showing an example of a semiconductor device of the present invention.

A semiconductor device 100 comprises a semiconductor substrate 1 provided with an element, a silicon nitride layer 2 provided on the semiconductor substrate 1 (on the upper side of FIG. 1), an interlayer insulation film 3 provided on the silicon nitride layer 2 and a copper wiring layer 4 covered with a barrier layer 6.

The Interlayer insulation film 3 is provided with a concave corresponding to a wiring pattern, and the copper wiring layer 4 is provided therein.

A treated and modified layer 5 is provided between the interlayer insulation film 3 and the copper wiring layer 4.

A Hard mask layer 7 is formed on the interlayer insulation film 3 (on a surface opposite to the silicon nitride layer 2).

In the embodiment of the present invention, the semiconductor device 100 with the interlayer insulation film 3 is described; however, the present invention is not limited thereto.

The semiconductor device of the present invention uses the above-mentioned interlayer insulation film; therefore, it is excellent in dimensional accuracy and provides sufficient insulation, thereby providing excellent connection reliability.

The above-mentioned interlayer insulation film is excellent in adhesion to a wiring layer; therefore, connection reliability of a semiconductor device can be further improved.

Also, the above-mentioned interlayer insulation film has excellent dielectric properties; therefore, signal loss of a semiconductor device can be reduced.

Further, the above-mentioned interlayer insulation film has excellent dielectric properties; therefore, wiring delay can be reduced.

EXAMPLES

The present invention will be hereinafter explained in detail by way of examples and comparative examples; however, the invention is not limited thereto. The following methods are used to identify obtained compounds.

1. Mass spectrometry analysis (MS): measurement was carried out by means of JMS-700 mass spectrometer (manufactured by: JEOL Ltd.) by the field desorption (FD) method.

2. Elemental analysis: carbon, hydrogen and nitrogen were each measured by means of model 2400 elemental analyzer (manufactured by: Perkin Elmer Co., Ltd.) and chlorine was measured by the flask combustion titration method.

Synthesis Example 1

Synthesis of 4,6-di(1-adamantyl)-1,3-bis(4-amino-3-hydroxyphenoxy)benzene

In a 300 mL recovery flask, 75.0 g of 1-bromoadamantane (349 mmol), 9.58 g of 1,3-dihydroxybenzene (87.0 mmol), 25 mL of toluene and a stirrer were charged and agitated at 130° C. for 24 hours under nitrogen flow. Solvent was removed therefrom under reduced pressure to obtain solid. The solid was purified by column chromatography, thus obtaining 23.0 g of 4,6-di(1-adamantyl)-1,3-dihydroxybenzene (60.8 mmol; yield: 69.9%).

Next, 22.0 g of the 4,6-(1-adamantyl)-1,3-dihydroxybenzene obtained above (58.1 mmol), 28.7 g of 2-benzyloxy-4-fluoronitrobenzene (116 mmol), 32.1 g of potassium carbonate (233 mmol), 180 mL of N,N-dimethylformamide and a stirrer were charged in a 300 mL recovery flask and agitated at 135° C. for 12 hours under nitrogen flow. Reaction solution was filtered and then added to 1 L of ion-exchange water. Solid precipitate was collected by filtration, washed with 1 L of ion-exchange water and then dried under reduced pressure, thus obtaining 40.5 g of 4,6-di(1-adamantyl)-1,3-bis(3-benzyloxy-4-nitrophenoxy)benzene (48.6 mmol; yield: 83.6%).

Next, 39.0 g of the 4,6-di(1-adamantyl)-1,3-bis(3-benzyloxy-4-nitrophenoxy)benzene obtained above (46.8 mmol), 1.49 g of 10% palladium-activated carbon (1.40 mmol), 273 mL of N,N-dimethylformamide and a stirrer were charged in a 300 mL recovery flask and agitated at room temperature for 24 hours under a hydrogen atmosphere. Reaction solution was filtered and then added to 1 L of ion-exchange water. Solid precipitate was collected by filtration, washed with 1 L of ion-exchange water and then dried under reduced pressure, thus obtaining 24.0 g of 4,6-di(1-adamantyl)-1,3-bis(4-amino-3-hydroxyphenoxy)benzene (40.5 mmol; yield: 86.5%).

Appearance and results of mass spectrometry analysis and elemental analysis are shown below. The data show that the obtained compound is a target product.

Appearance: blown solid
MS (FD) (m/z): 593 (M+)
Elemental analysis:
Theoretical figures (/%): C, 77.00; H, 7.48; N, 4.73; O, 10.80.
Actual measurement values (/%): C, 76.95; H, 7.50; N, 4.71; O, 10.81.

Synthesis Example 2

Synthesis of 4,6-di(3,5-dimethyl-1-adamantyl)-1,3-bis(4-amino-3-hydroxyphenoxy)benzene A synthesis was performed in the same condition as in Synthesis example 1 except that 84.8 g of 1-bromo-3,5-dimethyladamantane (349 mmol) was used in place of 75.0 g of 1-bromoadamantane (349 mmol).
Appearance and results of mass spectrometry analysis and elemental analysis are shown below. The data show that the obtained compound is a target product.
Appearance: blown solid
MS (FD) (m/z): 648 (M+)
Elemental analysis:
Theoretical figures (/%): C, 77.74; H, 8.08; N, 4.32; O, 9.86.
Actual measurement values (/%): C, 77.70; H, 8.03; N, 4.31; O, 9.88.

Synthesis Example 3

Synthesis of 4,6-di(1-(3,3'-biadamantyl))-1,3-bis(4-amino-3-hydroxyphenoxy)benzene A synthesis was performed in the same condition as in Synthesis example 1 except that 121.9 g of 3-bromo-1,1'-biadamantane (349 mmol) was used in place of 75.0 g of 1-bromoadamantane (349 mmol).
Results of mass spectrometry analysis and elemental analysis are shown below. The data show that the obtained compound is a target product.
MS (FD) (m/z): 861 (M+)
Elemental analysis:
Theoretical figures (%): C, 80.89; H, 8.43; N, 3.25; O, 7.43.
Actual measurement values (%): C, 80.83; H, 8.49; N, 3.32; O, 7.33.

Synthesis Example 4

Synthesis of 4,6-di(1-(5,5',7,7'-tetramethyl-3,3'-biadamantyl))-1,3-bis(4-amino-3-hydroxyphenoxy)benzene A synthesis was performed in the same condition as in Synthesis example 1 except that 141 g of 3-bromo-5,5',7,7'-tetramethyl-1,1'-biadamantane (349 mmol) was used in place of 75.0 g of 1-bromoadamantane (349 mmol).
Appearance and results of mass spectrometry analysis and elemental analysis are shown below. The data show that the obtained compound is a target product.
Appearance: blown solid
MS (FD) (m/z): 973 (M+)
Elemental analysis:
Theoretical figures (/%): C, 81.44; H, 9.11; N, 2.88; O, 6.57.
Actual measurement values (/%): C, 81.40; H, 9.10; N, 2.87; O, 6.56.

Synthesis Example 5

Synthesis of 9,9-bis(3-amino-4-hydroxyphenyl)-2,7-di(1-adamantyl)-fluorene

In a 3 L recovery flask, 300 g of 9,9-bis(4-hydroxyphenyl)-fluorene (856 mmol), 1 L of toluene and a stirrer were charged. Under nitrogen flow, 137 mL of 60% nitric acid aqueous solution (1.8 mol) was gradually added thereto with agitating at 5° C. or less. After the addition, the mixture was agitated at room temperature for one hour. Reaction solution was added to 1 L of ion-exchange water. Solid precipitate was collected by filtration, washed with 1 L of ion-exchange water and then dried under reduced pressure, thus obtaining 291.1 g of 9,9-bis(4-hydroxy-3-nitrophenyl)-fluorene (661.0 mmol; yield: 77.2%).
Next, 118.9 g of 9,9-bis(4-hydroxy-3-nitrophenyl)-fluorene (270 mmol), 238.1 g of 1-bromoadamantane (1.11 mol), 16.1 g of ferric chloride (100 mmol), 1,200 g of mesitylene and a stirrer were charged in a 3 L recovery flask and agitated at 120° C. for six hours under nitrogen flow. Solvent was removed therefrom under reduced pressure to obtain solid. The solid was purified by column chromatography, thus obtaining 112.7 g of 9,9-bis(4-hydroxy-3-nitrophenyl)-2,7-di(1-adamantyl)-fluorene (159 mmol; yield: 58.9%).
Next, 5 g of the 9,9-bis(4-hydroxy-3-nitrophenyl)-2,7-di(1-adamantyl)-fluorene obtained above (7.1 mmol), 0.26 g of 10% palladium activated carbon (0.25 mmol), 15 g of tetrahydrofuran and a stirrer were charged in a 100 mL recovery flask and agitated at room temperature for 24 hours under a hydrogen atmosphere. After reaction solution was filtered, solvent was removed from the reaction solution under reduced pressure to obtain solid. The solid was washed with 500 mL of hexane and dried under reduced pressure, thus obtaining 4.4 g of 9,9-bis(3-amino-4-hydroxyphenyl)-2,7-di(1-adamantyl)-fluorene (6.8 mmol; yield: 96.5%).
Appearance and results of mass spectrometry analysis and elemental analysis are shown below. The data show that the obtained compound is a target product.
Appearance: blown solid
MS (FD) (m/z): 649 (M+)
Elemental analysis:
Theoretical figures (/%): C, 83.30; H, 7.46; N, 4.32; O, 4.93.
Actual measurement values (/%): C, 83.36; H, 7.35; N, 4.36; O, 4.91.

Synthesis Example 6

Synthesis of 9,9-bis(3-amino-4-hydroxyphenyl)-2,7-di(3,5-dimethyl-1-adamantyl)-fluorene A synthesis was performed in the same condition as in Synthesis example 5 except that 263.9 g of 1-bromo-3,5-dimethyladamantane (1.11 mol) was used in place of 238.1 g of 1-bromoadamantane (1.11 mol).
Appearance and results of mass spectrometry analysis and elemental analysis are shown below. The data show that the obtained compound is a target product.
Appearance: blown solid
MS (FD) (m/z): 704 (M+)
Elemental analysis:
Theoretical figures (/%): C, 83.48; H, 8.01; N, 3.97; O, 4.54.
Actual measurement values (/%): C, 83.49; H, 8.00; N, 3.98; O, 4.52.

Synthesis Example 7

Synthesis of 9,9-bis(4-(4-amino-3-hydroxyphenoxy)-phenyl)-2,7-di(1-adamantyl)-fluorene In a 1 L recovery flask, 3.19 g of magnesium (131 mmol), g of 5-(1-adamantyl)-2-bromotoluene (131 mmol), 200 mL of tetrahydrofuran and a stirrer were charged and refluxed under a nitrogen atmosphere for two hours to prepare a Grignard reagent. Next, in another 1 L recovery flask, 38.2 g of 4-(1-adamantyl)-bromobenzene (131 mmol), 9.19 mg of bis(triphenylphosphine)palladium dichloride (13.1 mmol), 300 mL of tetrahydrofuran and a stirrer were charged. A tetrahydrofuran solution, which is the above-prepared Grignard reagent, was added thereto under nitrogen flow and the mixture was refluxed for 12 hours. Then, 60 mL of 10% hydrochloric acid aqueous solution was added thereto and the mixture was refluxed for 30 minutes. After an aqueous layer was separated and removed therefrom, the reaction solution was washed with 200 mL of saturated sodium hydrogencarbonate aqueous solution, followed by removal of solvent under reduced pressure. Solid thus obtained was refined by alumina column chromatography, thus obtaining 45.1 g of 4,4'-di(1-adamantyl)-2-methyl-1,1'-biphenyl (103.5 mmol; yield: 79.0%).

Next, 43.7 g of the 4,4'-di(1-adamantyl)-2-methyl-1,1'-biphenyl obtained above (100 mmol), 36.8 g of potassium dichromate (125 mmol) and 200 mL of water were charged in a 500 mL autoclave and heated at 250° C. for 48 hours. After cooling, precipitate was filtered and separated therefrom. The precipitate was washed three times with 200 mL of ion-exchange water, filtered and separated again, and agitated in sulfuric acid aqueous solution of pH 1 for two hours. Solid precipitate was collected by filtration, washed with 200 mL of ion-exchange water three times and then with 100 ml of methanol, followed by drying under reduced pressure, thus obtaining 42.2 g of 2,7-di(1-adamantyl)-fluorenone (94.1 mmol; yield: 94.1%).

Next, 66.4 g of the 2,7-di(1-adamantyl)-fluorenone thus obtained (148 mmol), 41.8 g of phenol (444 mmol), 203 mL of Eaton's reagent (7.7 wt % methanesulfonic acid solution of diphosphorus pentoxide) and a stirrer were charged in a 500 mL recovery flask and heated at 150° C. for 12 hours under a nitrogen atmosphere. After reaction solution reached room temperature, 30 mL of ion-exchange water was added slowly. An aqueous layer was separated and removed therefrom. Then, solvent was removed under reduced pressure. Solid thus obtained was refined by column chromatography, thus obtaining 74.3 g of 2,7-di(1-adamantyl)-fluorene-9,9-bisphenol (120.1 mmol; yield: 81.1%).

Next, a synthesis was performed in the same condition as in Synthesis example 1 except that 36.0 g of the 2,7-di(1-adamantyl)-fluorene-9,9-bisphenol obtained above (58.1 mmol) was used in place of 22.0 g of 4,6-(1-adamantyl)-1,3-dihydroxybenzene (58.1 mmol), thus obtaining 52.5 g of 9,9-bis(4-(3-benzyloxy-4-nitrophenoxy)-phenyl)-2,7-di(1-adamantyl)-fluorene (48.9 mmol; yield: 84.2%).

Next, a synthesis was performed in the same condition as in Synthesis example 1 except that 50.2 g of the 9,9-bis(4-(3-benzyloxy-4-nitrophenoxy)-phenyl)-2,7-di(1-adamantyl)-fluorene obtained above (46.8 mmol) was used in place of 39.0 g of 4,6-di(1-adamantyl)-1,3-bis(3-benzyloxy-4-nitrophenoxy)benzene mmol), thus obtaining 34.6 g of 9,9-bis(4-(4-amino-3-hydroxyphenoxy)-phenyl)-2,7-di(1-adamantyl)-fluorene (41.5 mmol; yield: 88.7%).

Appearance and results of mass spectrometry analysis and elemental analysis are shown below. The data show that the obtained compound is a target product.

Appearance: blown solid
MS (FD) (m/z): 1,041 (M$^+$)
Elemental analysis:
Theoretical figures (/%): C, 84.20; H, 6.97; N, 2.69; O, 6.15.
Actual measurement values (/%): C, 84.17; H, 6.95; N, 2.70; O, 6.13.

Synthesis Example 8

Synthesis of 2,2'-dihydroxy-3,3'-diamino-5,5'-bis(1-(3,3'-biadamantyl))-biphenyl A synthesis was performed in the same condition as in Synthesis example 1 except that 1362.5 g of 3-bromo-1,1'-biadamantane (3.9 mol), 162.0 g of 2,2'-dihydroxy-biphenyl mmol) and 250 mL of toluene were used respectively in place of 75.0 g of 1-bromoadamantane (349 mmol), 9.58 g of 1,3-dihydroxybenzene (87.0 mmol) and 25 mL of toluene, thus obtaining 428.1 g of 2,2'-dihydroxy-5,5'-bis(1-(3,3'-biadamantyl))-biphenyl (592.0 mmol; yield: 68.0%).

Next, 200 mL of 20% nitric acid aqueous solution (640 mmol) was charged in a 500 mL recovery flask, and 216.9 g of 2,2'-dihydroxy-5,5'-bis(1-(3,3'-biadamantyl))-biphenyl (300 mmol) was gradually added thereto with agitating hard. After the addition, the mixture was agitated for one hour at room temperature. Reaction solution was charged in 500 mL of ion-exchange water. Solid precipitate was collected by filtration, washed with 1 L of ion-exchange water and then with 1 L of ethanol, followed by drying under reduced pressure, thus obtaining 207.3 g of 2,2'-dihydroxy-3,3'-dinitro-5,5'-bis(1-(3,3'-biadamantyl))-biphenyl (255 mmol; yield: 85.0%).

Next, a synthesis was performed in the same condition as in Synthesis example 1 except that 38.1 g of 2,2'-dihydroxy-3,3'-dinitro-5,5'-bis(1-(3,3'-biadamantyl))-biphenyl (46.8 mmol) was used in place of 39.0 g of 4,6-di(1-adamantyl)-1,3-bis(3-benzyloxy-4-nitrophenoxy)benzene (46.8 mmol), thus obtaining 32.4 g of 2,2'-dihydroxy-3,3'-diamino-5,5'-bis(1-(3,3'-biadamantyl))-biphenyl (43.1 mmol; yield: 92.0%).

Appearance and results of mass spectrometry analysis and elemental analysis are shown below. The data show that the obtained compound is a target product.

Appearance: blown solid
MS (FD) (m/z): 753 (M$^+$)
Elemental analysis:
Theoretical figures (/%): C, 82.93; H, 9.10; N, 3.72; O, 4.25.
Actual measurement values (/%): C, 82.92; H, 9.15; N, 3.66; O, 4.27.

Synthesis Example 9

Synthesis of 2,2'-dihydroxy-3,3'-diamino-5,5'-bis(3,5-dimethyl-1-adamantyl)-biphenyl A synthesis was performed in the same condition as in Synthesis example 8 except that 948.4 g of 1-bromo-3,5-dimethyladamantane (3.9 mol) was used in place of 1,362.5 g of 3-bromo-1,1'-biadamantane (3.9 mol).

Appearance and results of mass spectrometry analysis and elemental analysis are shown below. The data show that the obtained compound is a target product.

Appearance: blown solid
MS (FD) (m/z): 540 (M⁺)
Elemental analysis:
Theoretical figures (/%): C, 79.96; H, 8.95; N, 5.18; O, 5.92.
Actual measurement values (/%): C, 79.98; H, 8.94; N, 5.17; O, 5.93.

Synthesis Example 10

Synthesis of 2,2'-dihydroxy-3,3'-diamino-5,5'-bis(1-(5,5',7,7'-tetramethyl-3,3'-biadamantyl))biphenyl A synthesis was performed in the same condition as in Synthesis example 8 except that 1,581.3 g of 3-bromo-5,5'-7,7'-tetramethyl-1,1'-biadamantane (3.9 mol) was used in place of 1,362.5 g of 3-bromo-1,1'-biadamantane (3.9 mol).
Appearance and results of mass spectrometry analysis and elemental analysis are shown below. The data show that the obtained compound is a target product.
Appearance: blown solid
MS (FD) (m/z): 865 (M⁺)
Elemental analysis:
Theoretical figures (/%): C, 83.28; H, 9.78; N, 3.24; O, 3.70.
Actual measurement values (/%): C, 83.26; H, 9.78; N, 3.25; O, 3.71.

Synthesis Example 11

Synthesis of 2,2'-bis(4-amino-3-hydroxyphenoxy)-5,5'-bis(1-(3,3'-biadamantyl))-biphenyl A synthesis was performed in the same condition as in Synthesis example 1 except that 42.0 g of 2,2'-dihydroxy-5,5'-bis(1-(3,3'-biadamantyl))-biphenyl (58.1 mmol) was used in place of 22.0 g of 4,6-(1-adamantyl)-1,3-dihydroxybenzene mmol), thus obtaining 57.9 g of 2,2'-bis(4-(3-benzyloxy-4-nitrophenoxy)-5,5'-bis(1-(3,3'-biadamantyl))-biphenyl (49.2 mmol; yield: 84.8%).
Next, a synthesis was performed in the same condition as in Synthesis example 1 except that 55.1 g of 2,2'-bis(3-benzyloxy-4-nitrophenoxy)-5,5'-bis(1-(3,3'-biadamantyl))-biphenyl (46.8 mmol) was used in place of 39.0 g of 4,6-di(1-adamantyl)-1,3-bis(3-benzyloxy-4-nitrophenoxy)benzene (46.8 mmol), thus obtaining 39.0 g of 2,2'-bis(4-amino-3-hydroxyphenoxy)-5,5'-bis(1-(3,3'-biadamantyl))-biphenyl (41.6 mmol; yield: 88.8%).
Appearance and results of mass spectrometry analysis and elemental analysis are shown below. The data show that the obtained compound is a target product.
Appearance: blown solid
MS (FD) (m/z): 937 (M⁺)
Elemental analysis:
Theoretical figures (/%): C, 82.01; H, 8.17; N, 2.99; O, 6.83.
Actual measurement values (/%): C, 82.00; H, 8.12; N, 3.02; O, 6.86.

Synthesis Example 12

Synthesis of 2,2'-bis(4-amino-3-hydroxyphenoxy)-5,5'-bis(3,5-dimethyl-1-adamantyl)-biphenyl A synthesis was performed in the same condition as in Synthesis example 11 except that 29.6 g of 2,2'-dihydroxy-5,5'-bis(3,5-dimethyl-1-adamantyl)-biphenyl (58.1 mmol), which was obtained by using 948.4 g of 1-bromo-3,5-dimethyladamantane (3.9 mol) in place of 1,362.5 g of 3-bromo-1,1'-biadamantane (3.9 mol) in Synthesis example 8, was used in place of 42.0 g of 2,2'-dihydroxy-5,5'-bis(1-(3,3'-biadamantyl))-biphenyl (58.1 mmol) in Synthesis example 11.
Appearance and results of mass spectrometry analysis and elemental analysis are shown below. The data show that the obtained compound is a target product.
Appearance: blown solid
MS (FD) (m/z): 724 (M⁺)
Elemental analysis:
Theoretical figures (/%): C, 79.52; H, 7.79; N, 3.86; O, 8.83.
Actual measurement values (/%): C, 79.50; H, 7.80; N, 3.84; O, 8.81.

Synthesis Example 13

Synthesis of 9,9-bis(3-(3,5-dimethyl-1-adamantyl)-5-amino-4-hydroxyphenyl)-fluorene A synthesis was performed in the same condition as in Synthesis example 5 except that 5 g of 9,9-bis(3-(3,5-dimethyl-1-adamantyl)-4-hydroxy-5-nitrophenyl)-fluorene (7.1 mmol) was used in place of 5 g of 9,9-bis(4-hydroxy-3-nitrophenyl)-2,7-di(1-adamantyl)-fluorene (7.1 mmol).
Appearance and results of mass spectrometry analysis and elemental analysis are shown below. The data show that the obtained compound is a target product.
Appearance: light yellow solid
MS (FD) (m/z): 704 (M⁺)
Elemental analysis:
Theoretical figures (/%): C, 83.48; H, 8.01; N, 3.97; O, 4.54.
Actual measurement values (/%): C, 83.51; H, 8.06; N, 3.97; O, 4.49.

Synthesis Example 14

Synthesis of 2,7-di(3,5-dimethyl-1-adamantyl)-9,9-bis(3-(3,5-dimethyl-1-adamantyl)-5-amino-4-hydroxyphenyl)-fluorene A synthesis was performed in the same condition as in Synthesis example 5 except that 206.5 g of 9,9-bis(3-(3,5-dimethyl-1-adamantyl)-4-hydroxy-5-nitrophenyl)-fluorene (270 mmol) was used in place of 118.9 g of 9,9-bis(4-hydroxy-3-nitrophenyl)fluorene (270 mmol), and 269.9 g of 1-bromo-3,5-dimethyladamantane (1.11 mol) was used in place of 238.1 g of 1-bromoadamantane (1.11 mol).
Appearance and results of mass spectrometry analysis and elemental analysis are shown below. The data show that the obtained compound is a target product.
Appearance: light yellow solid
MS (FD) (m/z): 1,029 (M⁺)
Elemental analysis:
Theoretical figures (/%): C, 85.16; H, 9.01; N, 2.72; O, 3.11.
Actual measurement values (/%): C, 85.26; H, 9.06; N, 2.53; O, 3.15.

Synthesis Example 15

Synthesis of 3,3'-bis(3-(3,5-dimethyl-1-adamantyl)-5-amino-4-hydroxyphenyl)-5,5',7,7'-tetramethyl-1,1'-biadamantane In a 5 L recovery flask, 48.4 g of 3,3'-dibromo-5,5',7,7'-tetramethyl-1,1'-biadamantane (100 mmol), 688 g of phenol (7.3 mol) and a stirrer were charged and agitated at 155° C. for 30 minutes under nitrogen flow. After cooling the mixture to room temperature, 4.3 L of ion-exchange water was added thereto and agitated at 80° C. for ten minutes. Solid precipitate was collected by filtration, then washed with 7 L of ion-exchange water and dried under reduced pressure, thus obtaining 50.6 g of 3,3'-bis(4-hydroxyphenyl)-5,5',7,7'-tetramethyl-1,1'-biadamantane (99.0 mmol; yield: 99.0%).

Next, 100 g of the 3,3'-bis(4-hydroxyphenyl)-5,5',7,7'-tetramethyl-1,1'-biadamantane obtained above (196 mmol), 375 g of 1-bromo-3,5-dimethyladamantane (1.53 mmol), 7 g of anhydrous iron trichloride (44 mmol), 200 mL of mesitylene and a stirrer were charged in a 1 L recovery flask and agitated at 120° C. for three hours. After removing solvent from the mixture under reduced pressure, solid thus obtained was purified by column chromatography, thus obtaining 32 g of 3,3'-bis(3-(3,5-dimethyl-1-adamantyl)-4-hydroxyphenyl)-5,5',7,7'-tetramethyl-1,1'-biadamantane (38.3 mmol; yield: 19.5%).

Next, 32 g of the 3,3'-bis(3-(3,5-dimethyl-1-adamantyl)-4-hydroxyphenyl)-5,5',7,7'-tetramethyl-1,1'-biadamantane obtained above (38.3 mmol), 200 mL of acetonitrile and a stirrer were charged in a 1 L recovery flask. Under nitrogen flow, 10 g of 60% nitric acid aqueous solution (95 mmol) was gradually added thereto with agitating at 5° C. or less. After the addition, the mixture was agitated at room temperature for one hour. Reaction solution was added to 1 L of ion-exchange water. Solid precipitate was collected by filtration, washed with 500 ml of methanol and then dried under reduced pressure, thus obtaining 33 g of 3,3'-bis(3-(3,5-dimethyl-1-adamantyl)-4-hydroxy-5-nitrophenyl)-5,5',7,7'-tetramethyl-1,1'-biadamantane (35.7 mmol; yield: 93.2%).

Next, 33 g of the 3,3'-bis(3-(3,5-dimethyl-1-adamantyl)-4-hydroxy-5-nitrophenyl)-5,5',7,7'-tetramethyl-1,1'-biadamantane obtained above (35.7 mmol), 5 g of 10% palladium activated carbon (5 mmol), 300 mL of tetrahydrofuran and a stirrer were charged in a 1 L recovery flask and agitated at room temperature for 72 hours under a hydrogen atmosphere. After reaction solution was filtered, solvent was removed from the reaction solution under reduced pressure. Solid thus obtained was washed with 2 L of ion-exchange water and dried under reduced pressure, thus obtaining 28 g of 3,3'-bis(3-(3,5-dimethyl-1-adamantyl)-5-amino-4-hydroxyphenyl)-5,5',7,7'-tetramethyl-1,1'-biadamantane (32.4 mmol; yield: 90.6%).

Appearance and results of mass spectrometry analysis and elemental analysis are shown below. The data show that the obtained compound is a target product.

Appearance: light yellow solid

MS (FD) (m/z): 865 (M+)

Elemental analysis:

Theoretical figures (/%): C, 83.28; H, 9.78; N, 3.24; O, 3.70.

Actual measurement values (/%): C, 83.10; H, 9.70; N, 3.32; O, 3.50.

Synthesis Example 16

Synthesis of 9,9-bis(3-amino-4-hydroxyphenyl)-2,7-bis(phenylethynyl)-fluorene

A synthesis was performed in the same condition as in Synthesis example 8 except that 147.4 g of 9,9-bis(4-hydroxyphenyl)-2,7-dibromo-fluorene (290.0 mmol) was used in place of 216.9 g of 2,2'-dihydroxy-5,5'-bis(1-(3,3'-biadamantyl))-biphenyl (300 mmol), thus obtaining 156 g of 9,9-bis-(4-hydroxy-3-nitrophenyl)-2,7-dibromo-fluorene (260.8 mmol; yield: 89.9%).

Next, 35.9 g of the 9,9-bis-(4-hydroxy-3-nitrophenyl)-2,7-dibromo-fluorene obtained above (60.0 mmol), 0.79 g of triphenylphosphine (3.0 mmol), 0.23 g of copper iodide (1.2 mmol), 13.4 g of phenylacetylene (132 mmol), 0.25 g of dichlorobis(triphenylphosphine)palladium (0.36 mmol), 72 mL of triethylamine, 38 mL of pyridine and a stirrer were charged in a 500 mL recovery flask and agitated at 105° C. for three hours. After reaction solution was filtered, solvent was removed from the reaction solution under reduced pressure. Solid thus obtained was washed with 500 mL of 2 mol/L hydrochloric acid aqueous solution and then with 500 mL of methanol, followed by drying under reduced pressure, thus obtaining 32.5 g of 9,9-bis(4-hydroxy-3-nitrophenyl)-2,7-bis(phenylethynyl)-fluorene (50.7 mmol; yield: 84.6%).

Next, 20 mL of concentrated hydrochloric acid, 30 mL of ethanol, 13.5 g of the 9,9-bis(4-hydroxy-3-nitrophenyl)-2,7-bis(phenylethynyl)-fluorene obtained above (21.0 mmol) and a stirrer were charged in a 200 mL recovery flask. With agitating at room temperature, tin (II) chloride dihydrate of 15 g dissolved in 20 mL of ethanol was gradually added thereto at room temperature. After the addition, the mixture was agitated at room temperature for 12 hours. Solid precipitate was collected by filtration, washed with 100 mL of ion-exchange water and then with 100 mL of methanol, followed by drying under reduced pressure, thus obtaining 10.8 g of 9,9-bis(3-amino-4-hydroxyphenyl)-2,7-bis(phenylethynyl)-fluorene (18.6 mmol; yield: 89%).

Appearance and results of mass spectrometry analysis and elemental analysis are shown below. The data show that the obtained compound is a target product.

Appearance: light yellow solid

MS (FD) (m/z): 580 (M+)

Elemental analysis:

Theoretical figures (/%): C, 84.80; H, 4.86; N, 4.82; O, 5.51.

Actual measurement values (/%): C, 84.75; H, 4.81; N, 4.85; O, 5.59.

Synthesis Example 17

Synthesis of 4,6-di(1-adamantyl)-1,3-bis(4-carboxyphenoxy)benzene dichloride

A synthesis was performed in the same condition as in Synthesis example 1 except that 17.9 g of methyl 4-fluorobenzoate (116 mmol) was used in place of 28.7 g of 2-benzyloxy-4-fluoronitrobenzene (116 mmol), thus obtaining 29.9 g of 4,6-di(1-adamantyl)-1,3-bis(4-carboxymethyl-phenoxy)benzene (48.6 mmol; yield: 86.1%).

Next, 1 L of n-butanol, 65.9 g of potassium hydroxide (85%) (1.0 mol), 61.5 g of the 4,6-di(1-adamantyl)-1,3-bis(4-carboxymethyl-phenoxy)benzene obtained above (0.10 mol) and a stirrer were charged in a 2 L recovery flask and heated to reflux for 30 minutes. Reaction solution was cooled and solid thus precipitated was collected by filtration. The solid was washed with 2 L of ethanol and dried under reduced pressure, thus obtaining 66.0 g of 4,6-di(1-adamantyl)-1,3-bis(4-carboxy-phenoxy)benzene dipotassium salt (0.095 mol; yield: 95.0%).

Next, 62.5 g of the 4,6-di(1-adamantyl)-1,3-bis(4-carboxy-phenoxy)benzene dipotassium salt obtained above (90 mmol), 200 mL of 1,2-dichloroethane and a stirrer were charged in a 2 L recovery flask. Then, 178.5 g of thionyl chloride mol) was gradually added thereto with agitating at 5° C. or less. After the addition, 1.5 mL of N,N-dimethylformamide and 1.5 g of hydroquinone were added and agitated at 45 to 50° C. for three hours. After reaction solution was filtered, solvent was removed from the reaction solution under reduced pressure. Solid thus obtained was washed with hexane and then recrystallized with diethyl ether, thus obtaining 38.9 g of 4,6-di(1-adamantyl)-1,3-bis(4-carboxy-phenoxy)benzene-dichloride (59.4 mmol; yield: 66.0%).

Appearance and results of mass spectrometry analysis and elemental analysis are shown below. The data show that the obtained compound is a target product.

Appearance: light yellow solid
MS (FD) (m/z): 656 (M$^+$)
Elemental analysis:
Theoretical figures (/%): C, 73.28; H, 6.15; Cl, 10.81; O, 9.76.
Actual measurement values (/%): C, 73.25; H, 6.21; Cl, 10.75; O, 9.79.

Synthesis Example 18

Synthesis of 4,6-di(3,5-dimethyl-1-adamantyl)-1,3-bis(4-carboxy-phenoxy)benzene dichloride A synthesis was performed in the same condition as in Synthesis example 1 except that 25.3 g of 4,6-di(3,5-dimethyl-1-adamantyl)-1,3-dihydroxybenzene (58.1 mmol) and 17.9 g of methyl 4-fluorobenzoate (116 mmol) were used respectively in place of 22.0 g of 4,6-di(1-adamantyl)-1,3-dihydroxybenzene (58.1 mmol) and 28.7 g of 2-benzyloxy-4-fluoronitrobenzene (116 mmol).

Appearance and results of mass spectrometry analysis and elemental analysis are shown below. The data show that the obtained compound is a target product.

Appearance: blown solid
MS (FD) (m/z): 711 (M$^+$)
Elemental analysis:
Theoretical figures (/%): C, 74.25; H, 6.80; Cl, 9.96; O, 8.99.
Actual measurement values (/%): C, 74.23; H, 6.81; Cl, 9.98; O, 8.96.

Synthesis Example 19

Synthesis of 4,6-di(1-(3,3'-biadamantyl))-1,3-bis(4-carboxy-phenoxy)benzene dichloride A synthesis was performed in the same condition as in Synthesis example 1 except that 37.6 g of 4,6-di(1-(3,3'-biadamantyl))-1,3-dihydroxybenzene (58.1 mmol) and 17.9 g of methyl 4-fluorobenzoate (116 mmol) were used respectively in place of 22.0 g of 4,6-di(1-adamantyl)-1,3-dihydroxybenzene (58.1 mmol) and 28.7 g of 2-benzyloxy-4-fluoronitrobenzene (116 mmol).

Appearance and results of mass spectrometry analysis and elemental analysis are shown below. The data show that the obtained compound is a target product.

Appearance: light yellow solid
MS (FD) (m/z): 924 (M$^+$)
Elemental analysis:
Theoretical figures (/%): C, 77.98; H, 7.42; Cl, 7.67; O, 6.93.
Actual measurement values (/%): C, 78.02; H, 7.46; Cl, 7.62; O, 6.90.

Synthesis Example 20

Synthesis of 4,6-di(1-(5,5',7,7'-tetramethyl-3,3'-biadamantyl))-1,3-bis(4-carboxy-phenoxy)benzene dichloride A synthesis was performed in the same condition as in Synthesis example 1 except that 44.1 g of 4,6-di(1-(5,5',7,7'-tetramethyl-3,3'-biadamantyl))-1,3-dihydroxybenzene (58.1 mmol) and 17.9 g of methyl 4-fluorobenzoate (116 mmol) were used respectively in place of 22.0 g of 4,6-di(1-adamantyl)-1,3-dihydroxybenzene (58.1 mmol) and 28.7 g of 2-benzyloxy-4-fluoronitrobenzene (116 mmol).

Appearance and results of mass spectrometry analysis and elemental analysis are shown below. The data show that the obtained compound is a target product.

Appearance: blown solid
MS (FD) (m/z): 1,036 (M$^+$)
Elemental analysis:
Theoretical figures (/%): C, 78.81; H, 8.17; Cl, 6.84; O, 6.18.
Actual measurement values (/%): C, 78.79; H, 8.20; Cl, 6.82; O, 6.19.

Synthesis Example 21

Synthesis of 2,7-di(1-adamantyl)-fluorene-9,9-bisbenzoic acid dichloride

In a 500 mL recovery flask, 44.9 g of 2,7-di(1-adamantyl)-fluorenone obtained in the same manner as in Synthesis example 7 (100 mmol), 36.6 g of benzoic acid (300 mmol), 203 mL of Eaton's reagent (7.7 wt % methanesulfonic acid solution of diphosphorus pentoxide) and a stirrer were charged and agitated at 150° C. for 12 hours under a nitrogen atmosphere. After reaction solution reached room temperature, mL of ion-exchange water was added slowly. An aqueous layer was separated and removed therefrom. Then, solvent was removed from the reaction solution under reduced pressure. Solid thus obtained was purified by column chromatography, thus obtaining 54.7 g of 2,7-di(1-adamantyl)-fluorene-9,9-bisbenzoic acid (81 mmol; yield: 81%).

Next, 54.7 g of the 2,7-di(1-adamantyl)-fluorene-9,9-bisbenzoic acid obtained above (81 mmol), 200 mL of 1,2-dichloroethane and a stirrer were charged in a 2 L recovery flask. Then, 178.5 g of thionyl chloride (1.5 mol) was gradually added thereto with agitating at 5° C. or less. After the addition, 1.5 mL of N,N-dimethylformamide and 1.5 g of hydroquinone were added and agitated at 45 to 50° C. for three hours. After reaction solution was filtered, solvent was removed from the reaction solution under reduced pressure. Solid thus obtained was washed with hexane and recrystallized with diethyl ether, thus obtaining 39.4 g of 2,7-di(1-adamantyl)-fluorene-9,9-bisbenzoic acid dichloride (55.4 mmol; yield: 68.4%).

Appearance and results of mass spectrometry analysis and elemental analysis are shown below. The data show that the obtained compound is a target product.

Appearance: light yellow solid
MS (FD) (m/z): 712 (M$^+$)
Elemental analysis:
Theoretical figures (/%): C, 79.31; H, 6.23; Cl, 9.96; O, 4.50.
Actual measurement values (/%): C, 79.34; H, 6.26; Cl, 9.87; O, 4.53.

Synthesis Example 22

Synthesis of 2,7-di(3,5-dimethyl-1-adamantyl)-fluorene-9,9-bisbenzoic acid dichloride A synthesis was performed in the same condition as in Synthesis example 21 except that 50.4 g of 2,7-di(3,5-dimethyl-1-adamantyl)-fluorenone (100 mmol) was used in place of 44.9 g of 2,7-di(1-adamantyl)-fluorenone (100 mmol).

Appearance and results of mass spectrometry analysis and elemental analysis are shown below. The data show that the obtained compound is a target product.
Appearance: blown solid
MS (FD) (m/z): 767 (M$^+$)
Elemental analysis:
Theoretical figures (/%): C, 79.77; H, 6.83; Cl, 9.23; O, 4.17.
Actual measurement values (/%): C, 79.75; H, 6.80; Cl, 9.21; O, 4.16.

Synthesis Example 23

Synthesis of 9,9-bis(4-(4-carboxy-phenoxy)-phenyl)-2,7-di(1-adamantyl)-fluorene dichloride A synthesis was performed in the same condition as in Synthesis example 1 except that 36.0 g of 2,7-di(1-adamantyl)-fluorene-9,9-bisphenol obtained in the same manner as in Synthesis example 7 (58.1 mmol) and 17.9 g of methyl 4-fluorobenzoate (116 mmol) were used respectively in place of 22.0 g of 4,6-di(1-adamantyl)-1,3-dihydroxybenzene (58.1 mmol) and 28.7 g of 2-benzyloxy-4-fluoronitrobenzene (116 mmol).

Appearance and results of mass spectrometry analysis and elemental analysis are shown below. The data show that the obtained compound is a target product.
Appearance: light yellow solid
MS (FD) (m/z): 896 (M$^+$)
Elemental analysis:
Theoretical figures (/%): C, 79.09; H, 5.85; Cl, 7.91; O, 7.14.
Actual measurement values (/%): C, 79.14; H, 5.89; Cl, 7.87; O, 7.10.

Synthesis Example 24

Synthesis of 9,9-bis(4-(4-carboxy-phenoxy)-phenyl)-2,7-di(3,5-dimethyl-1-adamantyl)-fluorene dichloride A synthesis was performed in the same condition as in Synthesis example 1 except that 39.2 g of 2,7-di(3,5-dimethyl-1-adamantyl)fluorene-9,9-bisphenol obtained in the same manner as in Synthesis example 7 (58.1 mmol) and 17.9 g of methyl 4-fluorobenzoate (116 mmol) were used respectively in place of 22.0 g of 4,6-di(1-adamantyl)-1,3-dihydroxybenzene (58.1 mmol) and 28.7 g of 2-benzyloxy-4-fluoronitrobenzene (116 mmol).

Appearance and results of mass spectrometry analysis and elemental analysis are shown below. The data show that the obtained compound is a target product.
Appearance: light yellow solid
MS (FD) (m/z): 952 (M$^+$)
Elemental analysis:
Theoretical figures (/%): C, 79.48; H, 6.35; Cl, 7.45; O, 6.72.
Actual measurement values (/%): C, 79.46; H, 6.32; Cl, 7.42; O, 6.73.

Synthesis Example 25

Synthesis of 2, 2'-bis ((4-carboxy-phenoxy)-phenyl)-5, 5'-bis (1-(3, 3'-biadamantyl))-biphenyl dichloride A synthesis was performed in the same condition as in Synthesis example 17 except that 42.0 g of 2, 2'-dihydroxy -5, 5'-bis (1-(3, 3'-biadamantyl))-biphenyl (58.1 mmol) obtained in the same manner as in Synthesis example 8, 17.9 g of methyl 4-fluorobenzoate (116 mmol) were used in place of 22.0 g of 4, 6-di (1-adamantyl)-1, 3-dihydroxybenzene (58.1 mmol), 28.7 g of 2-benzyloxy-4-fluoronitrobenzene (116 mmol) in Synthesis example 1.

Appearance and results of mass spectrometry analysis and elemental analysis are shown below. The data show that the obtained compound is a target product.
Appearance: light yellow solid
MS (FD) (m/z): 1,000 (M$^+$)
Elemental analysis:
Theoretical figures (/%): C, 79.26; H, 7.26; Cl, 7.09; O, 6.40.
Actual measurement values (/%): C, 79.23; H, 7.29; Cl, 7.12; O, 6.36.

Synthesis Example 26

Synthesis of 5-(1-adamantylethynyl)isophthalic acid dichloride

In accordance with the method disclosed in a document (Y. Okano, T. Masuda and T. Higashimura, "Journal of Polymer Science: Polymer Chemistry Edition", Vol. 23, 1985, pp. 2527-2537), 1-ethynyladamantane was synthesized from 1-bromoadamantane.

Next, 125 g of dimethyl 5-bromoisophthalate (458 mmol), 1.1 g of triphenylphosphine (4.19 mmol), 0.275 g of copper iodide (1.44 mmol), 64.26 g of 1-ethynyladamantane (401 mmol), 375 mL of dehydrated triethylamine, 200 mL of dehydrated pyridine, 0.3 g of dichlorobis (triphenylphosphine) palladium (0.427 mmol) and a stirrer were charged in a 1 L recovery flask and agitated at 100° C. for one hour. After reaction solution was filtered, solvent was removed from the reaction solution under reduced pressure. Solid thus obtained was washed with 1 L of ion-exchange water and then with 1 L of 2 mol/L hydrochloric acid aqueous solution, followed by drying under reduced pressure, thus obtaining 121.5 g of 1-(3,5-bis(methoxycarbonyl)phenyl)-2-(1-adamantyl) ethyne (344.9 mmol; yield: 86.0%).

Next, 3 L of n-butanol, 226 g of potassium hydroxide (85%) (2.72 mol), 120 g of the 1-(3,5-bis(methoxycarbonyl) phenyl)-2-(1-adamantyl)ethyne obtained above (341 mmol) and a stirrer were charged in a 5 L recovery flask and heated to reflux for 30 minutes. Reaction solution was cooled down and solid thus precipitated was collected by filtration. The solid was washed with 2 L of ethanol and dried under reduced pressure, thus obtaining 132.49 g of 5-(1-adamantylethynyl)isophthalic acid dipotassium salt (330.8 mmol; 97.0%).

Next, 7.6 g of the 5-(1-adamantylethynyl)isophthalic acid dipotassium salt obtained above (19 mmol) was dissolved in 20 mL of ion-exchange water and filtered to remove insoluble matter. Then, 5 mol/L hydrochloric acid was added to a resulting filtrate with agitating so as to have pH of 1. Solid precipitate was collected by filtration, then washed with 50 mL of ion-exchange water and dried under reduced pressure, thus obtaining 6.1 g of 5-(1-adamantylethynyl)isophthalic acid (18.9 mmol; yield: 99.5%).

Next, 96.1 g of the 5-(1-adamantylethynyl)isophthalic acid dipotassium salt obtained above (240 mmol), 400 mL of 1,2-dichloroethane and a stirrer were charged in a 2 L recovery flask. Then, 391 g of thionyl chloride (4.5 mol) was gradually added thereto with agitating at 5° C. or less. After the addition, 4 mL of N,N-dimethylformamide and 4 g of hydroquinone were added and agitated at 45 to 50° C. for three hours. After reaction solution was filtered, solvent was removed from the reaction solution under reduced pressure. Solid thus obtained was washed with hexane and recrystallized with diethyl ether, thus obtaining 16.5 g of 5-(1-adamantylethynyl)isophthalic acid dichloride (45.6 mmol; yield: 19%).

Appearance and results of mass spectrometry analysis and elemental analysis are shown below. The data show that the obtained compound is a target product.
Appearance: white powder
MS (FD) (m/z): 290 ($M^+$–2Cl)
Elemental analysis:
Theoretical figures (/%): C, 66.49; H, 5.02; Cl, 19.63; O, 8.86.
Actual measurement values (/%): C, 66.41; H, 5.08; Cl, 19.70; O, 8.81.

Synthesis Example 27

Synthesis of 4,6-di(1-adamantyl)-1,3-bis(4-aminophenoxy)benzene

A synthesis was performed in the same condition as in Synthesis example 1 except that 17.2 g of 4-fluoronitrobenzene (122 mmol) was used in place of 28.7 g of 2-benzyloxy-4-fluoronitrobenzene (116 mmol).

Appearance and results of mass spectrometry analysis and elemental analysis are shown below. The data show that the obtained compound is a target product.
Appearance: blown solid
MS (FD) (m/z): 561 ($M^+$)
Elemental analysis:
Theoretical figures (/%): C, 81.39; H, 7.91; N, 5.00; O, 5.71.
Actual measurement values (/%): C, 81.35; H, 7.88; N, 5.03; O, 5.74.

Synthesis Example 28

Synthesis of 2,7-di(1-adamantyl)-fluorene-9,9-bis(4-aniline)

A synthesis was performed in the same condition as in Synthesis example 7 except that 41.4 g of aniline (444 mmol) was used in place of 41.8 g of phenol (444 mmol) in Synthesis of 2,7-di(1-adamantyl)-fluorene-9,9-bisphenol of Synthesis example 7, thus obtaining 75.8 g of 2,7-di(1-adamantyl)-fluorene-9,9-bis(4-aniline) (122.8 mmol; yield: 83%).

Appearance and results of mass spectrometry analysis and elemental analysis are shown below. The data show that the obtained compound is a target product.
Appearance: blown solid
MS (FD) (m/z): 617 ($M^+$)
Elemental analysis:
Theoretical figures (/%): C, 87.62; H, 7.84; N, 4.54.
Actual measurement values (/%): C, 87.64; H, 7.87; N, 4.49.

Synthesis Example 29

Synthesis of 9,9-bis(3,4-dicarboxy-phenyl)-2,7-di(1-adamantyl)-fluorene-dianhydride A synthesis was performed in the same condition as in Synthesis example 7 except that 47.1 g of o-xylene (444 mmol) was used in place of 41.8 g of phenol (444 mmol) in Synthesis of 2,7-di(1-adamantyl)-fluorene-9,9-bisphenol of Synthesis example 7, thus obtaining 77.2 g of 9,9-bis(3,4-dimethyl-phenyl)-2,7-di(1-adamantyl)-fluorene (120 mmol; yield: 80.9%). Next, 77.2 g of the 9,9-bis(3,4-dimethyl-phenyl)-2,7-di(1-adamantyl)-fluorene obtained above (120 mmol), 89.0 g of potassium permanganate (563 mmol), 1 L of pyridine, 100 mL of water and a stirrer were charged in a 3 L recovery flask and heated to reflux at 100° C. After the beginning of reflux, 38.7 g of potassium permanganate (245 mmol) and 160 mL of water were added every 30 minutes, a total of four times. When five hours passed after the beginning of reflux, another 160 mL of water was added thereto. Then, the mixture was heated to reflux for another six hours. Reaction solution was subject to hot filtration, and then solvent was removed under reduced pressure to concentrate the reaction solution, followed by addition of 6 mol/L hydrochloric acid of 400 mL. Solid precipitate was dried under reduced pressure, thus obtaining g of 9,9-bis(3,4-dicarboxy-phenyl)-2,7-diadamantyl-fluorene (48 mmol; yield: 40%).

Next, 35.1 g of the 9,9-bis(3,4-dicarboxy-phenyl)-2,7-di(1-adamantyl)-fluorene obtained above (46 mmol), 34.5 g of acetic anhydride (276 mmol) and a stirrer were charged in a 500 mL recovery flask and heated to reflux. Reaction solution was cooled, and solid thus precipitated was washed with 75 mL of diethyl ether and dried under reduced pressure, thus obtaining 29.7 g of 9,9-bis(3,4-dicarboxy-phenyl)-2,7-di(1-adamantyl)-fluorene dianhydride (40.9 mol; yield: 89.0%).

Appearance and results of mass spectrometry analysis and elemental analysis are shown below. The data show that the obtained compound is a target product.
Appearance: light yellow solid
MS (FD) (m/z): 727 ($M^+$)
Elemental analysis:
Theoretical figures (/%): C, 80.97; H, 5.82; O, 13.21.
Actual measurement values (/%): C, 80.95; H, 5.88; O, 13.17.

Synthesis Example 30

Synthesis of 1,3-bis(3,4-dicarboxyphenoxy)-4,6-bis(1-(3,3'-biadamantyl))-benzene-dianhydride In a 500 mL recovery flask, 35.9 g of 4,6-di(1-(3,3'-biadamantyl))-1,3-dihydroxybenzene (55.5 mmol), 19.0 g of dimethyl 4-fluorophthalate (114.5 mmol), 150 mL of N,N-dimethylformamide, 19.1 g of potassium carbonate (138.1 mmol) and a stirrer were charged and agitated at 135° C. for 12 hours. Reaction solution was filtered and then charged in 1 L of ion-exchange water. Solid precipitate was washed with 2 L of methanol and dried under reduced pressure, thus obtaining 51.8 g of 1,3-bis(3,4-dicarboxydimethyl-phenoxy)-4,6-bis(1-(3,3'-biadamantyl))-benzene (50.2 mmol; yield: 90.5%).

Next, 500 mL of n-butanol, 33.0 g of potassium hydroxide (85%) (500 mmol), 51.6 g of the 1,3-bis(3,4-dicarboxydimethyl-phenoxy)-4,6-bis(1-(3,3'-biadamantyl))-benzene obtained above (50 mmol) and a stirrer were charged in a 2 L recovery flask and heated to reflux for 30 minutes. Reaction solution was cooled and solid thus precipitated was collected by filtration. The solid was mixed with 100 mL of ion-exchange water and dissolved. Then, 5 mol/L hydrochloric acid was added thereto with agitating so as to be pH 1. Solid thus precipitated was collected by filtration, washed with 100 mL of ion-exchange water and then with 200 mL of ethanol, followed by drying under reduced pressure, thus obtaining 45.5 g of 1,3-bis(3,4-dicarboxy-phenoxy)-4,6-bis(1-(3,3'-biadamantyl))-benzene (46.7 mmol; yield: 93.3%).

Next, 44.9 g of the 1,3-bis(3,4-dicarboxy-phenoxy)-4,6-bis(1-(3,3'-biadamantyl))-benzene obtained above (46 mmol), 34.5 g of acetic anhydride (276 mmol) and a stirrer were charged in a 500 mL recovery flask and heated to reflux. Reaction solution was cooled, and solid thus precipitated was washed with 75 mL of diethyl ether and dried under reduced pressure, thus obtaining 37.8 g of 1,3-bis(3,4-dicarboxy-phenoxy)-4,6-bis(1-(3,3'-biadamantyl))-benzene dianhydride (0.0409 mol; yield: 87.4%).

Appearance and results of mass spectrometry analysis and elemental analysis are shown below. The data show that the obtained compound is a target product.

Appearance: light yellow solid

MS (FD) (m/z): 938 (M+)

Elemental analysis:

Theoretical figures (/%): C, 79.29; H, 7.08; O, 13.63.

Actual measurement values (/%): C, 79.32; H, 7.05; O, 13.63.

Synthesis Example 31

Synthesis of 9,9-bis(3-(4-phenylethynyl benzoic acid amide)-4-hydroxyphenyl)-fluorene In a 1 L recovery flask, 37.8 g of 9,9-bis(3-amino-4-hydroxyphenyl)-fluorene (100 mmol), 200 g of dehydrated N-methyl-2-pyrrolidone and a stirrer were charged. Under nitrogen flow, 53.0 g of 4-phenylethynyl benzoic acid chloride (220 mmol) was gradually added thereto with agitating at −15° C. After the addition, the mixture was agitated at room temperature for five hours. Reaction solution was added to 4 L of ion-exchange water. Solid precipitate was collected by filtration, washed with 1 L of methanol and then dried under reduced pressure, thus obtaining 64.7 g of 9,9-bis(3-(4-phenylethynyl benzoic acid amide)-4-hydroxyphenyl)-fluorene mmol; yield: 82.0%).

Appearance and results of mass spectrometry analysis and elemental analysis are shown below. The data show that the obtained compound is a target product.

Appearance: light yellow solid

MS (FD) (m/z): 788 (M+)

Elemental analysis:

Theoretical figures (/%): C, 83.74; H, 4.60; N, 3.55; O, 8.11.

Actual measurement values (/%): C, 83.52; H, 4.72; N, 3.60; O, 8.16.

Synthesis Example 32

Synthesis of 9,9-bis(3-(4-phenylbutadiinyl benzoic acid amide)-4-hydroxyphenyl)-fluorene A synthesis was performed in the same condition as in Synthesis example 31 except that 58.2 g of 4-phenylbutadiinyl benzoic acid chloride (220 mmol) was used in place of 53.0 g of 4-phenylethynyl benzoic acid chloride (220 mmol). Appearance and results of mass spectrometry analysis and elemental analysis are shown below. The data show that the obtained compound is a target product.

Appearance: light yellow solid

MS (FD) (m/z): 836 (M+)

Elemental analysis:

Theoretical figures (/%): C, 84.67; H, 4.34; N, 3.35; O, 7.65.

Actual measurement values (/%): C, 84.55; H, 4.32; N, 3.42; O, 7.72.

Synthesis Example 33

Synthesis of 9,9-bis(3-(4-phenylethynyl benzoic acid amide)-4-hydroxyphenyl)-2,7-bis(phenylethynyl)-fluorene A synthesis was performed in the same condition as in Synthesis example 31 except that 58.1 g of 9,9-bis(3-amino-4-hydroxyphenyl)-2,7-bis(phenylethynyl)-fluorene (100 mmol) was used in place of 37.8 g of 9,9-bis(3-amino-4-hydroxyphenyl)-fluorene (100 mmol).

Appearance and results of mass spectrometry analysis and elemental analysis are shown below. The data show that the obtained compound is a target product.

Appearance: light yellow solid

MS (FD) (m/z): 998 (M+)

Elemental analysis:

Theoretical figures (/%): C, 86.21; H, 4.48; N, 2.83; O, 6.47.

Actual measurement values (/%): C, 86.52; H, 4.49; N, 2.62; O, 6.37.

Synthesis Example 34

Synthesis of 9,9-bis(3-(4-ethynyl benzoic acid amide)-4-hydroxyphenyl)-fluorene

A synthesis was performed in the same condition as in Synthesis example 31 except that 36.2 g of 4-ethynyl benzoic acid chloride (220 mmol) was used in place of 53.0 g of 4-phenylethynyl benzoic acid chloride (220 mmol).

Appearance and results of mass spectrometry analysis and elemental analysis are shown below. The data show that the obtained compound is a target product.

Appearance: yellow solid

MS (FD) (m/z): 636 (M+)

Elemental analysis:

Theoretical figures (/%): C, 81.12; H, 4.43; N, 4.40; O, 10.05.

Actual measurement values (/%): C, 81.09; H, 4.41; N, 4.39; O, 10.11.

Synthesis Example 35

Synthesis of 4,6-di(3,5-dimethyl-1-adamantyl)-1,3-bis(4-(4-phenylethynyl benzoic acid amide)-3-hydroxyphenoxy)benzene A synthesis was performed in the same condition as in Synthesis example 31 except that 64.9 g of the 4,6-di(1-adamantyl)-1,3-bis(4-amino-3-hydroxyphenoxy)benzene obtained mmol) obtained in Synthesis 2 was used in place of 37.8 g of 9,9-bis(3-amino-4-hydroxyphenyl)-fluorene (100 mmol).

Appearance and results of mass spectrometry analysis and elemental analysis are shown below. The data show that the obtained compound is a target product.

Appearance: blown solid
MS (FD) (m/z): 1,057 (M$^+$)
Elemental analysis:
Theoretical figures (/%): C, 81.79; H, 6.48; N, 2.65; O, 9.08.
Actual measurement values (/%): C, 81.77; H, 6.45; N, 2.69; O, 9.09.

Synthesis Example 36

Synthesis of 7,7'-bis(3,5-bis(phenylethynyl)phenyl)-3,3',5,5'-tetramethyl-1,1'-biadamantane In a 1 L recovery flask, 48.4 g of 7,7'-dibromo-3,3',5,5'-tetramethyl-1,1'-biadamantane (100 mmol), 1,180 g of 1,3-dibromobenzene (5.00 mol) and a stirrer were charged. Under nitrogen flow, 26.7 g of aluminum bromide (100 mmol) was gradually added thereto with agitating at room temperature. After the addition, the mixture was agitated at 50° C. for seven hours. Reaction solution was added to 2 L of 1 mol/L hydrochloric acid aqueous solution. After an aqueous layer was separated and removed therefrom, 1 L of acetone was added. Solid thus precipitated was collected by filtration and dried under reduced pressure, thus obtaining 71.5 g of 7,7'-bis(3,5-dibromophenyl)-3,3',5,5'-tetramethyl-1,1'-biadamantane (90.0 mmol; yield: 90.0%).

Appearance and results of mass spectrometry analysis and elemental analysis are shown below. The data show that the obtained compound is a target product.

Appearance: white solid
MS (FD) (m/z): 790 (M$^+$)
Elemental analysis:
Theoretical figures (/%): C, 54.43; H, 5.33; Br, 40.24.
Actual measurement values (%): C, 54.35; H, 5.49; Br, 40.16.

Next, 39.7 g of the 7,7'-bis(3,5-dibromophenyl)-3,3',5,5'-tetramethyl-1,1'-biadamantane obtained above (50.0 mmol), 40.9 g of ethynylbenzene (400 mmol), 3.5 g of dichlorobis(triphenylphosphine)palladium (5.0 mmol), 3.8 g of copper (I) iodide (20.0 mmol), 5.2 g of triphenylphosphine (20.0 mmol), 1 L of triethylamine and a stirrer were charged in a 3 L recovery flask. Under nitrogen flow, the mixture was agitated at 95° C. for six hours. Reaction solution was added to 1 L of acetone. Solid precipitate was washed with 1 L of 2 mol/L hydrochloric acid aqueous solution and then with 1 L of acetone, followed by drying under reduced pressure, thus obtaining 26.4 g of 7,7'-bis(3,5-bis(phenylethynyl)phenyl)-3,3',5,5'-tetramethyl-1,1'-biadamantane (30.0 mmol; yield: 60.0%).

Appearance and results of mass spectrometry analysis and elemental analysis are shown below. The data show that the obtained compound is a target product.

Appearance: white solid
MS (FD) (m/z): 878 (M$^+$)
Elemental analysis:
Theoretical figures (/%): C, 92.89; H, 7.11.
Actual measurement values (/%): C, 92.95; H, 7.05.

Synthesis Example 37

Synthesis of 7,7'-bis(3,5-diethynylphenyl)-3,3',5,5'-tetramethyl-1,1'-biadamantane A synthesis was performed in the same condition as in Synthesis example 36 except that 39.3 g of trimethylsilylacetylene (400 mmol) was used in place of 40.9 g of ethynylbenzene (400 mmol), thus obtaining 35.9 g of 7,7'-bis(3,5-bis(trimethylsilylethynyl)phenyl)-3,3',5,5'-tetramethyl-1,1'-biadamantane (41.6 mol; yield: 83.2%).

Next, 10 g of the 7,7'-bis(3,5-bis(trimethylsilylethynyl)phenyl)-3,3',5,5'-tetramethyl-1,1'-biadamantane obtained above (11.6 mmol), 0.35 g of potassium carbonate (2.5 mmol), 150 mL of tetrahydrofuran, 75 mL of methanol and a stirrer were charged in a 500 mL recovery flask. Under nitrogen flow, the mixture was agitated at room temperature for four hours. After reaction solution was filtered, solvent was removed from the reaction solution under reduced pressure. Solid thus obtained was washed with 150 mL of 2 mol/L hydrochloric acid aqueous solution and then with 500 mL of acetone, followed by drying under reduced pressure, thus obtaining 6.4 g of 7,7'-bis(3,5-diethynylphenyl)-3,3',5,5'-tetramethyl-1,1'-biadamantane (11.1 mmol; yield: 96%).

Appearance and results of mass spectrometry analysis and elemental analysis are shown below. The data show that the obtained compound is a target product.

Appearance: white solid
MS (FD) (m/z): 574 (M$^+$)
Elemental analysis:
Theoretical figures (/%): C, 91.93; H, 8.07.
Actual measurement values (/%): C, 91.89; H, 8.11.

Synthesis Example 38

Synthesis of 3,3'-diethynyl-5,5',7,7'-tetramethyl-1,1'-biadamantane

In a 1 L recovery flask, 50 g of 3,3'-dibromo-5,5',7,7'-tetramethyl-1,1'-biadamantane (103 mmol), 27 ml of bromoethene (388 mmol), 500 ml of dichloromethane and a stirrer were charged. Under nitrogen flow, 4.6 of aluminum (III) chloride (33 mmol) was gradually added thereto with agitating at −15° C. After the addition, the mixture was agitated at −15° C. for one hour. Then, 20 ml of ion-exchange water was added thereto at −15° C. Reaction solution was added to 200 ml of 2 mol/L hydrochloric acid aqueous solution. An aqueous layer was separated and removed therefrom, and solvent was removed under reduced pressure. Solid thus obtained was dried under reduced pressure, thus obtaining 63.4 g of 3,3'-bis(2,2'-dibromoethyl)-5,5',7,7'-tetramethyl-1,1'-biadamantane (90.9 mmol; yield: 88.2%).

Next, 63.4 g of the 3,3'-bis(2,2'-dibromoethyl)-5,5',7,7'-tetramethyl-1,1'-biadamantane obtained above (90.9 mmol), 200 ml of N,N-dimethylsulfoxide and a stirrer were charged in a 500 mL recovery flask. Under nitrogen flow, 28 g of potassium tert-butoxide (250 mmol) was added with agitating at room temperature. After the addition, the mixture was agitated at room temperature for 48 hours. Reaction solution was added to 400 mL of ion-exchange water. An aqueous layer was separated and removed therefrom, and solvent was removed under reduced pressure. Solid thus obtained was dried under reduced pressure, thus obtaining 31.5 g of 3,3'-diethynyl-5,5',7,7'-tetramethyl-1,1'-biadamantane (84.1 mmol; yield: 92.5%).

Appearance and results of mass spectrometry analysis and elemental analysis are shown below. The data show that the obtained compound is a target product.

Appearance: light yellow solid
MS (FD) (m/z): 374 (M$^+$)
Elemental analysis:
Theoretical figures (/%): C, 89.78; H, 10.22.
Actual measurement values (%): C, 89.84; H, 10.16.

Synthesis Example 39

Synthesis of 3,3',5,5'-tetraethynyl-1,1'-biadamantane

A synthesis was performed in the same condition as in Synthesis example 38 except that 30.5 g of 3,3',5,5'-tetrabromo-1,1'-biadamantane (52 mmol) was used in place of 50 g of 3,3'-dibromo-5,5'-tetramethyl-1,1'-biadamantane (103 mmol).

Appearance and results of mass spectrometry analysis and elemental analysis are shown below. The data show that the obtained compound is a target product.

Appearance: light yellow solid
MS (FD) (m/z): 366 (M$^+$)
Elemental analysis:
Theoretical figures (/%): C, 91.75; H, 8.25.
Actual measurement values (/%): C, 91.71; H, 8.29.

Synthesis Example 40

Synthesis of 7,7'-bis(3,5-diethynylphenyl)-3,3',5,5'-tetramethyl-1,1'-biadamantane polymer In a 1 L recovery flask, 18.0 g of 7,7'-bis(3,5-diethynylphenyl)-3,3',5,5'-tetramethyl-1,1'-biadamantane obtained in the same manner as in Synthesis example 37 (31.3 mmol), 340 g of m-dimethoxybenzene and a stirrer were charged and agitated at 180° C. for ten hours. Reaction solution was added to 1.5 L of methanol. Solid precipitate was collected by filtration and dried under reduced pressure, thus obtaining 15.2 g of 7,7'-bis(3,5-diethynylphenyl)-3,3',5,5'-tetramethyl-1,1'-biadamantane polymer (yield: 84.4%).

Synthesis Example 41

Synthesis of 3,3'-diethynyl-5,5',7,7'-tetramethyl-1,1'-biadamantane polymer

In a 1 L recovery flask, 5 g of 3,3'-diethynyl-5,5',7,7'-tetramethyl-1,1'-biadamantane obtained in the same manner as in Synthesis example 38, 45 g of 1,3-dimethoxybenzene, 0.1 g of dichlorobis (benzonitrile) palladium and a stirrer were charged and agitated at 190° C. for six hours under nitrogen flow. Reaction solution was added to 500 mL of methanol. Solid precipitate was collected by filtration and dried under reduced pressure, thus obtaining 4.2 g of 3,3'-diethynyl-5,5',7,7'-tetramethyl-1,1'-biadamantane polymer (yield: 84%).

Synthesis Example 42

Synthesis of 3,3',5,5'-tetraethynyl-1,1'-biadamantane polymer

A polymerization was performed in the same condition as in Synthesis example 41 except that 5 g of the 3,3',5,5'-tetraethynyl-1,1'-biadamantane obtained in Synthesis example 39 was used in place of 5 g of 3,3'-diethynyl-5,5',7,7'-tetramethyl-1,1'-biadamantane.

Example 1

Preparation of Benzoxazole Resin Precursor

In a 2 L four-neck flask provided with a thermometer, a Dimroth condenser and an agitator, 64.8 g of the 4,6-di(3,5-dimethyl-1-adamantyl)-1,3-bis(4-amino-3-hydroxyphenoxy)benzene obtained in Synthesis example 2 (0.10 mol) was dissolved in 800 g of dried N-methyl-2-pyrrolidone under nitrogen flow, followed by the addition of 17.4 g of pyridine (0.22 mol). The mixture was cooled to −15° C., and 42.8 g of 5,5',7,7'-tetramethyl-1,1'-biadamantane-3,3'-dicarboxylic acid chloride (0.095 mol) was gradually added. After the addition, the mixture was agitated at −15° C. for one hour, then returned to room temperature and agitated for five hours at room temperature. And then, 2.10 g of benzoic acid chloride (0.015 mol) was added with the inner temperature of the flask kept at 5° C. or below in an ice bath. Reaction solution was added to 4 L of distilled water in small droplets, followed by collecting and drying precipitate, thus obtaining a benzoxazole resin precursor.

A number average molecular weight (Mn) of the obtained benzoxazole resin precursor was 21,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 2

A resin film was obtained in the same condition as in the preparation of a varnish for coating and resin film in Example 1, except that 0.9 g of benzoxazole resin precursor was altered to 0.5 g, and 0.1 g of 9,9-bis(3-(4-phenylethynyl benzoic acid amide)-4-hydroxyphenyl)-fluorene was altered to 0.5 g.

Example 3

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.9 g of the 7,7'-bis(3,5-bis(phenylethynyl)phenyl)-3,3',5,5'-tetramethyl-1,1'-biadamantane obtained in Synthesis example 36.

Example 4

A resin film was obtained in the same condition as in the preparation of a varnish for coating and resin film in Example 3, except that 0.9 g of benzoxazole resin precursor was altered to 0.5 g, and 0.9 g of 7,7'-bis(3,5-bis(phenylethynyl)phenyl)-3,3',5,5'-tetramethyl-1,1'-biadamantane was altered to 0.1 g.

Example 5

Preparation of Benzoxazole Resin Precursor

In a 2 L four-neck flask provided with a thermometer, a Dimroth condenser and an agitator, 64.8 g of the 4,6-di(3,5-dimethyl-1-adamantyl)-1,3-bis(4-amino-3-hydroxyphenoxy)benzene obtained in Synthesis example 2 (0.10 mol) was dissolved in 800 g of dried N-methyl-2-pyrrolidone under nitrogen flow, followed by the addition of 17.4 g of pyridine (0.22 mol). The mixture was heated to 60° C., and 31.6 g of 5,5',7,7'-tetramethyl-1,1'-biadamantane-3,3'-dicarboxylic acid chloride (0.070 mol) was gradually added. After the addition, the mixture was agitated at 60° C. for three hours. Then, 7.57 g of 5-phenylethynyl-isophthalic acid chloride (0.025 mol) was gradually added with the inner temperature of the flask kept at 5° C. or below in an ice bath. And then, 2.10 g of benzoic acid chloride (0.015 mol) was added with the inner temperature of the flask kept at 5° C. or below. Reaction solution was added to 4 L of distilled water in small droplets, followed by collecting and drying precipitate, thus obtaining a benzoxazole resin precursor.

A number average molecular weight (Mn) of the obtained benzoxazole resin precursor was 16,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 6

A resin film was obtained in the same condition as in the preparation of a varnish for coating and resin film in Example 5, except that 0.9 g of benzoxazole resin precursor was altered to 0.5 g, and 0.1 g of 9,9-bis(3-(4-phenylethynyl benzoic acid amide)-4-hydroxyphenyl)-fluorene was altered to 0.5 g.

Example 7

A resin film was obtained in the same condition as in the preparation of a varnish for coating and resin film in Example 5, except that 0.1 g of 9,9-bis(3-(4-phenylethynyl benzoic acid amide)-4-hydroxyphenyl)-fluorene was altered to 0.9 g of the 7,7'-bis(3,5-bis(phenylethynyl)phenyl)-3,3',5,5'-tetramethyl-1,1'-biadamantane obtained in Synthesis example 36.

Example 8

A resin film was obtained in the same condition as in the preparation of a varnish for coating and resin film in Example 7, except that 0.9 g of benzoxazole resin precursor was altered to 0.5 g, and 0.9 g of 7,7'-bis(3,5-bis(phenylethynyl)phenyl)-3,3',5,5'-tetramethyl-1,1'-biadamantane was altered to 0.1 g.

Example 9

<Preparation of Benzoxazole Resin Precursor>

A reaction was performed in the same condition as in the preparation of a benzoxazole resin precursor in Example 1, except that 64.8 g of the 9,9-bis(3-amino-4-hydroxyphenyl)-2,7-di(1-adamantyl)-fluorene obtained in Synthesis example 5 (0.10 mol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 22,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 10

A resin film was obtained in the same condition as in the preparation of a varnish for coating and resin film in Example 9, except that 0.9 g of benzoxazole resin precursor was altered to 0.5 g, and 0.1 g of 9,9-bis(3-(4-phenylethynyl benzoic acid amide)-4-hydroxyphenyl)-fluorene was altered to 0.5 g.

Example 11

A resin film was obtained in the same condition as in the preparation of a varnish for coating and resin film in Example 9, except that 0.1 g of 9,9-bis(3-(4-phenylethynyl benzoic acid amide)-4-hydroxyphenyl)-fluorene was altered to 0.9 g of the 7,7'-bis(3,5-bis(phenylethynyl)phenyl)-3,3',5,5'-tetramethyl-1,1'-biadamantane obtained in Synthesis example 36.

Example 12

A resin film was obtained in the same condition as in the preparation of a varnish for coating and resin film in Example 11, except that 0.9 g of benzoxazole resin precursor was altered to 0.5 g, and 0.9 g of 7,7'-bis(3,5-bis(phenylethynyl)phenyl)-3,3',5,5'-tetramethyl-1,1'-biadamantane was altered to 0.1 g.

Example 13

Preparation of Benzoxazole Resin Precursor

A reaction was performed in the same condition as in the preparation of a benzoxazole resin precursor in Example 5 except that 64.8 g of 4,6-di(3,5-dimethyl-1-adamantyl)-1,3-bis(4-amino-3-hydroxyphenoxy)benzene (0.10 mol) was altered to 64.8 g of the 9,9-bis(3-amino-4-hydroxyphenyl)-2,7-di(1-adamantyl)-fluorene obtained in Synthesis example 5 (0.10 mol), thus obtaining a benzoxazole resin precursor. A number average molecular weight (Mn) of the obtained benzoxazole resin precursor was 16,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 14

A resin film was obtained in the same condition as in the preparation of a varnish for coating and resin film in Example 13, except that 0.9 g of benzoxazole resin precursor was altered to 0.5 g, and 0.1 g of 9,9-bis(3-(4-phenylethynyl benzoic acid amide)-4-hydroxyphenyl)-fluorene was altered to 0.5 g.

Example 15

A resin film was obtained in the same condition as in the preparation of a varnish for coating and resin film in Example 13, except that 0.1 g of 9,9-bis(3-(4-phenylethynyl benzoic acid amide)-4-hydroxyphenyl)-fluorene was altered to 0.9 g of the 7,7'-bis(3,5-bis(phenylethynyl)phenyl)-3,3',5,5'-tetramethyl-1,1'-biadamantane obtained in Synthesis example 36.

Example 16

A resin film was obtained in the same condition as in the preparation of a varnish for coating and resin film in Example 15, except that 0.9 g of benzoxazole resin precursor was altered to 0.5 g, and 0.9 g of 7,7'-bis(3,5-bis(phenylethynyl)phenyl)-3,3',5,5'-tetramethyl-1,1'-biadamantane was altered to 0.1 g.

Example 17

Preparation of Imide Resin Precursor

In a separable flask provided with an agitator, a nitrogen inlet pipe and a material inlet, 53.3 g of the 4,6-di(1-adamantyl)-1,3-bis(4-aminophenoxy)benzene (0.095 mol) obtained in Synthesis example 27 was dissolved in 800 g of dried N-methyl-2-pyrrolidone. Solution thus obtained was cooled to 10° C. under dry nitrogen, and 72.7 g of the 9,9-bis(3,4-dicarboxy-phenyl)-2,7-di(1-adamantyl)-fluorene-dianhydride obtained in Synthesis example 29 (0.1 mol) was added thereto. For five hours after the addition, the solution was returned to room temperature. Then, it was agitated for two hours at room temperature. And then, reaction solution was added to 4 L of distilled water in small droplets, followed by collecting and drying precipitate, thus obtaining an imide resin precursor.

A number average molecular weight (Mn) of the obtained imide resin precursor was 24,000, which is a polystyrene equivalent molecular weight measured by means of a GPC (manufactured by: Tosoh Corporation).

<Preparation of Resin Film>

The above-mentioned imide resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 18

A resin film was obtained in the same condition as in the preparation of a varnish for coating and resin film in Example 17, except that 0.9 g of imide resin precursor was altered to 0.5 g, and 0.1 g of 9,9-bis(3-(4-phenylethynyl benzoic acid amide)-4-hydroxyphenyl)-fluorene was altered to 0.5 g.

Example 19

A resin film was obtained in the same condition as in the preparation of a varnish for coating and resin film in Example 17, except that 0.1 g of 9,9-bis(3-(4-phenylethynyl benzoic acid amide)-4-hydroxyphenyl)-fluorene was altered to 0.9 g of the 7,7'-bis(3,5-bis(phenylethynyl)phenyl)-3,3',5,5'-tetramethyl-1,1'-biadamantane obtained in Synthesis example 36.

Example 20

A resin film was obtained in the same condition as in the preparation of a varnish for coating and resin film in Example 19, except that 0.9 g of imide resin precursor was altered to 0.5 g, and 0.9 g of 7,7'-bis(3,5-bis(phenylethynyl)phenyl)-3, 3',5,5'-tetramethyl-1,1'-biadamantane was altered to 0.1 g.

Example 21

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 9,9-bis(3-(4-ethynyl benzoic acid amide)-4-hydroxyphenyl)-fluorene obtained in Synthesis example 34.

Example 22

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 4,6-di(3,5-dimethyl-1-adamantyl)-1,3-bis(4-(4-phenylethynyl benzoic acid amide)-3-hydroxyphenoxy)benzene obtained in Synthesis example 35.

Example 23

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 7,7'-bis(3,5-diethynylphenyl)-3,3',5,5'-tetramethyl-1, 1'-biadamantane obtained in Synthesis example 37.

Example 24

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 3,3'-diethynyl-5,5',7,7'-tetramethyl-1,1'-biadamantane obtained in Synthesis example 38.

Example 25

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 3,3',5,5'-tetraethynyl-1,1'-biadamantane obtained in Synthesis example 39.

Example 26

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 7,7'-bis(3,5-diethynylphenyl)-3,3',5,5'-tetramethyl-1,1'-biadamantane polymer obtained in Synthesis example 40.

Example 27

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.1 g of the 3,3'-diethynyl-5,5',7,7'-tetramethyl-1,1'-biadamantane polymer obtained in Synthesis example 41.

Example 28

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to the 3,3',5,5'-tetraethynyl-1,1'-biadamantane polymer obtained in Synthesis example 42.

Example 29

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.05 g of the 7,7'-bis(3,5-bis(phenylethynyl)phenyl)-3,3',5,5'-tetramethyl-1,1'-biadamantane obtained in Synthesis example 36 and 0.05 g of the 3,3'-diethynyl-5,5',7,7'-tetramethyl-1,1'-biadamantane obtained in Synthesis example 38.

Example 30

A resin film was obtained in the same condition as in the preparation of a varnish for coating and resin film in Example 1, except that 0.1 g of 9,9-bis(3-(4-phenylethynyl benzoic acid amide)-4-hydroxyphenyl)-fluorene was altered to 0.05 g of the 7,7'-bis(3,5-diethynylphenyl)-3,3',5,5'-tetramethyl-1,1'-biadamantane obtained in Synthesis example 37 and 0.05 g of the 7,7'-bis(3,5-diethynylphenyl)-3,3',5,5'-tetramethyl-1,1'-biadamantane polymer obtained in Synthesis example 40.

Example 31

Preparation of Benzoxazole Resin Precursor

A reaction was performed in the same condition as in the preparation of a benzoxazole resin precursor in Example 1, except that 54.1 g of the 2,2'-dihydroxy-3,3'-diamino-5,5'-bis(3,5-dimethyl-1-adamantyl)-biphenyl obtained in Synthesis example 9 (0.10 mol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 15,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 32

Preparation of Benzoxazole Resin Precursor

A reaction was performed in the same condition as in the preparation of a benzoxazole resin precursor in Example 1, except that 70.5 g of the 9,9-bis(3-(3,5-dimethyl-1-adamantyl)-5-amino-4-hydroxyphenyl)-fluorene obtained in Synthesis example 13 (0.10 mol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 19,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 33

<Preparation of Benzoxazole Resin Precursor>

A reaction was performed in the same condition as in the preparation of a benzoxazole resin precursor in Example 1, except that 103.0 g of the 2,7-di(3,5-dimethyl-1-adamantyl)-9,9-bis(3-(3,5-dimethyl-1-adamantyl)-5-amino-4-hydroxyphenyl)-fluorene obtained in Synthesis example 14 (0.10 mol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 14,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 34

Preparation of Benzoxazole Resin Precursor

A reaction was performed in the same condition as in the preparation of a benzoxazole resin precursor in Example 1, except that 32.4 g of the 4,6-di(3,5-dimethyl-1-adamantyl)-1,3-bis(4-amino-3-hydroxyphenoxy)benzene obtained in Synthesis example 2 (0.05 mol) and 43.3 g of the 3,3'-bis(3-(3,5-dimethyl-1-adamantyl)-5-amino-4-hydroxyphenyl)-5,5',7,7'-tetramethyl-1,1'-biadamantane obtained in Synthesis example 15 (0.05 mmol) were used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 16,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 35

Preparation of Benzoxazole Resin Precursor

A reaction was performed in the same condition as in the preparation of a benzoxazole resin precursor in Example 1, except that 32.4 g of the 4,6-di(3,5-dimethyl-1-adamantyl)-1,3-bis(4-amino-3-hydroxyphenoxy)benzene obtained in Synthesis example 2 (0.05 mol) and 29.0 g of the 9,9-bis(3-amino-4-hydroxyphenyl)-2,7-bis(phenylethynyl)-fluorene obtained in Synthesis example 16 (0.05 mmol) were used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 19,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 36

Preparation of Benzoxazole Resin Precursor

A reaction was performed in the same condition as in the preparation of a benzoxazole resin precursor in Example 1, except that 86.6 g of the 3,3'-bis(3-(3,5-dimethyl-1-adamantyl)-5-amino-4-hydroxyphenyl)-5,5',7,7'-tetramethyl-1,1'-biadamantane obtained in Synthesis example 15 (0.10 mmol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 12,000, which is a polystyrene equivalent molecular weight measured by means of a GPC (manufactured by: Tosoh Corporation).

<Preparation of Resin Film>

The above-mentioned benzoxazole resin precursor of 0.45 g, another 0.45 g of the benzoxazole resin precursor obtained in Example 1 and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 37

Preparation of Benzoxazole Resin Precursor

A reaction was performed in the same condition as in the preparation of a benzoxazole resin precursor in Example 1, except that 28.0 g of 4,4'-oxybis(benzoic acid) dichloride mmol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 19,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 38

Preparation of Benzoxazole Resin Precursor

A reaction was performed in the same condition as in the preparation of a benzoxazole resin precursor in Example 1, except that 21.6 g of 5-ethynyl-isophthalic acid chloride (0.095 mmol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 18,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 39

Preparation of Benzoxazole Resin Precursor

A reaction was performed in the same condition as in the preparation of a benzoxazole resin precursor in Example 1, except that 98.5 g of the 4,6-di((1-(5,5',7,7'-tetramethyl-3,3'-biadamantyl))-1,3-bis(4-carboxy-phenoxy)benzene dichloride obtained in Synthesis example 20 (0.095 mmol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 12,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 40

Preparation of Benzoxazole Resin Precursor

A reaction was performed in the same condition as in the preparation of a benzoxazole resin precursor in Example 1, except that 3.61 g of 4-phenylethynyl-benzoic acid chloride (0.015 mol) was used in place of 2.10 g of benzoic acid chloride (0.015 mol), thus obtaining a benzoxazole resin precursor.

A number average molecular weight (Mn) of the obtained benzoxazole resin precursor was 20,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 41

Preparation of Benzoxazole Resin Precursor

A reaction was performed in the same condition as in the preparation of a benzoxazole resin precursor in Example 39, except that 38.0 g of 9,9-bis(3-amino-4-hydroxyphenyl)-fluorene (0.10 mol) was used in place of 64.8 g of 4,6-di(3,5-dimethyl-1-adamantyl)-1,3-bis(4-amino-3-hydroxyphenoxy)benzene (0.10 mol), thus obtaining a benzoxazole resin precursor.

A number average molecular weight (Mn) of the obtained benzoxazole resin precursor was 18,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 42

Preparation of Benzoxazole Resin Precursor

A reaction was performed in the same condition as in the preparation of a benzoxazole resin precursor in Example 1, except that 28.8 g of 5-phenylethynyl-isophthalic acid chloride (0.095 mol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 18,000, which is a polystyrene equivalent molecular weight measured by means of a GPC (manufactured by: Tosoh Corporation).

<Preparation of Resin Film>

The above-mentioned benzoxazole resin precursor of 0.45 g, another 0.45 g of the benzoxazole resin precursor obtained in Example 1 and 0.1 g of the 7,7'-bis(3,5-diethynylphenyl)-3,3',5,5'-tetramethyl-1,1'-biadamantane obtained in Synthesis example 37 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Example 43

Preparation of Benzoxazole Resin Precursor

In a 2 L four-neck flask provided with a thermometer, a Dimroth condenser and an agitator, 64.8 g of the 4,6-di(3,5-dimethyl-1-adamantyl)-1,3-bis(4-amino-3-hydroxyphenoxy)benzene (0.10 mol) obtained in Synthesis example 2 was dissolved in 800 g of dried N-methyl-2-pyrrolidone under nitrogen flow, followed by the addition of 17.4 g of pyridine (0.22 mol). The mixture was heated to 60° C. and 42.8 g of 5,5',7,7'-tetramethyl-1,1'-biadamantane-3,3'-dicarboxylic acid chloride (0.095 mol) was gradually added. After the addition, the mixture was agitated at 60° C. for three hours. Then, 2.10 g of benzoic acid chloride (0.015 mol) was added with the inner temperature of the flask kept at 5° C. or below in an ice bath. Reaction solution was added to 4 L of distilled water in small droplets, followed by collecting and drying precipitate, thus obtaining a benzoxazole resin precursor.

A number average molecular weight (Mn) of the obtained benzoxazole resin precursor was 24,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Comparative Example 1

Preparation of Benzoxazole Resin Precursor

A reaction was performed in the same condition as in the preparation of a benzoxazole resin precursor in Example 1, except that 20.6 g of 3,3'-dihydroxy-4,4'-diamino-biphenyl (0.10 mol) was used in place of 64.8 g of 4,6-di(1-adamantyl)-1,3-bis(4-amino-3-hydroxyphenoxy)benzene (0.10 mol), and 19.3 g of isophthalic acid dichloride (manufactured by: Tokyo Chemical Industry Co., Ltd.) (0.095 mmol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 19,000, which is a polystyrene equivalent molecular weight measured by means of a GPC (manufactured by: Tosoh Corporation).

<Preparation of Resin Film>

An attempt was made to dissolve 0.9 g of the above-mentioned benzoxazole resin precursor and 0.1 g of the 9,9-bis (3-(4-phenylethynyl benzoic acid amide)-4-hydroxyphenyl)-fluorene obtained in Synthesis example 31 in N-methyl-2-pyrrolidone; however, they did not dissolve therein.

Comparative Example 2

Preparation of Benzoxazole Resin Precursor

A reaction was performed in the same condition as in the preparation of a benzoxazole resin precursor in Example 1, except that 38.0 g of 9,9-bis(3-amino-4-hydroxyphenyl)-fluorene (0.10 mol) was used in place of 64.8 g of 4,6-di(1-adamantyl)-1,3-bis(4-amino-3-hydroxyphenoxy)benzene (0.10 mol), and 36.8 g of 1,3-bis(4-carboxy-phenoxy)-benzene dichloride (0.095 mol) was used in place of 42.8 g of 5,5',7,7'-tetramethyl-1,1'-biadamantane-3,3'-dicarboxylic acid chloride (0.095 mol), thus obtaining a benzoxazole resin precursor.

A number average molecular weight (Mn) of the obtained benzoxazole resin precursor was 20,000, which is a polystyrene equivalent molecular weight measured by means of a GPC (manufactured by: Tosoh Corporation).

<Preparation of Resin Film>

The above-mentioned benzoxazole resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Comparative Example 3

Preparation of Imide Resin Precursor

A reaction was performed in the same condition as in the preparation of an imide resin precursor in Example 17, except that 10.3 g of m-phenylenediamine (0.095 mol) was used in place of 53.3 g of 4,6-di(1-adamantyl)-1,3-bis(4-aminophenoxy)benzene (0.095 mol), and 29.4 g of biphenyltetracarboxylic acid dianhydride (0.1 mol) was used in place of 72.7 g of 9,9-bis(3,4-dicarboxy-phenyl)-2,7-di(1-adamantyl)-fluorene-dianhydride (0.1 mol), thus obtaining an imide resin precursor.

A number average molecular weight (Mn) of the obtained imide resin precursor was 20,000, which is a polystyrene equivalent molecular weight measured by means of a GPC (manufactured by: Tosoh Corporation).

<Preparation of Resin Film>

The above-mentioned imide resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Comparative Example 4

Preparation of Imide Resin Precursor

A reaction was performed in the same condition as in the preparation of an imide resin precursor in Example 17, except that 33.1 g of fluorene-9,9-bis(4-aniline) (0.095 mol) was used in place of 53.3 g of 4,6-di(1-adamantyl)-1,3-bis(4-aminophenoxy)benzene (0.095 mol), and 40.2 g of 2,4-bis(3,4-dicarboxy)-phenoxy-benzene dianhydride (0.1 mol) was used in place of 72.7 g of 9,9-bis(3,4-dicarboxy-phenyl)-2,7-di(1-adamantyl)-fluorene-dianhydride (0.1 mol), thus obtaining an imide resin precursor.

A number average molecular weight (Mn) of the obtained imide resin precursor was 23,000, which is a polystyrene equivalent molecular weight measured by means of a GPC (manufactured by: Tosoh Corporation).

<Preparation of Resin Film>

The above-mentioned imide resin precursor of 0.9 g and 0.1 g of the 9,9-bis(3-(4-phenylethynyl benzoic acid amide)-4-hydroxyphenyl)-fluorene obtained in Synthesis example 31 were dissolved in N-methyl-2-pyrrolidone and filtered with a Teflon (trade name) filter to obtain a varnish for coating. The varnish was applied on a silicon wafer by means of a spin coater, followed by heating in an oven under a nitrogen atmosphere at 90° C. for one minute and then at 400° C. for one hour, thus obtaining a resin film.

Evaluation of the resin films obtained in Examples 1 to 43 and Comparative examples 1 to 4 was conducted. Evaluation items and methods are as follows. The results obtained are shown in Table 1.

1. Solubility

In a glass sample container with a lid, 1 g of the resin composition containing the benzoxazole resin precursor and the crosslinking agent or containing the imide resin precursor and the crosslinking agent, and 3 g of N-methyl-2-pyrrolidone were charged and agitated with a stirrer for one hour. Solubility was then determined by the presence of insoluble matter observed in the container.

2. Heat Resistance

Heat resistance was evaluated by the glass transition temperature and thermal decomposition temperature. The glass transition temperature is a peak top temperature of tan δ obtained by measuring each of the resin films by means of a dynamic viscoelasticity measurement device (product name: DMS6100; manufactured by: Seiko Instruments Inc.) under a nitrogen flow of 300 mL/min and at a heating rate of 3° C./min and a frequency of 1 Hz.

Thermal decomposition temperatures of the resin films were measured by means of a TG/DTA measurement device (product name: TG/DTA220; manufactured by: Seiko Instruments Inc.) under a nitrogen flow of 200 mL/min and at a heating rate of 10° C./min. Those are temperatures measured when the resin films each exhibited a 5% reduction in weight.

3. Relative Dielectric Constant

In accordance with JIS-K6911, measurement of the capacity of an adhesive film for semiconductor was carried out at a frequency of 100 kHz and by means of a Precision LCR Meter (product name: HP-4284A; manufactured by: Hewlett-Packard Development Company, L.P.). Then, the relative dielectric constant was calculated by the following formula.

Relative dielectric constant=(measured capacity×film thickness)/(vacuum dielectric constant×measured area)

4. Elastic Modulus

Elastic modulus measurement of the resin films was performed by means of an ultra micro hardness tester (product name: ENT-1100; manufactured by: ELIONIX INC.) at a maximum load of 10 mg and a loading rate of 1 mg/sec.

TABLE 1

| | Example 1 | Example 2 | Example 3 | Example 4 | Example 5 | Example 6 | Example 7 | Example 8 |
|---|---|---|---|---|---|---|---|---|
| Solubility | Soluble | Soluble | Soluble | Soluble | Soluble | Soluble | Soluble | Soluble |
| Glass transition temperature (° C.) | 401 | 410 | 420 | 432 | 408 | 414 | 435 | 445 |
| Thermal decomposition temperature | 482 | 490 | 502 | 510 | 488 | 505 | 510 | 510 |
| Dielectric constant | 2.5 | 2.6 | 2.3 | 2.3 | 2.4 | 2.5 | 2.2 | 2.3 |
| Elastic modulus (GPa) | 7.1 | 7.3 | 7.7 | 8.1 | 7.3 | 7.6 | 7.9 | 8.3 |

| | Example 9 | Example 10 | Example 11 | Example 12 | Example 13 | Example 14 | Example 15 | Example 16 |
|---|---|---|---|---|---|---|---|---|
| Solubility | Soluble | Soluble | Soluble | Soluble | Soluble | Soluble | Soluble | Soluble |
| Glass transition temperature (° C.) | 410 | 415 | 422 | 447 | 413 | 420 | 445 | 450 |
| Thermal decomposition temperature | 505 | 510 | 510 | 510 | 500 | 510 | 510 | 510 |
| Dielectric constant | 2.4 | 2.6 | 2.2 | 2.3 | 2.5 | 2.6 | 2.3 | 2.3 |
| Elastic modulus (GPa) | 7.2 | 7.5 | 7.8 | 8.2 | 7.5 | 8.1 | 7.9 | 8.4 |

| | Example 17 | Example 18 | Example 19 | Example 20 | Example 21 | Example 22 | Example 23 | Example 24 |
|---|---|---|---|---|---|---|---|---|
| Solubility | Soluble | Soluble | Soluble | Soluble | Soluble | Soluble | Soluble | Soluble |
| Glass transition temperature (° C.) | 402 | 411 | 415 | 442 | 396 | 402 | 428 | 425 |
| Thermal decomposition temperature | 498 | 508 | 499 | 509 | 487 | 492 | 503 | 475 |
| Dielectric constant | 2.7 | 2.8 | 2.7 | 2.6 | 2.5 | 2.5 | 2.2 | 2.1 |
| Elastic modulus (GPa) | 6.7 | 6.9 | 6.8 | 7.0 | 7.2 | 7.1 | 8.4 | 8.1 |

TABLE 2

|  | Example 25 | Example 26 | Example 27 | Example 28 | Example 29 | Example 30 | Example 31 | Example 32 |
|---|---|---|---|---|---|---|---|---|
| Solubility | Soluble | Soluble | Soluble | Soluble | Soluble | Soluble | Soluble | Soluble |
| Glass transition temperature (° C.) | 448 | 405 | 403 | 410 | 422 | 407 | 401 | 415 |
| Thermal decomposition temperature | 481 | 502 | 499 | 505 | 506 | 500 | 479 | 499 |
| Dielectric constant | 2.1 | 2.2 | 2.1 | 2.1 | 2.2 | 2.2 | 2.3 | 2.3 |
| Elastic modulus (GPa) | 8.2 | 8.3 | 7.9 | 8.1 | 7.8 | 8.3 | 7.9 | 7.8 |

|  | Example 33 | Example 34 | Example 35 | Example 36 | Example 37 | Example 38 | Example 39 | Example 40 |
|---|---|---|---|---|---|---|---|---|
| Solubility | Soluble | Soluble | Soluble | Soluble | Soluble | Soluble | Soluble | Soluble |
| Glass transition temperature (° C.) | 419 | 413 | 422 | 412 | 391 | 424 | 399 | 412 |
| Thermal decomposition temperature | 487 | 504 | 512 | 503 | 489 | 511 | 473 | 498 |
| Dielectric constant | 2.2 | 2.1 | 2.4 | 2.1 | 2.5 | 2.5 | 2.2 | 2.2 |
| Elastic modulus (GPa) | 8.2 | 8.5 | 8.3 | 8.4 | 7.3 | 8.1 | 7.5 | 8.5 |

|  | Example 41 | Example 42 | Example 43 | Comparative example 1 | Comparative example 2 | Comparative example 3 | Comparative example 4 |
|---|---|---|---|---|---|---|---|
| Solubility | Soluble | Soluble | Soluble | Insoluble | Soluble | Hardly soluble | Soluble |
| Glass transition temperature (° C.) | 396 | 428 | 402 | — | 350 | 320 | 355 |
| Thermal decomposition temperature | 475 | 507 | 481 | — | 488 | 502 | 484 |
| Dielectric constant | 2.4 | 2.2 | 2.5 | — | 3.0 | 3.3 | 3.0 |
| Elastic modulus (GPa) | 7.6 | 8.3 | 7.0 | — | 6.5 | — | 6.4 |

As is clear from Tables 1 and 2, in Examples 1 to 43, the glass transition temperature and the thermal decomposition temperature were high, and the heat resistance was excellent.

Examples 1 to 43 have solubility in a solvent and a low dielectric constant; thus, they are shown to have excellent workability and also excellent dielectric properties.

Example 43 changes the preparation method of a benzoxazole resin precursor based on Example 1. Example 43 is shown to be able to achieve similar properties to those of the resin film of Example 1.

Due to poor solubility, no resin film was prepared in Comparative example 1. It was therefore not possible to measure a glass transition temperature, a thermal decomposition temperature and a dielectric constant.

In Comparative examples 2 to 4, the thermal decomposition temperature was excellent; however, the glass transition temperature was low and the dielectric constant was high.

The aminophenol compounds of Synthetic examples 1, 3, 4, 6, 7, 8, 10, 11 and 12 can also provide resin compositions with similar excellent heat resistance and low dielectric constant as well by using each of the aminophenol compounds in place of the aminophenol compounds in Examples 1 to 16 and 21 to 43 respectively.

The dicarboxylic acid chloride compounds of Synthetic examples 17, 18, 19, 21, 22, 23, 24 and 25 can also provide resin compositions with similar excellent heat resistance and low dielectric constant as well by using each of the dicarboxylic acid chloride compounds in place of the dicarboxylic acid chloride compounds in Examples 1 to 16 and 21 to 43 respectively.

Synthetic examples 28 and 30 can also provide resin compositions with similar excellent heat resistance and low dielectric constant as well by using each of Synthetic examples 28 and 30 in place of Synthetic examples 27 and 29 respectively.

Further, the crosslinking agents of Synthetic examples 32 and 33 can also provide resin compositions with similar excellent heat resistance and low dielectric constant as well by using each of the crosslinking agents in place of the crosslinking agents in Examples 1 to 43, respectively.

Next, an interlayer insulation film and a semiconductor device will be described.

Example 44

Preparation of Varnish for Coating and Semiconductor Device

The resin composition obtained in Example 2 was dissolved in N-methyl-2-pyrrolidone and filtered with a Teflon (trade name) filter to obtain a varnish for coating.

A silicon nitride layer was formed on a semiconductor substrate by known methods. The varnish for coating was applied on the silicon nitride layer by means of a spin coater and heated in an oven under a nitrogen atmosphere at 90° C. for one minute and then at 400° C. for one hour to form an interlayer insulation film with a thickness of 0.3 μm.

Next, a metal wiring was formed on the interlayer insulation film in a predetermined pattern, thus obtaining a semiconductor device.

Example 45

Preparation of Varnish for Coating and Semiconductor Device

The resin composition obtained in Example 7 was dissolved in N-methyl-2-pyrrolidone and filtered with a Teflon (trade name) filter to obtain a varnish for coating.

A silicon nitride layer was formed on a semiconductor substrate by known methods. The varnish for coating was applied on the silicon nitride layer by means of a spin coater and heated in an oven under a nitrogen atmosphere at 90° C. for one minute and then at 400° C. for one hour to form an interlayer insulation film with a thickness of 0.3 μm.

Next, a metal wiring was formed on the interlayer insulation film in a predetermined pattern, thus obtaining a semiconductor device.

Example 46

<Preparation of Varnish for Coating and Semiconductor Device

The resin composition obtained in Example 15 was dissolved in N-methyl-2-pyrrolidone and filtered with a Teflon (trade name) filter to obtain a varnish for coating.

A silicon nitride layer was formed on a semiconductor substrate by known methods. The varnish for coating was applied on the silicon nitride layer by means of a spin coater and heated in an oven under a nitrogen atmosphere at 90° C. for one minute and then at 350° C. for one hour to form an interlayer insulation film with a thickness of 0.3 μm.

Next, a metal wiring is formed in the interlayer insulation film in a predetermined pattern, thus obtaining a semiconductor device.

Rates of wiring delay of the obtained semiconductor devices were evaluated.

The semiconductor devices made by using the interlayer insulation films of Examples 44, 45 and 46 were each compared with a semiconductor device having the same structure as these semiconductor devices and a $SiO_2$ insulation film in terms of the degree of wiring delay. A signal delay time determined by converting an oscillation frequency of a ring oscillator was used as an evaluation criterion.

As a result of comparing those, it was confirmed that the semiconductor devices of the present invention had less wiring delay, and in terms of the rate of wiring delay, there was a rise of about 10% in Example 44, about 15% in Example 45 and about 20% in Example 46.

INDUSTRIAL APPLICABILITY

A resin composition, a varnish, a resin film of the present invention and a semiconductor device using the same can be used as an organic material to form an interlayer insulation film with excellent heat resistance, excellent electrical properties and also a low dielectric constant, or as a semiconductor device comprising an interlayer insulation film with excellent heat resistance, excellent electrical properties and also a low dielectric constant.

The invention claimed is:

1. A resin composition comprising a compound having a structure represented by formula (1) and a crosslinking agent having in a molecule two or more functional groups having a polymerizable unsaturated bond:

[Chemical Formula 1]

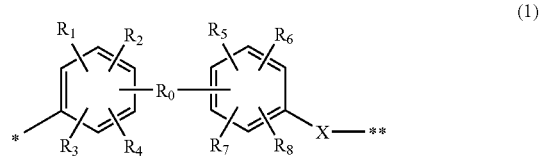

(1)

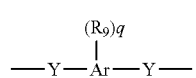

(2)

wherein in formula (1), $R_0$ is a single bond or has a structure represented by formula (2); $R_1$ to $R_8$ are respectively any of hydrogen, a group having an alicyclic structure, an organic group having 1 to 10 carbon atoms other than the group having an alicyclic structure, a hydroxyl group and a carboxyl group; and "X" is any of —O—, —NHCO—, —CONH—, —COO— and —OCO—; further, wherein in formula (2), "Ar" is an aromatic group; "Y" is any of a single bond, —O—, —S—, —OCO— and —COO—; "q" is an integer of 1 or more; $R_9$ is hydrogen or an organic group having 1 or more carbon atoms and may be identical with or different from each other when "q" is an integer of 2 or more; at least one of $R_1$ to $R_8$ is the group having an alicyclic structure when $R_0$ is a single bond; at least one of $R_1$ to $R_9$ is the group having an alicyclic structure when $R_0$ has the structure represented by formula (2); and "*" and "**" represent a position to be bonded to a different chemical structure.

2. The resin composition according to claim 1, wherein $R_0$ has the structure represented by formula (2) in the compound having the structure represented by formula (1).

3. The resin composition according to claim 2, wherein at least one $R_9$ is the group having an alicyclic structure in the compound having the structure represented by formula (1).

4. The resin composition according to claim 2, wherein the compound having the structure represented by formula (1) comprises, as "Ar" in formula (2), a group selected from structures represented by formula (3):

[Chemical Formula 2]

(3)

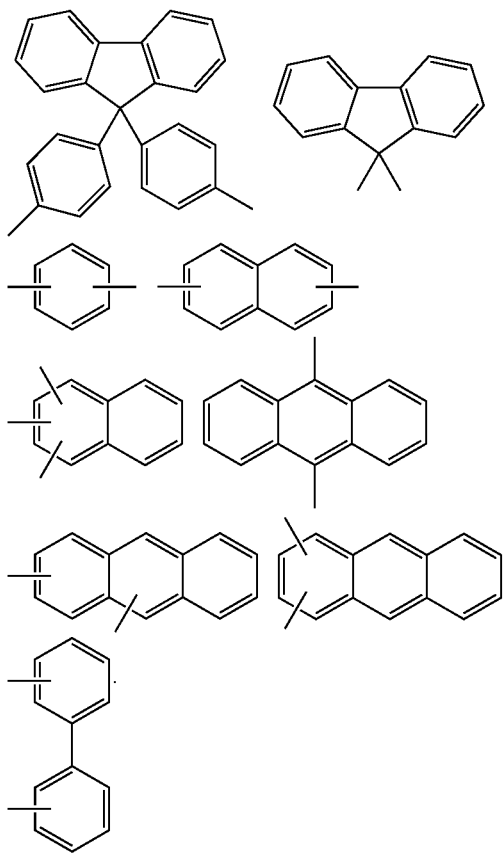

5. The resin composition according to claim 1, wherein $R_0$ is a single bond in the compound having the structure represented by formula (1).

6. The resin composition according to claim 1, wherein the group having an alicyclic structure is a group having an adamantane structure.

7. The resin composition according to claim 6, wherein the group having an adamantane structure has an alkyl group having 1 to 20 carbon atoms.

8. The resin composition according to claim 1, wherein the compound having the structure represented by formula (1) has in a molecule two or more groups capable of causing a crosslinking reaction with at least the compound.

9. The resin composition according to claim 8, wherein the group capable of causing a crosslinking reaction of the compound having the structure represented by formula (1) is capable of causing a crosslinking reaction with the crosslinking agent.

10. The resin composition according to claim 1, wherein the compound having the structure represented by formula (1) comprises a functional group having a polymerizable unsaturated bond as the group capable of causing a crosslinking reaction.

11. The resin composition according to claim 1, wherein the crosslinking agent and/or the compound having the structure represented by formula (1) comprises a functional group having an acetylene bond as the group capable of causing a cros slinking reaction.

12. The resin composition according to claim 1, wherein the crosslinking agent has an alicyclic structure.

13. The resin composition according to claim 1, wherein the crosslinking agent is capable of forming a benzoxazole ring by dehydration and ring closure.

14. The resin composition according to claim 1, comprising a polymer of the crosslinking agent as the crosslinking agent.

15. The resin composition according to claim 1, wherein the compound having the structure represented by formula (1) has —CONH— as "X" of formula (1) and a carboxyl group as any of $R_1$ to $R_4$ that is in the ortho-position to a bond represented by "*" and a carboxyl group as any of $R_5$ to $R_8$ that is in the ortho-position of "X".

16. The resin composition according to claim 1, wherein the compound having the structure represented by formula (1) has —NHCO— as "X" of formula (1) and a hydroxyl group as any of $R_1$ to $R_4$ that is in the ortho-position to the bond represented by "*" and a hydroxyl group as any of $R_5$ to $R_8$ that is in the ortho-position of "X".

17. The resin composition according to claim 1, which is obtained by dehydration and ring closure of the compound having the structure represented by formula (1) of the resin composition.

18. A resin composition comprising a polyimide resin obtained by dehydration and ring closure of the compound having the structure represented by formula (1) of the resin composition defined by claim 15.

19. A resin composition comprising a polybenzoxazole resin obtained by dehydration and ring closure of the compound having the structure represented by formula (1) of the resin composition defined by claim 16.

20. A varnish comprising the resin composition defined by claim 1 and an organic solvent.

21. A resin film obtained by heating and/or irradiating with active radiation the resin composition defined by claim 1.

22. A semiconductor device comprising the resin film defined by claim 21.

23. A resin film obtained by heating and/or irradiating with active radiation the varnish defined by claim 20.

* * * * *